United States Patent
Yamazaki et al.

(10) Patent No.: US 8,698,143 B2
(45) Date of Patent: Apr. 15, 2014

(54) DISPLAY DEVICE

(75) Inventors: Shunpei Yamazaki, Setagaya (JP); Junichiro Sakata, Atsugi (JP); Hiroyuki Miyake, Atsugi (JP); Hideaki Kuwabara, Isehara (JP); Tatsuya Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/567,327

(22) Filed: Aug. 6, 2012

(65) Prior Publication Data
US 2012/0300151 A1 Nov. 29, 2012

Related U.S. Application Data

(63) Continuation of application No. 12/835,903, filed on Jul. 14, 2010, now Pat. No. 8,552,423.

(30) Foreign Application Priority Data

Jul. 18, 2009 (JP) ................................. 2009-169599

(51) Int. Cl.
*H01L 29/04* (2006.01)
(52) U.S. Cl.
USPC . 257/57; 257/4; 257/43; 257/71; 257/E21.46; 257/E29.296; 438/104
(58) Field of Classification Search
USPC .................. 257/57, 71, 43, E21.46, E29.296, 257/E27.016; 438/104, 158
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A 12/2006
EP 1 770 788 A 4/2007
(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000° C" Journal of Solid State Chemistry, 1985, vol. 60, pp. 382-384.

(Continued)

*Primary Examiner* — Elias M Ullah
(74) *Attorney, Agent, or Firm* — Eric J. Robinson; Robinson Intellectual Property Law Office, P.C.

(57) ABSTRACT

An aperture ratio of a semiconductor device is improved. A driver circuit and a pixel are provided over one substrate, and a first thin film transistor in the driver circuit and a second thin film transistor in the pixel each include a gate electrode layer, a gate insulating layer over the gate electrode layer, an oxide semiconductor layer over the gate insulating layer, source and drain electrode layers over the oxide semiconductor layer, and an oxide insulating layer in contact with part of the oxide semiconductor layer over the gate insulating layer, the oxide semiconductor layer, and the source and drain electrode layers. The gate electrode layer, the gate insulating layer, the oxide semiconductor layer, the source and drain electrode layers, and the oxide insulating layer of the second thin film transistor each have a light-transmitting property.

38 Claims, 40 Drawing Sheets

(56) References Cited

U.S. PATENT DOCUMENTS

| | | |
|---|---|---|
| 6,252,248 B1 | 6/2001 | Sano et al. |
| 6,294,274 B1 | 9/2001 | Kawazoe et al. |
| 6,462,723 B1 | 10/2002 | Yamazaki et al. |
| 6,563,174 B2 | 5/2003 | Kawasaki et al. |
| 6,603,453 B2 | 8/2003 | Yamazaki et al. |
| 6,727,522 B1 | 4/2004 | Kawasaki et al. |
| 6,960,787 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,247,882 B2 | 7/2007 | Yamazaki et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,704,859 B2 | 4/2010 | Sato |
| 7,719,185 B2 | 5/2010 | Jin |
| 7,732,819 B2 | 6/2010 | Akimoto et al. |
| 7,745,798 B2 | 6/2010 | Takahashi |
| 7,923,287 B2 | 4/2011 | Lee et al. |
| 8,003,981 B2 | 8/2011 | Iwasaki et al. |
| 8,242,496 B2 | 8/2012 | Yamazaki et al. |
| 8,441,178 B2 | 5/2013 | Choi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0073325 A1 | 3/2009 | Kuwabara et al. |
| 2009/0079920 A1* | 3/2009 | Aoki ........................... 349/114 |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044701 A1 | 2/2010 | Sano et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200857 A1 | 8/2010 | Shimada |
| 2011/0012105 A1 | 1/2011 | Yamazaki et al. |
| 2011/0012106 A1 | 1/2011 | Yamazaki et al. |
| 2011/0012116 A1 | 1/2011 | Yamazaki et al. |
| 2011/0012117 A1 | 1/2011 | Yamazaki et al. |
| 2011/0012118 A1 | 1/2011 | Yamazaki et al. |
| 2011/0017995 A1 | 1/2011 | Yamazaki et al. |
| 2011/0256684 A1 | 10/2011 | Iwasaki et al. |

FOREIGN PATENT DOCUMENTS

| | | |
|---|---|---|
| EP | 1933385 A | 6/2008 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-053147 A | 3/1993 |
| JP | 05-251705 | 9/1993 |
| JP | 08-116067 A | 5/1996 |
| JP | 08-264794 | 10/1996 |
| JP | 11-505377 | 5/1999 |
| JP | 11-354802 A | 12/1999 |
| JP | 2000-044236 A | 2/2000 |
| JP | 2000-150900 | 5/2000 |
| JP | 2001-051292 A | 2/2001 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086808 | 3/2003 |
| JP | 2004-014982 A | 1/2004 |

(56) References Cited

FOREIGN PATENT DOCUMENTS

| | | |
|---|---|---|
| JP | 2004-103957 | 4/2004 |
| JP | 2004-273614 A | 9/2004 |
| JP | 2004-273732 A | 9/2004 |
| JP | 2005-033172 A | 2/2005 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2007-250983 A | 9/2007 |
| JP | 2007-316110 A | 12/2007 |
| JP | 2008-235871 A | 10/2008 |
| JP | 2009-141001 A | 6/2009 |
| JP | 2009-158663 A | 7/2009 |
| JP | 2009-158940 A | 7/2009 |
| JP | 2009-265271 | 11/2009 |
| JP | 2010-098280 | 4/2010 |
| KR | 2008-0054941 A | 6/2008 |
| KR | 2008-0086201 A | 9/2008 |
| WO | 2004/114391 | 12/2004 |
| WO | WO-2007/119386 | 10/2007 |
| WO | WO 2008/105347 | 9/2008 |
| WO | WO-2009/072533 | 6/2009 |

OTHER PUBLICATIONS

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$-ZnO System," Journal of Solid State Chemistry, Apr. 1, 1995, vol. 116, No. 1, pp. 170-178.

Nakamura et al., "The Phase Relations In the $In_2O_3$—$Ga_2ZnO_4$—ZnO System at 1350° C," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Device Employing $MoO_3$ as a Charge-Generatin Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUS on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Ohara et al., "21.3: 4.0 IN. QVGA AMOLED Display Using In—Ga—Zn—Oxide TFTs with a Novel Passivation Layer," SID

(56) References Cited

OTHER PUBLICATIONS

Digest '09: SID International Symposium Digest of Technical Papers, May 31, 2009, pp. 284-287.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

International Search Report (Application No. PCT/JP2010/061299) dated Aug. 3, 2010.

Written Opinion (Application No. PCT/JP2010/061299) dated Aug. 3, 2010.

Nozawa, "Transparent Circuit," Nikkei Electronics, Aug. 27, 2007, No. 959, pp. 39-52.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Korean Office Action (Application No. 2012-7026398) Dated Oct. 14, 2013.

* cited by examiner

FIG. 1A1
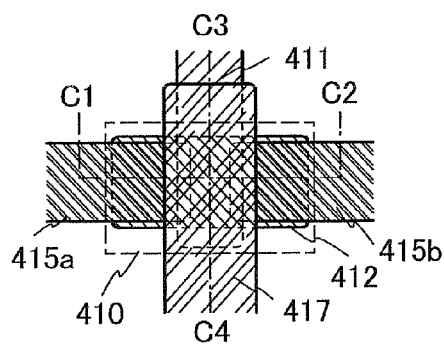
FIG. 1A2
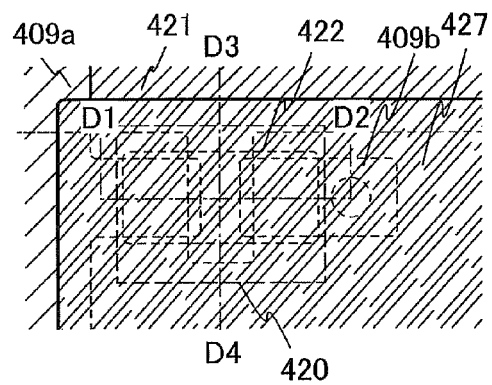
FIG. 1B
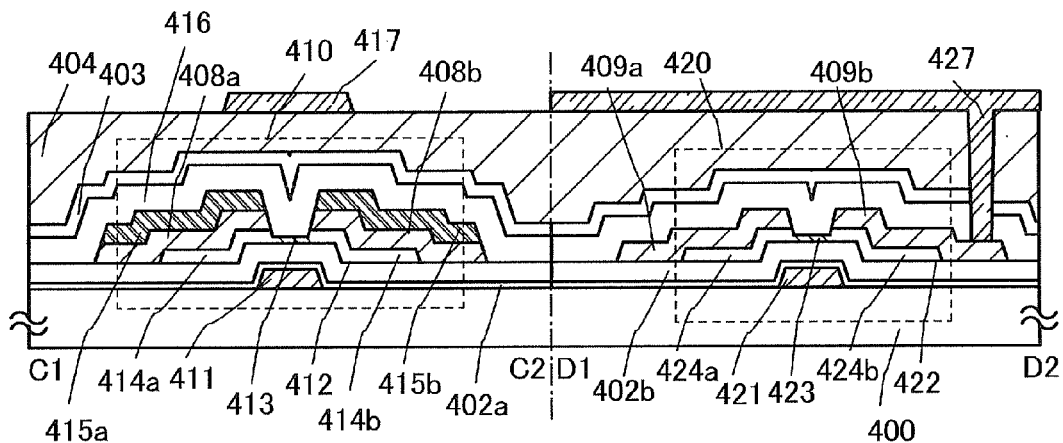
FIG. 1C
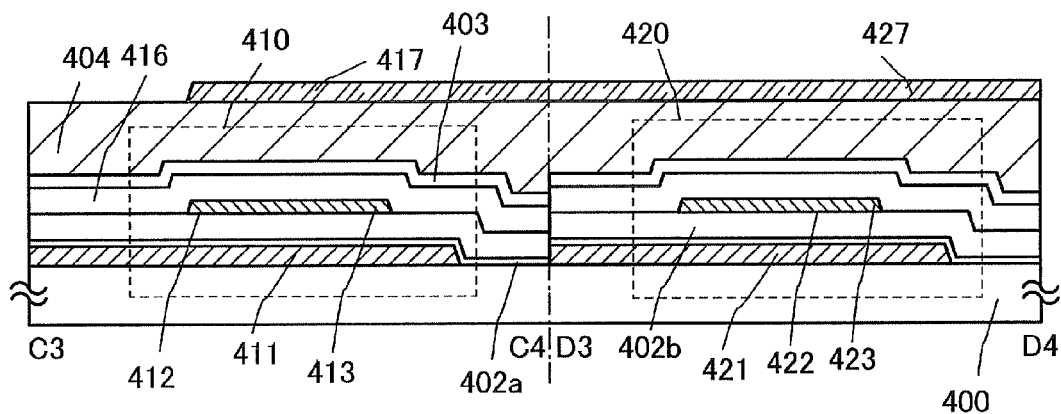

FIG. 6A1
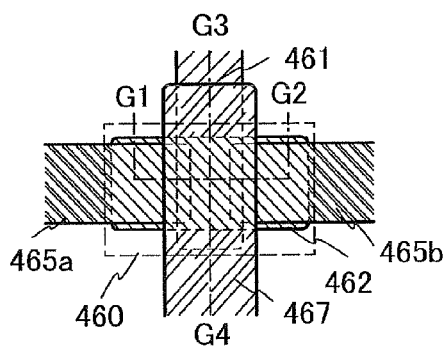
FIG. 6A2
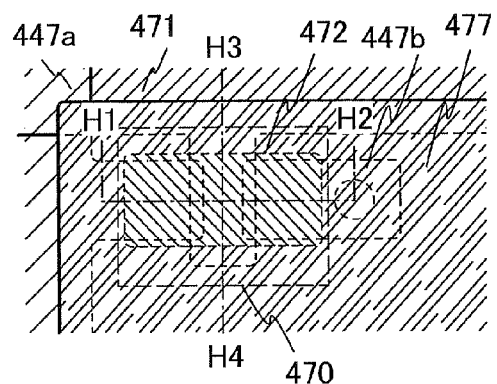
FIG. 6B
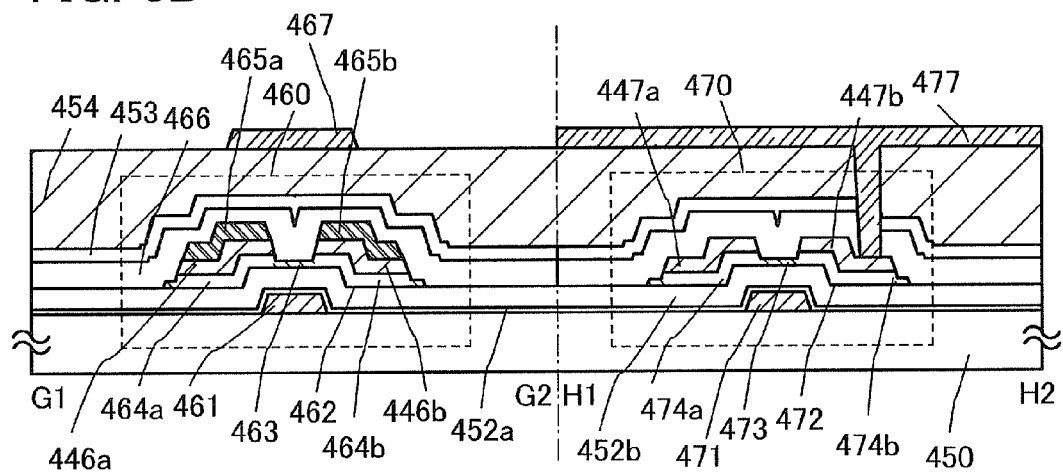
FIG. 6C
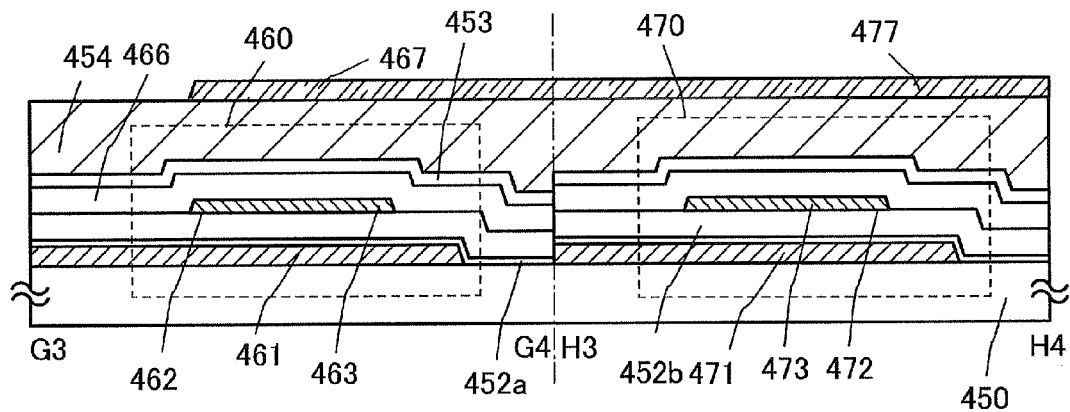

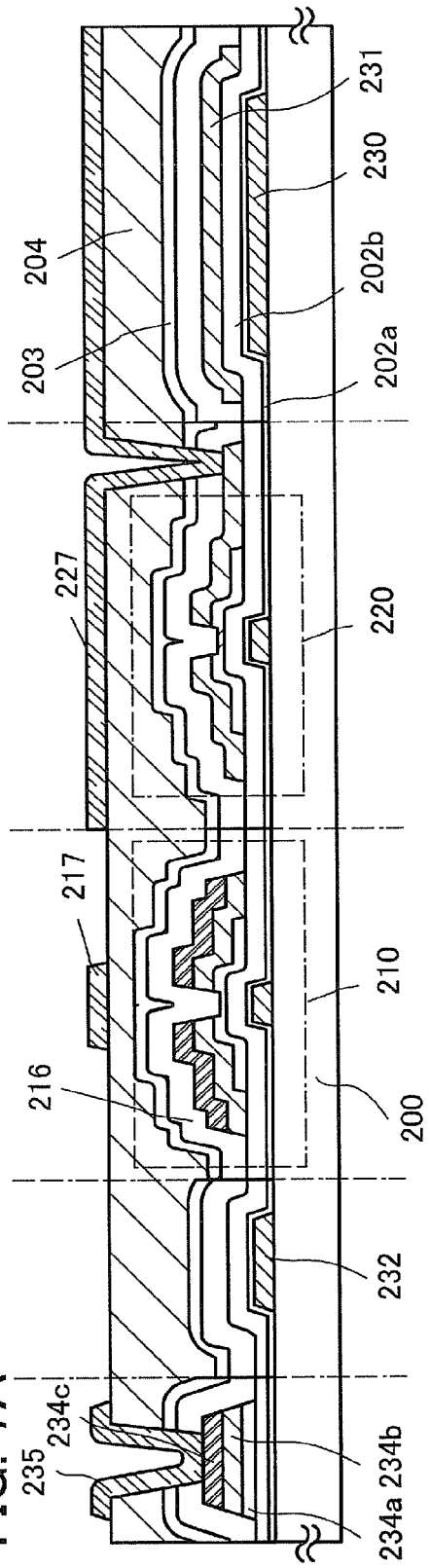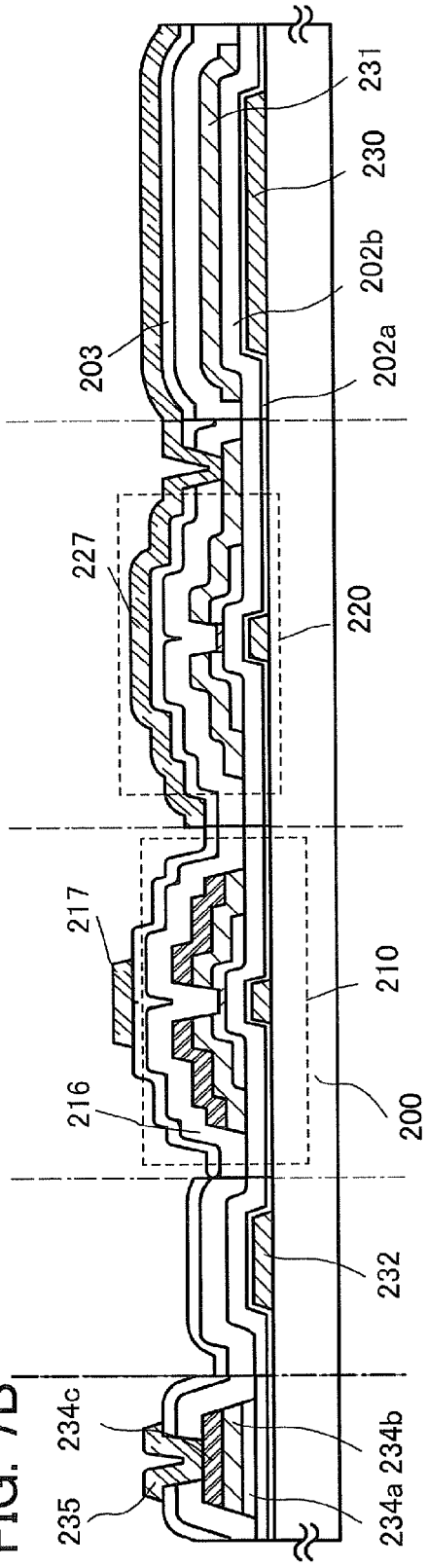

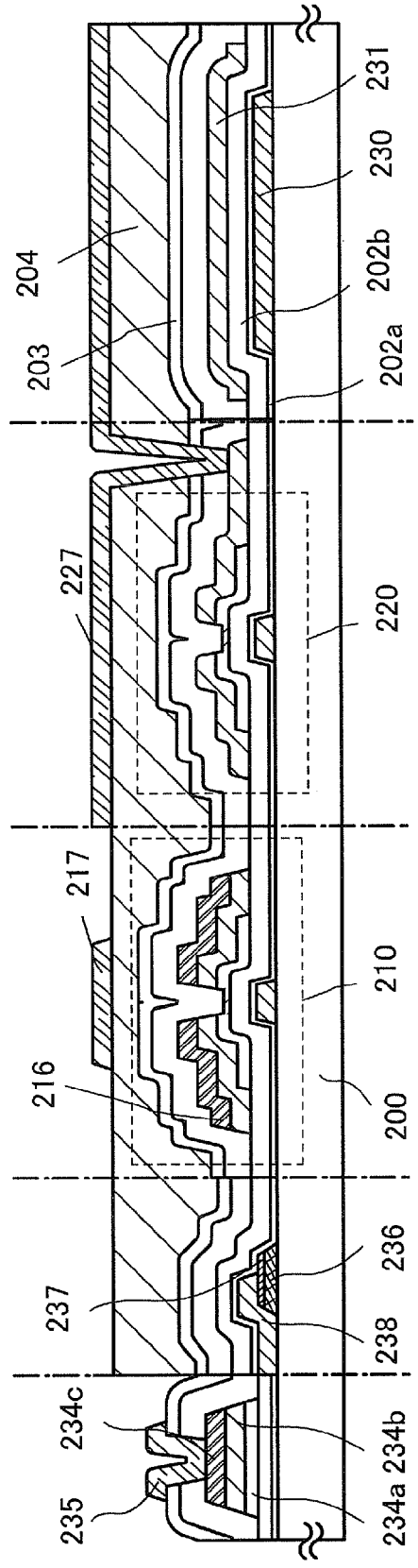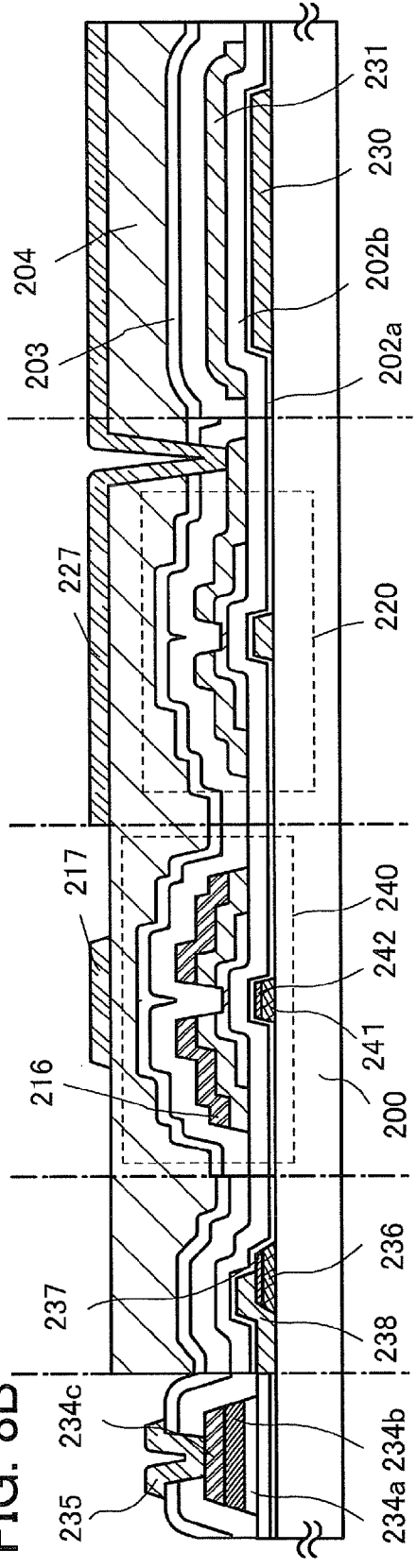

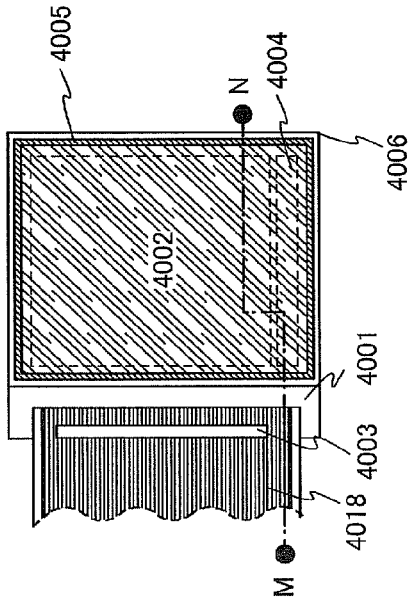
FIG. 10A1
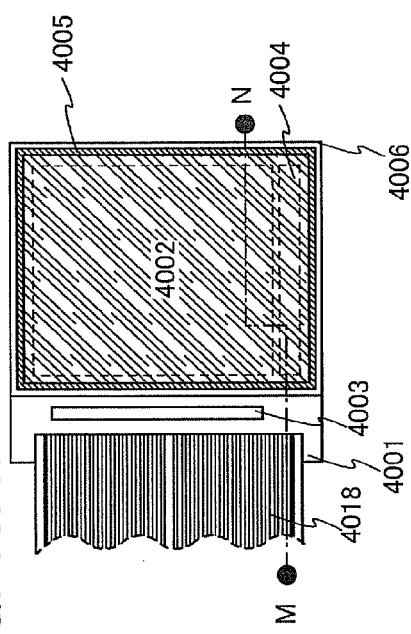
FIG. 10A2
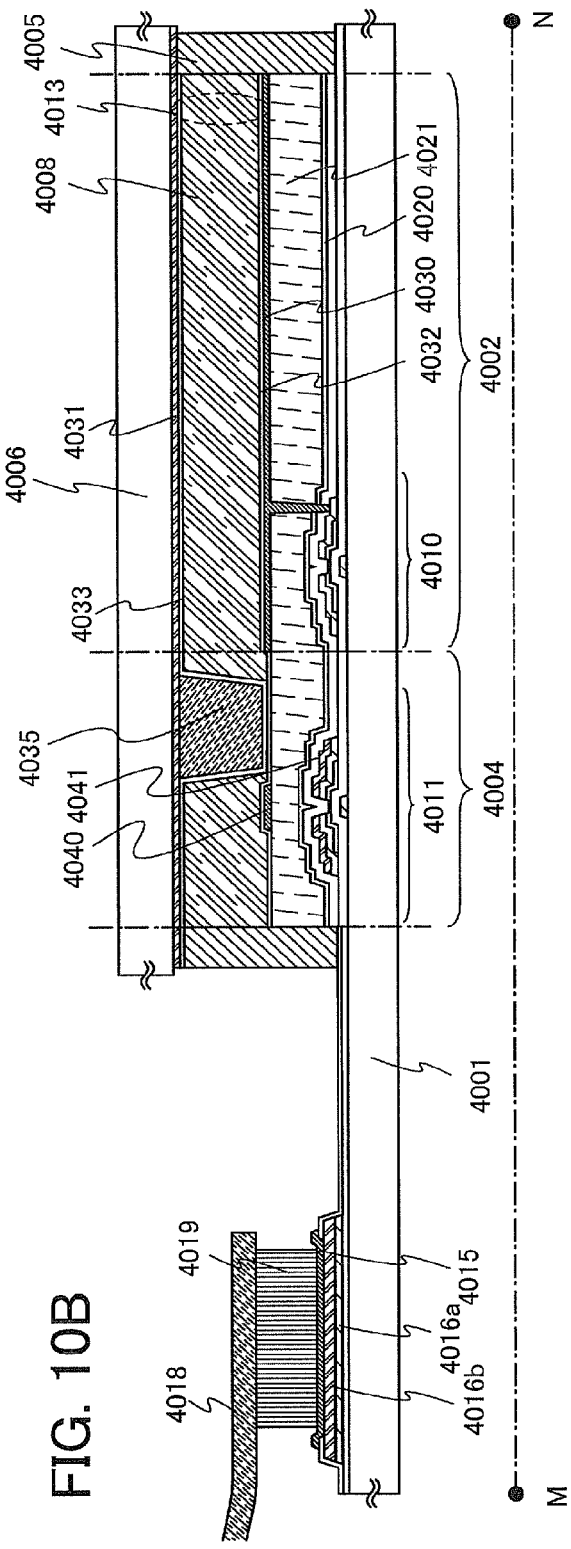
FIG. 10B

DISPLAY DEVICE

TECHNICAL FIELD

The present invention relates to semiconductor devices including oxide semiconductors and manufacturing methods thereof.

Note that in this specification, a semiconductor device refers to all devices that can function by utilizing semiconductor properties, and electro-optic devices such as display devices, semiconductor circuits, and electronic devices are all semiconductor devices.

BACKGROUND ART

Light-transmitting metal oxides are used in semiconductor devices. For example, conductive metal oxides (hereinafter referred to as oxide conductors) such as indium tin oxide (ITO) are used as transparent electrode materials needed in display devices such as liquid crystal display devices.

In addition, light-transmitting metal oxides also attract attention as materials having semiconductor properties. For example, In—Ga—Zn—O-based oxides and the like are expected to be used as semiconductor materials needed in display devices such as liquid crystal display devices. In particular, they are expected to be used for channel layers (also referred to as channel formation layers) of thin film transistors (also referred to as TFTs).

Metal oxides having semiconductor properties (hereinafter referred to as oxide semiconductors) are increasingly expected as materials which replace or surpass amorphous silicon used in display devices and the like.

Further, oxide conductors and oxide semiconductors have light-transmitting properties. Therefore, by forming TFTs with the use of these materials, light-transmitting TFTs can be formed (for example, see Reference 1).

Furthermore, TFTs including oxide semiconductors have high field-effect mobility. Therefore, driver circuits in display devices or the like can be formed using such TFTs (for example, see Reference 2).

REFERENCE

Reference 1: T. Nozawa, "Transparent Circuitry", *Nikkei Electronics*, No. 959, Aug. 27, 2007, pp. 39-52.

Reference 2: T. Osada et al., "Development of Driver-Integrated Panel using Amorphous In—Ga—Zn—Oxide TFT", *Proc. SID '09 Digest*, 2009, pp. 184-187.

DISCLOSURE OF INVENTION

It is an object of one embodiment of the present invention to reduce the manufacturing cost of a semiconductor device.

It is another object of one embodiment of the present invention to improve the aperture ratio of a semiconductor device.

It is still another object of one embodiment of the present invention to increase the resolution of a display portion of a semiconductor device.

It is still another object of one embodiment of the present invention to provide a semiconductor device which can operate at high speed.

One embodiment of the present invention is a semiconductor device including a driver circuit portion and a display portion (also referred to as a pixel portion) over one substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using a metal. A channel layer of the driver circuit thin film transistor is formed using an oxide semiconductor. The driver circuit wiring is formed using a metal. The display portion includes a pixel thin film transistor and a display portion wiring. A source electrode layer and a drain electrode layer of the pixel thin film transistor are formed using an oxide conductor. A semiconductor layer of the pixel thin film transistor is formed using an oxide semiconductor. The display portion wiring is formed using an oxide conductor.

An inverted-staggered thin film transistor having a bottom-gate structure is used as each of the pixel thin film transistor and the driver circuit thin film transistor. The pixel thin film transistor and the driver circuit thin film transistor are each a channel-etched thin film transistor in which an oxide insulating layer is provided in contact with a semiconductor layer which is exposed between a source electrode layer and a drain electrode layer.

Note that a specific manufacturing process of a TFT, a specific structure of a different element (e.g., a capacitor) included in a semiconductor device, and the like are not disclosed in Reference 1. In addition, it is not disclosed that a driver circuit and a light-transmitting TFT are formed over one substrate, either.

In a semiconductor device of one embodiment of the present invention, a driver circuit including a driver circuit TFT and a pixel including a pixel TFT are formed over one substrate. Thus, the manufacturing cost of the semiconductor device can be reduced.

In a semiconductor device of one embodiment of the present invention, a pixel includes a pixel TFT and a pixel wiring. A source electrode and a drain electrode of the pixel TFT are formed using an oxide conductor. A semiconductor layer of the pixel TFT is formed using an oxide semiconductor. The pixel wiring is formed using an oxide conductor. That is, in the semiconductor device, a region where the pixel TFT and the pixel wiring are formed can be used as an opening portion. Thus, the aperture ratio of the semiconductor device can be improved.

In a semiconductor device of one embodiment of the present invention, a pixel includes a pixel TFT and a pixel wiring. A source electrode and a drain electrode of the pixel TFT are formed using an oxide conductor. A semiconductor layer of the pixel TFT is formed using an oxide semiconductor. The pixel wiring is formed using an oxide conductor. That is, in the semiconductor device, it is possible to determine the pixel size without limitation by the size of the pixel TFT. Thus, it is possible to increase the resolution of a display portion of the semiconductor device.

In a semiconductor device of one embodiment of the present invention, a driver circuit includes a driver circuit TFT and a driver circuit wiring. A source electrode and a drain electrode of the driver circuit TFT are formed using a metal. A channel layer of the driver circuit TFT is formed using an oxide semiconductor. The driver circuit wiring is formed using a metal. That is, in the semiconductor device, the driver circuit includes a TFT having high field-effect mobility and a wiring having low resistance. Thus, the semiconductor device can operate at high speed.

As an oxide semiconductor used in this specification, for example, an oxide semiconductor expressed by $InMO_3(ZnO)_m$ (m>0) can be used. Note that M denotes one or more metal elements selected from Ga, Fe, Ni, Mn, and Co. As an example, M might be Ga, or might be Ga and the above metal element other than Ga, for example, M might be Ga and Ni, or Ga and Fe. Further, in the oxide semiconductor, in some cases, a transition metal element such as Fe or Ni or an oxide of the transition metal element is contained as an impurity element in addition to the metal element contained as M. In this specification, among oxide semiconductors whose composition formulae are expressed by $InMO_3(ZnO)_m(m>0)$, an oxide semiconductor which contains Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above: an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide. Silicon oxide may be contained in an oxide semiconductor layer formed using the above metal oxide.

An oxide semiconductor preferably contains In, more preferably In and Ga. In obtaining an i-type (intrinsic) oxide semiconductor layer, dehydration or dehydrogenation are effective.

In the case where heat treatment is performed in the atmosphere of an inert gas such as nitrogen or a rare gas (e.g., argon or helium) or under reduced pressure in the manufacturing process of a semiconductor device, an oxide semiconductor layer is changed into an oxygen-deficient oxide semiconductor layer by the heat treatment so as to be a low-resistance oxide semiconductor layer, i.e., an n-type (e.g., n$^-$-type) oxide semiconductor layer. Then, the oxide semiconductor layer is made to be in an oxygen excess state by formation of an oxide insulating layer which is in contact with the oxide semiconductor layer. Accordingly, the oxide semiconductor layer is changed into a high-resistance oxide semiconductor layer, i.e., an i-type oxide semiconductor layer. Thus, it is possible to manufacture a semiconductor device including a highly reliable thin film transistor with favorable electrical characteristics.

In the manufacturing process of a semiconductor device, for dehydration or dehydrogenation, heat treatment is performed at greater than or equal to 350° C., preferably greater than or equal to 400° C. and less than the strain point of a substrate in the atmosphere of an inert gas such as nitrogen or a rare gas (e.g., argon or helium) or under reduced pressure, so that impurities such as moisture contained in the oxide semiconductor layer are reduced.

Two peaks of water or at least one peak of water at around 300° C. are/is not detected even when thermal desorption spectroscopy (TDS) at up to 450° C. is performed on an oxide semiconductor layer subjected to dehydration or dehydrogenation. Therefore, even when TDS is performed at up to 450° C. on a thin film transistor including the oxide semiconductor layer subjected to dehydration or dehydrogenation, at least the peak of water at around 300° C. is not detected.

In addition, it is important not to mix water or hydrogen again into the oxide semiconductor layer by performing cooling without exposure to the air in the manufacturing process of the semiconductor device. The oxide semiconductor layer is changed into a low-resistance oxide semiconductor layer, i.e., an n-type (e.g., n$^-$ type) oxide semiconductor layer through dehydration or dehydrogenation. Then, the oxide semiconductor layer is changed into a high-resistance oxide semiconductor layer, i.e., an i-type oxide semiconductor layer. When a thin film transistor is formed using such an oxide semiconductor layer, the threshold voltage of the thin film transistor can be positive, so that a so-called normally-off switching element can be realized. In the semiconductor device, it is preferable that a channel of the thin film transistor be formed with positive threshold voltage as close to 0 V as possible. Note that if the threshold voltage of the thin film transistor is negative, the thin film transistor tends to be normally on; in other words, current tends to flow between a source electrode and a drain electrode even when gate voltage is 0 V. For example, in an active matrix display device, the electrical characteristics of a thin film transistor included in a circuit are important and influence the performance of the display device. Among the electrical characteristics of the thin film transistor, the threshold voltage ($V_{th}$) is particularly important. For example, when the threshold voltage is high or negative even when field-effect mobility is high in the thin film transistor, it is difficult to control the thin film transistor as a circuit. In the case where a thin film transistor has high threshold voltage and a large absolute value of its threshold voltage, the thin film transistor cannot perform a switching function as a TFT when a TFT is driven at low voltage and might be a load. For example, in the case of an n-channel thin film transistor, it is preferable that a channel be formed and drain current flows after positive voltage is applied to a gate electrode. A transistor in which a channel is not formed unless driving voltage is raised and a transistor in which a channel is formed and drain current flows even when negative voltage is applied are unsuitable for a thin film transistor used in a circuit.

In addition, a gas atmosphere in which the temperature is lowered from the heating temperature T may be different from a gas atmosphere in which the temperature is raised to the heating temperature T. For example, with the use of a furnace in which dehydration or dehydrogenation are performed, cooling is performed without exposure to the air, with the furnace filled with a high-purity oxygen gas or a high-purity $N_2O$ gas.

With the use of an oxide semiconductor film cooled slowly (or cooled) in an atmosphere which does not contain moisture (having a dew point of less than or equal to −40° C., preferably less than or equal to −60° C.) after moisture which is contained in the film is reduced by heat treatment for dehydration or dehydrogenation, the electrical characteristics of a thin film transistor are improved and high-performance thin film transistors which can be mass-produced are realized.

In this specification, heat treatment in the atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refer not only to elimination of $H_2$ but also to elimination of H, OH, or the like.

In the case where heat treatment is performed in the atmosphere of an inert gas such as nitrogen or a rare gas (e.g., argon or helium) or under reduced pressure in the manufacturing process of a semiconductor device, an oxide semiconductor layer is changed into an oxygen-deficient oxide semiconductor layer by the heat treatment so as to be a low-resistance oxide semiconductor layer, i.e., an n-type (e.g., n$^-$-type) oxide semiconductor layer. After that, a region overlapping with a drain electrode layer is formed as a high-resistance drain region (also referred to as an HRD region) which is an oxygen-deficient region.

Specifically, the carrier concentration of the high-resistance drain region is greater than or equal to $1\times10^{17}/cm^3$ and is at least higher than the carrier concentration of a channel formation region (less than $1\times10^{17}/cm^3$). Note that the carrier concentration in this specification is a carrier concentration obtained by Hall effect measurement at room temperature.

In addition, a low-resistance drain region (also referred to as an LRN region) may be formed between a drain electrode layer formed using a metal material and an oxide semiconductor layer. Specifically, the carrier concentration of the low-resistance drain region is higher than that of the high-resistance drain region, e.g., in the range of $1\times10^{20}/cm^3$ to $1\times10^{21}/cm^3$ inclusive.

Then, a channel formation region is formed by making at least part of the oxide semiconductor layer subjected to dehydration or dehydrogenation be in an oxygen-excess state so as to obtain a high-resistance oxide semiconductor layer, i.e., an i-type oxide semiconductor layer. Note that as a method for making the oxide semiconductor layer subjected to dehydration or dehydrogenation be in an oxygen-excess state, a method of forming an oxide insulating layer which is in contact with the oxide semiconductor layer subjected to dehydration or dehydrogenation, for example, by a sputtering method is given. In addition, after the formation of the oxide insulating layer, heat treatment (e.g., heat treatment in an atmosphere containing oxygen), cooling treatment in an oxygen atmosphere or cooling treatment in ultra-dry air (having a dew point of less than or equal to $-40°$ C., preferably less than or equal to $-60°$ C.) after heating in an inert gas atmosphere, or the like may be performed.

The channel formation region can be formed in such a manner that a source electrode layer and a drain electrode layer are formed using a metal material such as Ti on and in contact with the oxide semiconductor layer subjected to dehydration or dehydrogenation, and an exposed region of the oxide semiconductor layer which does not overlap with the source electrode layer and the drain electrode layer is selectively made to be in an oxygen-excess state. In the case where the oxide semiconductor layer is selectively made to be in an oxygen-excess state, a high-resistance drain region overlapping with the source electrode layer and a high-resistance drain region overlapping with the drain electrode layer are formed, and the channel formation region is formed between the high-resistance drain regions. That is, the channel formation region is formed between the source electrode layer and the drain electrode layer in a self-aligned manner.

According to one embodiment of the present invention, it is possible to manufacture a semiconductor device including a highly reliable thin film transistor with favorable electrical characteristics.

Note that by forming the high-resistance drain region in the oxide semiconductor layer overlapping with the drain electrode layer (or the source electrode layer), the reliability of a driver circuit can be improved. Specifically, by forming the high-resistance drain region, the transistor can have a structure in which conductivity can be varied gradually from the drain electrode layer to the high-resistance drain region and the channel formation region. Therefore, in the case where the transistor is operated while the drain electrode layer is connected to a wiring for supplying a high power supply potential VDD, even when a high electric field is applied between the gate electrode layer and the drain electrode layer, the high-resistance drain region serves as a buffer and the high electric field is not applied locally, so that the withstand voltage of the transistor can be improved.

In addition, by forming the high-resistance drain region, the amount of leakage current in the driver circuit can be reduced. Specifically, by forming the high-resistance drain region, the leakage current of the transistor, which flows between the drain electrode layer and the source electrode layer, flows sequentially through the drain electrode layer, the high-resistance drain region on the drain electrode layer side, the channel formation region, the high-resistance drain region on the source electrode layer side, and the source electrode layer. In this case, in the channel formation region, leakage current flowing from the high-resistance drain region on the drain electrode layer side to the channel formation region can be concentrated on the vicinity of an interface between the channel formation region and a gate insulating layer, which has high resistance when the transistor is off. Thus, the amount of leakage current in a back channel portion (part of a surface of the channel formation region, which is apart from the gate electrode layer) can be reduced.

Further, when the high-resistance drain region overlapping with the source electrode layer and the high-resistance drain region overlapping with the drain electrode layer overlap with part of the gate electrode layer with the gate insulating layer therebetween, although depending on the width of the gate electrode layer, the intensity of an electric field in the vicinity of an end portion of the drain electrode layer can be reduced more effectively.

One embodiment of the present invention is a semiconductor device including a driver circuit having a first thin film transistor and a pixel having a second thin film transistor over one substrate. The first thin film transistor and the second thin film transistor each include a gate electrode layer, a gate insulating layer over the gate electrode layer, an oxide semiconductor layer over the gate insulating layer, a source electrode layer and a drain electrode layer over the oxide semiconductor layer, and an oxide insulating layer in contact with part of the oxide semiconductor layer over the gate insulating layer, the oxide semiconductor layer, the source electrode layer, and the drain electrode layer. The gate electrode layer, the gate insulating layer, the oxide semiconductor layer, the source electrode layer, the drain electrode layer, and the oxide insulating layer of the second thin film transistor each have a light-transmitting property. The source electrode layer and the drain electrode layer of the first thin film transistor are formed using a material different from that of the source electrode layer and the drain electrode layer of the second thin film transistor and have lower resistance than that of the source electrode layer and the drain electrode layer of the second thin film transistor.

According to another embodiment of the present invention, in the semiconductor device, the source electrode layer and the drain electrode layer of the first thin film transistor may be formed using a material containing an element selected from the group consisting of Al, Cr, Cu, Ta, Ti, Mo, and W as its main component, or a stack layer including a plurality of films each containing an alloy containing at least one of the elements.

According to still another embodiment of the present invention, in the semiconductor device, the source electrode layer and the drain electrode layer of the second thin film transistor may be formed using indium oxide, an alloy of indium oxide and tin oxide, an alloy of indium oxide and zinc oxide, or zinc oxide.

According to still another embodiment of the present invention, the semiconductor device may further include a capacitor portion over the substrate. The capacitor portion includes a capacitor wiring and a capacitor electrode overlapping with the capacitor wiring, and the capacitor wiring and the capacitor electrode each have a light-transmitting property.

According to still another embodiment of the present invention, the semiconductor device may further include a conductive layer overlapping with the gate electrode layer over the oxide insulating layer of the first thin film transistor.

According to still another embodiment of the present invention, the semiconductor device may further include a low-resistance drain region between the oxide semiconductor layer and each of the source and drain electrode layers of the first thin film transistor, and the low-resistance drain region may be formed using the same material as that of the source and drain electrode layers of the second thin film transistor.

According to still another embodiment of the present invention, in the semiconductor device, a region of the oxide semiconductor layer of the first thin film transistor, which overlaps with the source or drain electrode layer, has lower resistance than a channel formation region of the first thin film transistor.

Still another embodiment of the present invention is a method for manufacturing a semiconductor device including a driver circuit having a first thin film transistor and a pixel having a second thin film transistor over one substrate. The method includes: forming a light-transmitting conductive film over a substrate and selectively etching the light-transmitting conductive film through a first photolithography process, wherein a first gate electrode layer serving as a gate electrode layer of the first thin film transistor and a second gate electrode layer serving as a gate electrode layer of the second thin film transistor are formed; forming a gate insulating layer over the first gate electrode layer and the second gate electrode layer; forming an oxide semiconductor film over the gate insulating layer and selectively etching the oxide semiconductor film through a second photolithography process, wherein a first oxide semiconductor layer and a second oxide semiconductor layer which are island-like oxide semiconductor layers are formed; dehydrating or dehydrogenating the first oxide semiconductor layer and the second oxide semiconductor layer; sequentially forming an oxide conductive film and a conductive film over the first and second oxide semiconductor layers which are dehydrated or dehydrogenated and selectively etching the oxide conductive film and the conductive film through a third photolithography process and a fourth photolithography process, wherein a pair of low-resistance drain regions are formed over the first oxide semiconductor layer, a pair of conductive layers are formed over the pair of low-resistance drain regions to form a first source electrode layer and a first drain electrode layer serving as a source electrode layer and a drain electrode layer respectively of the first thin film transistor, and a second source electrode layer and a second drain electrode layer serving as a source electrode layer and a drain electrode layer respectively of the second thin film transistor are formed over the second oxide semiconductor layer; and forming an oxide insulating layer in contact with part of the first oxide semiconductor layer and part of the second oxide semiconductor layer over the gate insulating layer, the first oxide semiconductor layer, the second oxide semiconductor layer, the first source electrode layer, the first drain electrode layer, the second source electrode layer, and the second drain electrode layer.

Still another embodiment of the present invention is a method for manufacturing a semiconductor device including a driver circuit having a first thin film transistor and a pixel having a second thin film transistor over one substrate. The method includes: forming a light-transmitting conductive film over a substrate and selectively etching the light-transmitting conductive film through a first photolithography process, wherein a first gate electrode layer serving as a gate electrode layer of the first thin film transistor and a second gate electrode layer serving as a gate electrode layer of the second thin film transistor are formed; forming a gate insulating layer over the first gate electrode layer and the second gate electrode layer; forming an oxide semiconductor film over the gate insulating layer; dehydrating or dehydrogenating the oxide semiconductor film; sequentially forming an oxide conductive film and a conductive film over the oxide semiconductor film which is dehydrated or dehydrogenated and selectively etching the oxide semiconductor film, the oxide conductive film, and the conductive film through a second photolithography process and a third photolithography process, wherein a pair of low-resistance drain regions are formed over a first oxide semiconductor layer, a pair of conductive layers are formed over the pair of low-resistance drain regions to form a first source electrode layer and a first drain electrode layer serving as a source electrode layer and a drain electrode layer respectively of the first thin film transistor, and a second source electrode layer and a second drain electrode layer serving as a source electrode layer and a drain electrode layer respectively of the second thin film transistor are formed over a second oxide semiconductor layer; and forming an oxide insulating layer in contact with part of the first oxide semiconductor layer and part of the second oxide semiconductor layer over the gate insulating layer, the first oxide semiconductor layer, the second oxide semiconductor layer, the first source electrode layer, the first drain electrode layer, the second source electrode layer, and the second drain electrode layer.

According to still another embodiment of the present invention, in the method for manufacturing a semiconductor device, the third photolithography process may be performed using a multi-tone mask.

Note that ordinal numbers such as "first" and "second" in this specification are used for convenience and do not denote the order of steps and the stacking order of layers. In addition, the ordinal numbers in this specification do not denote particular names which specify the present invention.

Further, as a display device including a driver circuit, there are a light-emitting display device including a light-emitting element and a display device including an electrophoretic display element, which is also referred to as an electronic paper, in addition to a liquid crystal display device.

In a light-emitting display device including a light-emitting element, a plurality of thin film transistors are included in a pixel portion. The pixel portion includes a region where a gate electrode of a thin film transistor is connected to a source wiring (also referred to as a source wiring layer) or a drain wiring (also referred to as a drain wiring layer) of a different transistor. In addition, a driver circuit of the light-emitting display device including a light-emitting element includes a region where a gate electrode of a thin film transistor is connected to a source wiring or a drain wiring of the thin film transistor.

It is possible to manufacture a thin film transistor having stable electrical characteristics. Therefore, a semiconductor device which includes a highly reliable thin film transistor with favorable electrical characteristics can be provided.

BRIEF DESCRIPTION OF DRAWINGS

FIGS. 1A1 to 1C illustrate a semiconductor device.
FIGS. 6A1 to 6C illustrate a semiconductor device.

FIGS. 7A and 7B each illustrate a semiconductor device.
FIGS. 8A and 8B each illustrate a semiconductor device.
FIGS. 10A1 to 10B illustrate a semiconductor device.

BEST MODE FOR CARRYING OUT THE INVENTION

Figure 2A:
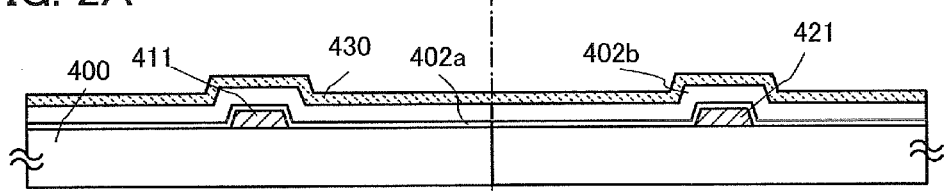
FIGS. 2A to 2E illustrate a method of manufacturing a semiconductor device.

Embodiments will be described in detail with reference to the accompanying drawings. However, the present invention is not limited to the following description, and various changes for the modes and details thereof will be apparent to those skilled in the art unless such changes depart from the spirit and the scope of the present invention. Therefore, the present invention should not be interpreted as being limited to the description of the embodiments below. In the structures to be given below, the same portions or portions having similar functions are denoted by the same reference numerals in different drawings, and explanation thereof will not be repeated.

Note that the contents of the embodiments can be appropriately combined with each other or replaced with each other.

(Embodiment 1)

A semiconductor device and a method for manufacturing the semiconductor device will be described with reference to FIGS. 1A1 to 1C, FIGS. 2A to 2E, and FIGS. 3A to 3C. FIGS. 1B and 1C illustrate an example of a cross-sectional structure of two thin film transistors formed over one substrate. A thin film transistor 410 and a thin film transistor 420 illustrated in FIGS. 1A1 to 1C are each a kind of channel-etched bottom gate transistor.

FIG. 1A1 is a plan view of the thin film transistor 410 arranged in a driver circuit, FIG. 1A2 is a plan view of the thin film transistor 420 arranged in a pixel, FIG. 1B is a cross-sectional view illustrating a cross-sectional structure along line C1-C2 in FIG. 1A1 and a cross-sectional structure along line D1-D2 in FIG. 1A2, and FIG. 1C is a cross-sectional view illustrating a cross-sectional structure along line C3-C4 in FIG. 1A1 and a cross-sectional structure along line D3-D4 in FIG. 1A2.

The thin film transistor 410 arranged in the driver circuit is a channel-etched thin film transistor and includes a gate electrode layer 411; a first gate insulating layer 402a; a second gate insulating layer 402b; an oxide semiconductor layer 412 including at least a channel formation region 413, a high-resistance drain region 414a, and a second high-resistance drain region 414b; a low-resistance drain region 408a; a low-resistance drain region 408b; a source electrode layer 415a; and a drain electrode layer 415b over a substrate 400 having an insulating surface. Moreover, an oxide insulating layer 416 which covers the thin film transistor 410 and is in contact with the channel formation region 413 is provided.

Note that the high-resistance drain region is a region whose resistance value is lower than that of the channel formation region, and the low-resistance drain region is a region whose resistance value is lower than that of the high-resistance drain region.

The high-resistance drain region 414a is formed in contact with a bottom surface of the low-resistance drain region 408a in a self-aligned manner. The high-resistance drain region 414b is formed in contact with a bottom surface of the low-resistance drain region 408b in a self-aligned manner. The channel formation region 413 is in contact with the oxide insulating layer 416, has a small thickness, and is a region with higher resistance than that of the high-resistance drain region 414a and the high-resistance drain region 414b (an i-type region).

In order to reduce the resistance of the wiring in the thin film transistor 410, a metal material is preferably used for the source electrode layer 415a and the drain electrode layer 415b.

When a pixel portion and a driver circuit are formed over one substrate in a semiconductor device of this embodiment, in the driver circuit, positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a VCO. Consequently, the width of the high-resistance drain region 414b that needs high withstand voltage may be designed to be larger than the width of the high-resistance drain region 414a. Moreover, the width of a region of each of the high-resistance drain region 414a and the high-resistance drain region 414b which overlaps with the gate electrode layer 411 may be increased.

The thin film transistor 410 arranged in the driver circuit is described using a single-gate thin film transistor; a multi-gate thin film transistor including a plurality of channel formation regions can be formed when needed.

In addition, because the low-resistance drain regions 408a and 408b are provided, the thin film transistor 410 can be operated more stably also in terms of heat than a thin film transistor with a Schottky junction. By intentionally providing the low-resistance drain region with a higher carrier concentration than that of the oxide semiconductor layer as described above, ohmic contact is obtained.

Furthermore, a conductive layer 417 is provided above the channel formation region 413 so as to overlap with the channel formation region 413. The conductive layer 417 is electrically connected to the gate electrode layer 411 so that the conductive layer 417 and the gate electrode layer 411 have the same potential, whereby a gate voltage can be applied from above and below the oxide semiconductor layer 412 placed between the gate electrode layer 411 and the conductive layer 417. Alternatively, when the gate electrode layer 411 and the conductive layer 417 are made to have different potentials, for example, one of them has a fixed potential, a GND potential, or 0 V, electrical characteristics of the TFT, such as the threshold voltage, can be controlled. In other words, one of the gate electrode layer 411 and the conductive layer 417 functions as a first gate electrode layer, and the other of the gate electrode layer 411 and the conductive layer 417 functions as a second gate electrode layer, whereby the thin film transistor 410 can be used as a thin film transistor having four terminals.

Further, a protective insulating layer 403 and a planarization insulating layer 404 are stacked between the conductive layer 417 and the oxide insulating layer 416.

The protective insulating layer 403 is preferably in contact with the first gate insulating layer 402a or an insulating film serving as a base provided below the protective insulating layer 403, and blocks entry of impurities such as moisture, a hydrogen ion, and OH⁻ from a side surface of the substrate 400. It is particularly effective to use a silicon nitride film as the first gate insulating layer 402a or the insulating film serving as the base which is in contact with the protective insulating layer 403.

The thin film transistor 420 arranged in the pixel is a channel-etched thin film transistor and includes a gate electrode layer 421; the first gate insulating layer 402a; the second gate insulating layer 402b; an oxide semiconductor layer 422 including at least a channel formation region 423, a high-resistance drain region 424a, and a high-resistance drain region 424b; a source electrode layer 409a; and a drain electrode layer 409b over the substrate 400 having an insulating surface. In addition, the oxide insulating layer 416 which covers the thin film transistor 420 and is in contact with the upper surface and the side surfaces of the oxide semiconductor layer 422 is provided.

Note that AC drive is performed in the semiconductor device of this embodiment in order to prevent deterioration in liquid crystal. Through the AC drive, the polarity of a signal potential applied to a pixel electrode layer is inverted to be positive or negative every predetermined period. In a TFT which is connected to the pixel electrode layer, a pair of electrodes function as a source electrode layer and a drain electrode layer. In this specification, for convenience, one of a pair of electrodes of a thin film transistor in a pixel is referred to as a source electrode layer and the other of the electrodes is referred to as a drain electrode layer; however, practically, one of the electrodes alternately functions as the source electrode layer and the drain electrode layer in the case of AC drive. In addition, in order to reduce the amount of leakage current, the width of the gate electrode layer 421 in the thin film transistor 420 arranged in the pixel may be made smaller than the width of the gate electrode layer 411 in the thin film transistor 410 arranged in the driver circuit. Further, in order to reduce the amount of leakage current, the gate electrode layer 421 in the thin film transistor 420 arranged in the pixel may be designed so as not to overlap with the source electrode layer 409a or the drain electrode layer 409b.

The high-resistance drain region 424a is formed in contact with a bottom surface of the source electrode layer 409a in a self-aligned manner. The high-resistance drain region 424b is formed in contact with a bottom surface of the drain electrode layer 409b in a self-aligned manner. The channel formation region 423 is in contact with the oxide insulating layer 416, has a small thickness, and is a region having higher resistance than the high-resistance drain regions 424a and 424b (an i-type region).

Heat treatment for reducing impurities such as moisture (heat treatment for dehydration or dehydrogenation) is performed after an oxide semiconductor film used for forming the oxide semiconductor layers 412 and 422 is deposited. Reduction of the carrier concentration in the oxide semiconductor layers 412 and 422, by, for example, forming an oxide insulating film in contact with the formed oxide semiconductor layers 412 and 422 after the heat treatment for dehydration or dehydrogenation and slow cooling leads to improvement of the electrical characteristics and reliability of the thin film transistors 410 and 420.

The oxide semiconductor layer 412 is formed below and to overlap with part of the source electrode layer 415a and the drain electrode layer 415b. In addition, the oxide semiconductor layer 412 overlaps with the gate electrode layer 411 with the first gate insulating layer 402a and the second gate insulating layer 402b interposed therebetween. Further, the oxide semiconductor layer 422 is formed below and to overlap with part of the source electrode layer 409a and the drain electrode layer 409b. In addition, the oxide semiconductor layer 422 overlaps with the gate electrode layer 421 with the first gate insulating layer 402a and the second gate insulating layer 402b interposed therebetween.

A light-transmitting conductive film is used for the source electrode layer 409a and the drain electrode layer 409b of the thin film transistor 420 so as to realize a display device with a high aperture ratio.

Moreover, a light-transmitting conductive film is also used for the gate electrode layer 421 in the thin film transistor 420.

In the pixel in which the thin film transistor 420 is arranged, a conductive film that transmits visible light is used for a pixel electrode layer 427 or a different electrode layer (e.g., a capacitor electrode layer) or a different wiring layer (e.g., a capacitor wiring layer), which realizes a display device with a high aperture ratio. Needless to say, it is preferable to use a film that transmits visible light for the first gate insulating layer 402a, the second gate insulating layer 402b, and the oxide insulating layer 416.

In this specification, a conductive film that transmits visible light refers to a film having a visible light transmittance of 75% to 100%; when the film has conductivity, it is also referred to as a transparent conductive film. Further, a conductive film that is semi-transparent to visible light may be used for the gate electrode layer, the source electrode layer, the drain electrode layer, the pixel electrode layer, or a different electrode layer or a different wiring layer. Semi-transparency to visible light means that the visible light transmittance is 50% to 75%.

A process for manufacturing the thin film transistors 410 and 420 over the same substrate will be described below with reference to FIGS. 2A to 2E and FIGS. 3A to 3C.

First, a light-transmitting conductive film is formed over the substrate 400 having an insulating surface. Then, a resist mask is formed over the conductive film through a first photolithography process and selective etching is performed using the resist mask, whereby the gate electrode layers 411 and 421 are formed. Moreover, a capacitor wiring (also referred to as a capacitor wiring layer) is formed in the pixel portion from the same material as that for the gate electrode layers 411 and 421 also through the first photolithography process. Furthermore, when a capacitor is necessary in a driver circuit as well as in the pixel portion, the capacitor wiring is also formed in the driver circuit. Note that the resist mask may be formed by an ink jet method. A photomask is not used when the resist mask is formed by an ink jet method, which results in reducing manufacturing costs.

Although there is no particular limitation on a substrate which can be used as the substrate 400 having an insulating surface, the substrate needs to have heat resistance high enough to withstand at least heat treatment to be performed later. As the substrate 400 having an insulating surface, a glass substrate of barium borosilicate glass, aluminoborosilicate glass, or the like can be used.

When the temperature of the heat treatment performed later is high, a substrate having a strain point of greater than or equal to 730° C. is preferably used as a glass substrate applicable to the substrate 400. As the glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boric acid. Therefore, a glass substrate containing a larger amount of BaO than $B_2O_3$ is preferably used.

Note that a substrate formed of an insulator, such as a ceramic substrate, a quartz substrate, or a sapphire substrate, may be used as the substrate 400 instead of the glass substrate. Alternatively, crystallized glass or the like may be used as the substrate 400.

An insulating film serving as a base film may be provided between the substrate 400 and the gate electrode layers 411 and 421. The base film has a function of preventing diffusion of an impurity element from the substrate 400, and can be formed with a single film or a stack film using one or more of a silicon nitride film, a silicon oxide film, a silicon nitride oxide film, and a silicon oxynitride film.

As a material for the gate electrode layers 411 and 421, a conductive material that transmits visible light, for example, any of the following metal oxides can be used: an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide. The thickness of the gate electrode layers 411 and 421 is set within the range of 50 nm to 300 nm inclusive. The metal oxide used for the gate electrode layers 411 and 421 is deposited by a sputtering method, a vacuum evaporation method (e.g., an electron beam evaporation method), an arc discharge ion plating method, or a spray method. When a sputtering method is employed, it is preferable that deposition be performed using a target containing $SiO_2$ of 2 wt % to 10 wt % inclusive and SiOx (x>0) which inhibits crystallization be contained in the light-transmitting conductive film which is formed so as to prevent crystallization at the time of the heat treatment for dehydration or dehydrogenation in a later step.

Then, the resist mask is removed, and a gate insulating layer is formed over the gate electrode layers 411 and 421.

The gate insulating layer can be formed with a single layer or a stack using one or more of a silicon oxide layer, a silicon nitride layer, a silicon oxynitride layer, and a silicon nitride oxide layer by a plasma CVD method, a sputtering method, or the like. For example, when a silicon oxynitride layer is formed, it may be formed using $SiH_4$, oxygen, and nitrogen as deposition gases by a plasma CVD method.

In this embodiment, the gate insulating layer is a stack of the first gate insulating layer 402a with a thickness of 50 nm to 200 nm inclusive and the second gate insulating layer 402b with a thickness of 50 nm to 300 nm inclusive. As the first gate insulating layer 402a, a 100-nm-thick silicon nitride film or silicon nitride oxide film is used. As the second gate insulating layer 402b, a 100-nm-thick silicon oxide film is used.

An oxide semiconductor film 430 with a thickness of 2 nm to 200 nm inclusive is formed over the second gate insulating layer 402b (see FIG. 2A). The oxide semiconductor film 430 preferably has a thickness of less than or equal to 50 nm such that an oxide semiconductor layer formed later is in an amorphous state even when heat treatment for dehydration or dehydrogenation is performed after the oxide semiconductor film 430 is formed. The small thickness of the oxide semiconductor film 430 can prevent the oxide semiconductor layer formed later from being crystallized when heat treatment is performed after the formation of the oxide semiconductor film.

Note that before the oxide semiconductor film is formed by a sputtering method, dust attached to a surface of the second gate insulating layer 402b is preferably removed by reverse sputtering in which plasma is generated by introduction of an argon gas. The reverse sputtering refers to a method in which an RF power source is used for application of voltage to a substrate side in an argon atmosphere so that plasma is generated around the substrate to modify a surface. Note that instead of an argon atmosphere, nitrogen, helium, oxygen, or the like may be used.

As the oxide semiconductor film 430, an In—Ga—Zn—O-based non-single-crystal film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 430 is formed by a sputtering method with the use of an In—Ga—Zn—O-based oxide semiconductor target. Alternatively, the oxide semiconductor film 430 can be formed by a sputtering method in a rare gas (typically argon) atmosphere, an oxygen atmosphere, or an atmosphere including a rare gas (typically argon) and oxygen. When a sputtering method is employed, it is preferable that deposition of the oxide semiconductor film 430 be performed using a target containing $SiO_2$ of 2 wt % to 10 wt % inclusive and SiOx (x>0) which inhibits crystallization be contained in the oxide semiconductor film 430 so as to prevent crystallization of the oxide semiconductor layer formed later at the time of the heat treatment for dehydration or dehydrogenation in a later step.

Then, a resist mask is formed over the oxide semiconductor film 430 through a second photolithography process and selective etching is performed using the resist mask, whereby the oxide semiconductor film 430 is processed into island-like oxide semiconductor layers. In addition, the resist mask for forming the island-like oxide semiconductor layers may be formed by an ink jet method. A photomask is not used when the resist mask is formed by an ink jet method, which results in reducing manufacturing costs.

Then, the resist mask is removed, and the oxide semiconductor layers are subjected to dehydration or dehydrogenation. The temperature of first heat treatment for dehydration or dehydrogenation is greater than or equal to 350° C. and less than the strain point of the substrate, preferably greater than or equal to 400° C. Here, the substrate 400 over which the oxide semiconductor layers are formed is put in an electric furnace which is a kind of heat treatment apparatus and heat treatment is performed on the oxide semiconductor layers in a nitrogen atmosphere, cooling is performed without exposure to the air, and water or hydrogen are prevented from being mixed into the oxide semiconductor layers again; thus, oxide semiconductor layers 431 and 432 are obtained (see FIG. 2B). In this embodiment, the same furnace is used from the heat temperature T at which the oxide semiconductor layer is subjected to dehydration or dehydrogenation to a temperature low enough to prevent water from entering again; specifically, slow cooling is performed in a nitrogen atmosphere until the temperature drops by 100° C. or more from the heat temperature T. Moreover, without limitation to a nitrogen atmosphere, dehydration or dehydrogenation may be performed in a rare gas atmosphere (e.g., helium, neon, or argon) or under reduced pressure.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

In some cases, the oxide semiconductor layer is crystallized to be a microcrystalline layer or a polycrystalline layer depending on the conditions of the first heat treatment or the material of the oxide semiconductor layer.

In addition, the first heat treatment can also be performed on the oxide semiconductor film before being processed into the island-like oxide semiconductor layers. In such a case, the substrate is taken out of the heat treatment apparatus after the first heat treatment, and the resist mask is formed through the photolithography process. Then, selective etching is performed using the resist mask, whereby the oxide semiconductor film is processed.

In addition, before the oxide semiconductor film is formed, heat treatment (at greater than or equal to 400° C. and less than the strain point of the substrate) may be performed in an inert gas atmosphere (nitrogen or a rare gas such as helium, neon, or argon), an oxygen atmosphere, or under reduced pressure, thereby removing impurities such as hydrogen and water contained in the gate insulating layers.

Then, an oxide conductive film is formed over the oxide semiconductor layers 431 and 432 and the second gate insulating layer 402b, and a metal conductive film is formed over the oxide conductive film. After that, resist masks 433a and 433b are formed through a third photolithography process, and selective etching is performed, whereby oxide conductive layers 406 and 407 and conductive layers 434 and 435 are formed (see FIG. 2C).

As a material of the oxide conductive film, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed. The thickness of the oxide conductive film is selected as appropriate in the range of 50 nm to 300 nm inclusive. As a deposition method of the oxide conductive film, a sputtering method, a vacuum evaporation method (e.g., an electron beam evaporation method), an arc discharge ion plating method, or a spray method is used. When a sputtering method is employed, it is preferable that deposition be performed using a target containing $SiO_2$ of 2 wt % to 10 wt % inclusive and $SiO_x$ (x>0) which inhibits crystallization be contained in the light-transmitting conductive film so as to prevent crystallization of the oxide conductive layers 406 and 407 at the time of the heat treatment in a later step.

Examples of the material for the metal conductive film are an element selected from Al, Cr, Cu, Ta, Ti, Mo, and W; an alloy containing any of these elements as a component; and an alloy containing these elements in combination.

As the metal conductive film, a three-layer stack film including a titanium film, an aluminum film provided over the titanium film, and a titanium film provided over the aluminum film, or a three-layer stack film including a molybdenum film, an aluminum film provided over the molybdenum film, and a molybdenum film provided over the aluminum film is preferably used. Needless to say, a single layer film, a two-layer stack film, or a stack film of four or more layers may also be used as the metal conductive film.

The resist masks 433a and 433b for forming the oxide conductive layers 406 and 407 and the conductive layers 434 and 435 may be formed by an ink-jet method. A photomask is not used when the resist masks 433a and 433b are formed by an ink jet method, which results in reducing manufacturing costs.

Next, the resist masks 433a and 433b are removed, and resist masks 436a and 436b are formed through a fourth photolithography process. Then, selective etching is performed, whereby the low-resistance drain region 408a, the low-resistance drain region 408b, the source electrode layer 415a, the drain electrode layer 415b, the source electrode layer 409a, the drain electrode layer 409b, a conductive layer 425a, and a conductive layer 425b are formed (see FIG. 2D). Note that, as for the oxide semiconductor layers 431 and 432, only part thereof are etched away, and thus, the oxide semiconductor layers 431 and 432 each have a groove (a depression portion). The resist masks 436a and 436b for forming the grooves (the depression portions) in the oxide semiconductor layers 431 and 432 may be formed by an ink jet method. A photomask is not used when the resist masks 436a and 436b are formed by an ink jet method, which results in reducing manufacturing costs.

Note that in this etching process, etching conditions may be set as appropriate such that the oxide semiconductor layers 431 and 432 in lower layers can remain. For example, the etching time may be controlled.

In addition, a material for forming the oxide semiconductor layers 431 and 432 and a material for forming the oxide conductive layers 406 and 407 each preferably has a high etching selectivity ratio with respect to other materials. For example, a metal oxide material containing Sn (e.g., $SnZnO_x$ (x>0), $SnGaZnO_x$, or the like) may be used as the material for the oxide semiconductor layers 431 and 432, and ITO or the like may be used as the material for the oxide conductive layers 406 and 407.

Then, the resist masks 436a and 436b are removed, and a resist mask 438 is formed through a fifth photolithography process. Then, selective etching is performed, whereby the conductive layers 425a and 425b are removed (see FIG. 2E).

Since the conductive layer 425a overlapping with the source electrode layer 409a and the conductive layer 425b overlapping with the drain electrode layer 409b are selectively removed through the fifth photolithography process, the materials for the oxide semiconductor layer 432, the source electrode layer 409a, and the drain electrode layer 409b and the etching conditions are adjusted as appropriate so that they are not removed in etching the conductive layers 425a and 425b.

The oxide insulating layer 416 serving as a protective insulating film is formed in contact with the grooves (the depression portions) in the oxide semiconductor layers 431 and 432.

The oxide insulating layer 416 has a thickness of at least 1 nm and can be formed by a method by which impurities such as water or hydrogen are not mixed into the oxide insulating layer 416, such as a sputtering method, as appropriate. In this embodiment, a 300-nm-thick silicon oxide film is formed as the oxide insulating layer 416 by a sputtering method. The substrate temperature at the film formation may be in the range of room temperature to 300° C. inclusive, and is 100° C. in this embodiment. The silicon oxide film can be deposited by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed using a silicon target in an atmosphere containing oxygen and nitrogen by a sputtering method. The oxide insulating layer 416 which is formed in contact with part of the oxide semiconductor layers 431 and 432 is formed using an inorganic insulating film that does not contain impurities such as moisture, a hydrogen ion, and OH⁻ and blocks entry of such impurities from the outside, typically a silicon oxide film, a silicon nitride oxide film, an aluminum oxide film, an aluminum oxynitride film, or the like.

Next, second heat treatment (at preferably 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere. With the second heat treatment, heat is applied while the grooves in the oxide semiconductor layers 431 and 432 are in contact with the oxide insulating layer 416.

Through the above process, the resistance of the oxide semiconductor layers 431 and 432 is reduced, and part of the oxide semiconductor layers 431 and 432 are in an oxygen-excess state selectively. As a result, the channel formation region 413 overlapping with the gate electrode layer 411 becomes i-type, and the channel formation region 423 overlapping with the gate electrode layer 421 becomes i-type. Further, the high-resistance drain region 414a is formed in a self-aligned manner in a portion of the oxide semiconductor layer 431 which overlaps with the source electrode layer 415a, the high-resistance drain region 414b is formed in a self-aligned manner in a portion of the oxide semiconductor layer 431 which overlaps with the drain electrode layer 415b, the high-resistance drain region 424a is formed in a self-aligned manner in a portion of the oxide semiconductor layer 432 which overlaps with the source electrode layer 409a, and the high-resistance drain region 424b is formed in a self-aligned manner in a portion of the oxide semiconductor layer 432 which overlaps with the drain electrode layer 409b (see FIG. 3A).

Note that the high-resistance drain region 414b (or the high-resistance drain region 414a) is formed in the oxide semiconductor layer 431 overlapping with the drain electrode layer 415b (or the source electrode layer 415a), so that the reliability of the driver circuit can be increased. Specifically, with the formation of the high-resistance drain region 414b, the conductivity can be gradually varied from the drain electrode layer 415b to the high-resistance drain region 414b and the channel formation region in the transistor. Thus, when the transistor is operated while the drain electrode layer 415b is connected to a wiring that supplies a high power supply potential VDD, even when a high electric field is applied between the gate electrode layer 411 and the drain electrode layer 415b, the high-resistance drain region 414b serves as a buffer and the high electric field is not applied locally, so that the transistor can have increased withstand voltage.

When the high-resistance drain region 414b (or the high-resistance drain region 414a) is formed in the oxide semiconductor layer 431 overlapping with the drain electrode layer 415b (or the source electrode layer 415a), the amount of leakage current in the transistor in the driver circuit can be reduced.

Note that the high-resistance drain region 424b (or the high-resistance drain region 424a) is formed in the oxide semiconductor layer 432 overlapping with the drain electrode layer 409b (or the source electrode layer 409a), so that the reliability of the pixel can be increased. Specifically, with the formation of the high-resistance drain region 424b, the conductivity can be gradually varied from the drain electrode layer 409b to the high-resistance drain region 424b and the channel formation region in the transistor. Thus, when the transistor is operated while the drain electrode layer 409b is connected to a wiring that supplies a high power supply potential VDD, even when a high electric field is applied between the gate electrode layer 421 and the drain electrode layer 409b, the high-resistance drain region 424b serves as a buffer and the high electric field is not applied locally, so that the transistor can have increased withstand voltage.

When the high-resistance drain region 424b (or the high-resistance drain region 424a) is formed in the oxide semiconductor layer 432 overlapping with the drain electrode layer 409b (or the source electrode layer 409a), the amount of leakage current in the transistor in the pixel can be reduced.

Next, the protective insulating layer 403 is formed over the oxide insulating layer 416. In this embodiment, the protective insulating layer 403 is formed by forming a silicon nitride film by an RF sputtering method. Since an RF sputtering method has high productivity, it is preferably used as a deposition method of the protective insulating layer 403. For example, an inorganic insulating film which does not contain moisture, a hydrogen ion, and OH⁻ and blocks entry of such impurities from the outside is used to form the protective insulating layer 403. For example, the protective insulating layer 403 can be formed using a silicon nitride film, an aluminum nitride film, silicon nitride oxide film, an aluminum oxynitride film, or the like. Needless to say, the protective insulating layer 403 is a light-transmitting insulating film.

The protective insulating layer 403 is preferably in contact with the first gate insulating layer 402a or an insulating film serving as a base provided below the protective insulating layer 403, and blocks entry of impurities such as moisture, a hydrogen ion, and OH⁻ from the vicinity of a side surface of the substrate. It is particularly effective to use a silicon nitride film as the first gate insulating layer 402a or the insulating film serving as the base, which is in contact with the protective insulating layer 403. In other words, a silicon nitride film provided so as to surround a bottom surface, a top surface, and a side surface of each of the oxide semiconductor layers 412 and 422 can increase the reliability of the display device.

Next, the planarization insulating layer 404 is formed over the protective insulating layer 403. The planarization insulating layer 404 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like for the planarization insulating layer 404. Note that the planarization insulating layer 404 may be formed by stacking a plurality of insulating films formed from these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 404. The planarization insulating layer 404 can be formed, depending on the material, by a method such as a sputtering method, an SOG method, a spin coating method, a dipping method, a spray coating method, or a droplet discharge method (e.g., an ink jet method, screen printing, or offset printing), or a tool such as a doctor knife, a roll coater, a curtain coater, or a knife coater.

Figure 3A:
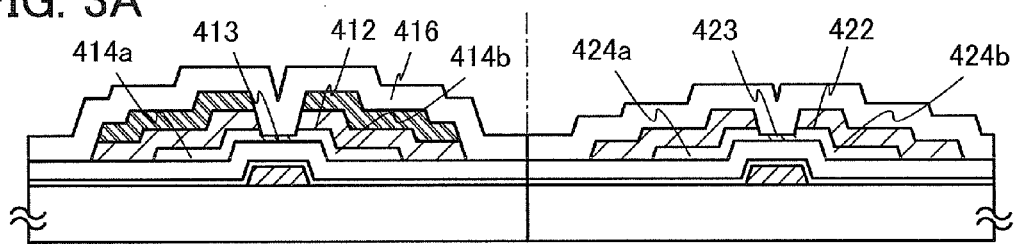
FIGS. 3A to 3C illustrate a method for manufacturing a semiconductor device.
Figure 3B:
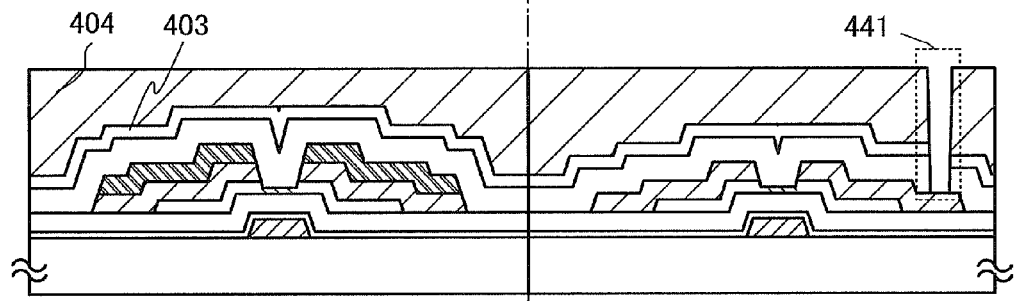

Then, a sixth photolithography process is performed so that a resist mask is formed and a contact hole 441 that reaches the drain electrode layer 409b is formed by etching of the planarization insulating layer 404, the protective insulating layer 403, and the oxide insulating layer 416 (see FIG. 3B). Moreover, contact holes that reach the gate electrode layers 411 and 421 are also formed with that etching. Alternatively, the resist mask for forming the contact hole 441 that reaches the drain electrode layer 409b may be formed by an ink-jet method. A photomask is not used when the resist mask is formed by an ink-jet method, which results in reducing manufacturing costs.

Next, the resist mask is removed and then a light-transmitting conductive film is formed. The light-transmitting conductive film can be formed from an indium oxide ($In_2O_3$) film, a film of an alloy of indium oxide and tin oxide ($In_2O_3$—$SnO_2$, abbreviated to ITO), or the like by a sputtering method, a vacuum evaporation method, or the like. Alternatively, as the light-transmitting conductive film, an Al—Zn—O-based non-single-crystal film containing nitrogen (i.e., an Al—Zn—O—N-based non-single-crystal film), a Zn—O-based non-single-crystal film containing nitrogen, or an Sn—Zn—O-based non-single-crystal film containing nitrogen may be used. Note that the percentage (at. %) of zinc in the Al—Zn—O—N-based non-single-crystal film is less than or equal to 47 at. % and is higher than that of aluminum in the non-single-crystal film; the percentage (at. %) of aluminum in the Al—Zn—O—N-based non-single-crystal film is higher than that of nitrogen in the Al—Zn—O—N-based non-single-crystal film. A film of such a material is etched with a hydrochloric acid-based solution. However, since a residue is easily generated particularly in etching the ITO film, an alloy of indium oxide and zinc oxide ($In_2O_3$—ZnO) may be used to improve etching processability.

Note that the unit of the percentage of components in the light-transmitting conductive film is atomic percent (at. %), and the percentage of components in the light-transmitting conductive film is evaluated by analysis using an electron probe X-ray microanalyzer (EPMA).

Figure 3C:
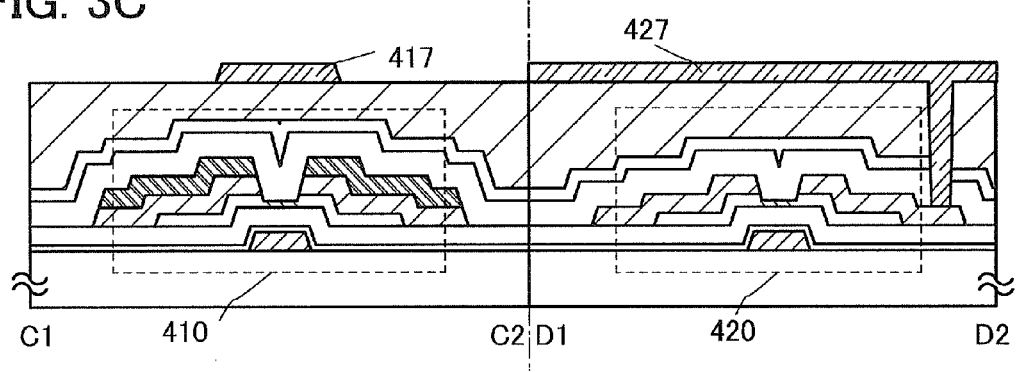

Next, a seventh photolithography process is performed so that a resist mask is formed and unnecessary portions of the light-transmitting conductive film are removed by etching, and the resist mask is removed, so that the pixel electrode layer 427 and the conductive layer 417 are formed (see FIG. 3C).

Through the above-described process, the thin film transistor 410 and the thin film transistor 420 can be separately formed in the driver circuit and the pixel portion, respectively, over the same substrate with the use of seven masks. The thin film transistor 410 in the driver circuit is a channel-etched thin film transistor including the oxide semiconductor layer 412 which has the high-resistance drain region 414a, the high-resistance drain region 414b, and the channel formation region 413. Meanwhile, the thin film transistor 420 in the pixel portion is a channel-etched thin film transistor including the oxide semiconductor layer 422 which has the high-resistance drain region 424a, the high-resistance drain region 424b, and the channel formation region 423. In the thin film transistors 410 and 420, even when a high electric field is applied, the high-resistance drain regions 414a, 414b, 424a, and 424b each serve as a buffer, whereby the high electric field is not applied locally and the withstand voltage of the transistor can be improved.

A storage capacitor that is constituted by a capacitor wiring and a capacitor electrode (also referred to as a capacitor electrode layer) with the first and second gate insulating layers 402a and 402b as dielectrics can also be formed over the substrate over which the thin film transistors 410 and 420 are formed. The thin film transistors 420 and storage capacitors are arranged in matrix to correspond to individual pixels so that the pixel portion is formed, and the driver circuit including the thin film transistor 410 is arranged around the pixel portion, whereby one of the substrates for manufacturing an active matrix display device can be obtained. In this specification, such a substrate is referred to as an active matrix substrate for convenience.

The pixel electrode layer 427 is electrically connected to the capacitor electrode layer through the contact hole formed in the planarization insulating layer 404, the protective insulating layer 403, and the oxide insulating layer 416. Note that the capacitor electrode layer can be formed from the same material and in the same step as the source electrode layer 409a and the drain electrode layer 409b.

The conductive layer 417 is provided so as to overlap with the channel formation region 413 in the oxide semiconductor layer 412, whereby the amount of change in threshold voltage of the thin film transistor 410 before and after a bias-temperature stress test (referred to as a BT test) for examining the reliability of a thin film transistor can be reduced. A potential of the conductive layer 417 may be the same as or different from that of the gate electrode layer 411. The conductive layer 417 can also function as a gate electrode layer. In addition, the potential of the conductive layer 417 may be placed in a GND state or a state of 0V, or the conductive layer 417 may be placed in a floating state.

Note that the resist mask for forming the pixel electrode layer 427 and the conductive layer 417 may be formed by an ink jet method. A photomask is not used when the resist mask is formed by an ink jet method, which results in reducing manufacturing costs.

(Embodiment 2)

In this embodiment, an example where first heat treatment is different from that in Embodiment 1 will be described with reference to FIGS. 4A to 4C. Since FIGS. 4A to 4C are the same as FIGS. 2A to 2E and FIGS. 3A to 3C except for part of the steps, the same reference numerals are used for the same portions and detailed description of the same portions is not repeated.

Figure 4A:
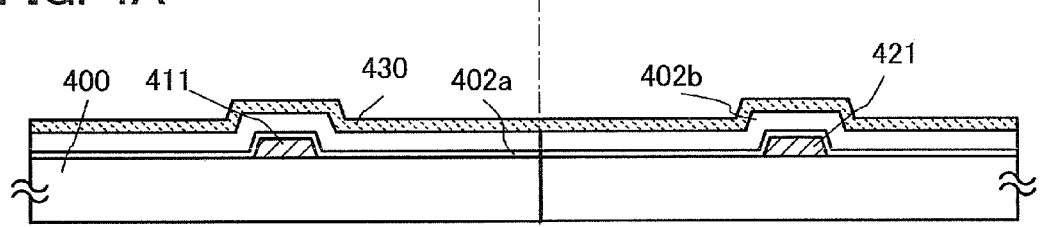
FIGS. 4A to 4C illustrate a method for manufacturing a semiconductor device.
Figure 4B:
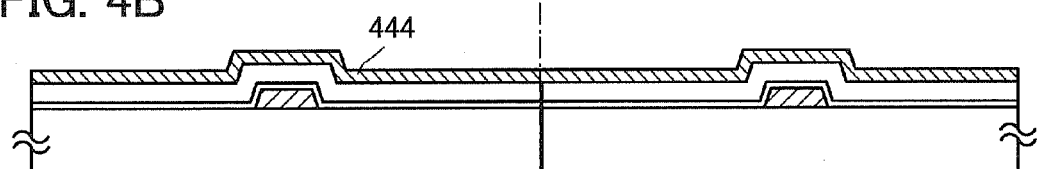
Figure 4C:
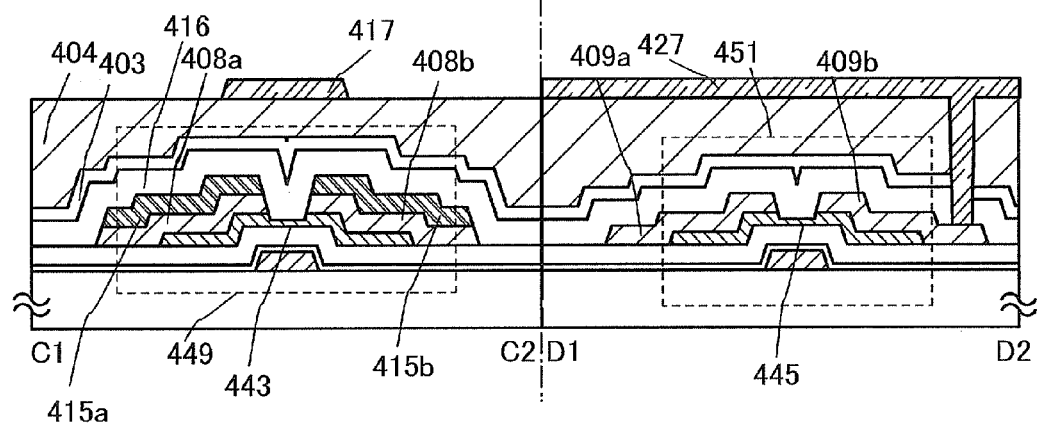
Figure 5A:
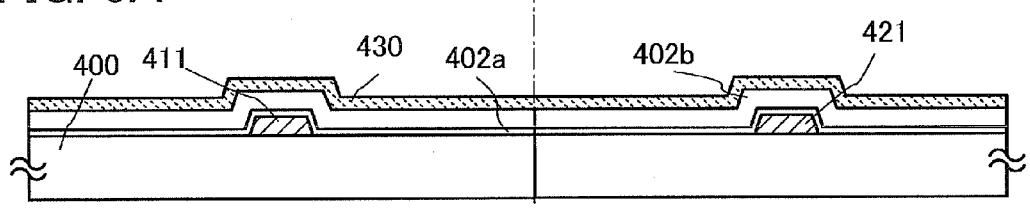
FIGS. 5A to 5D illustrate a method for manufacturing a semiconductor device.
Figure 5B:
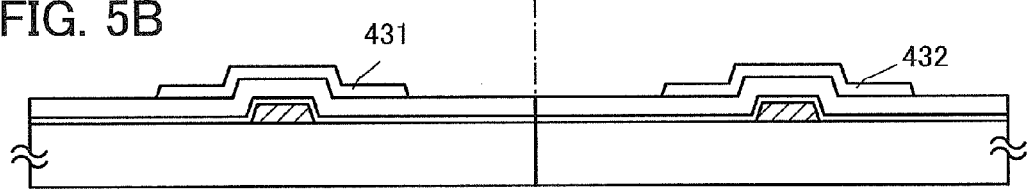
Figure 5C:
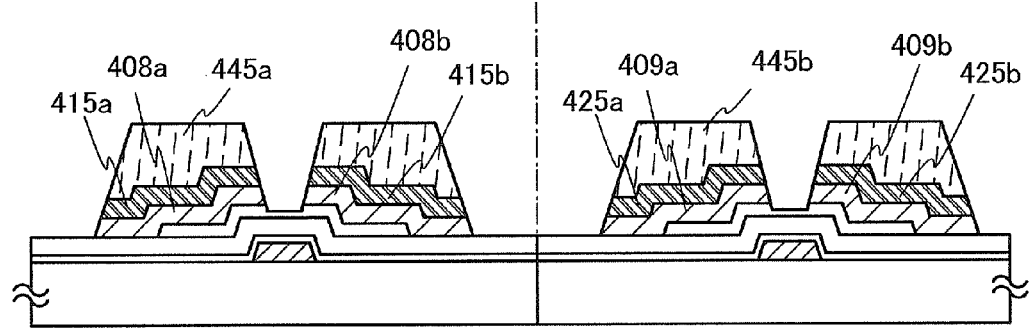
Figure 5D:
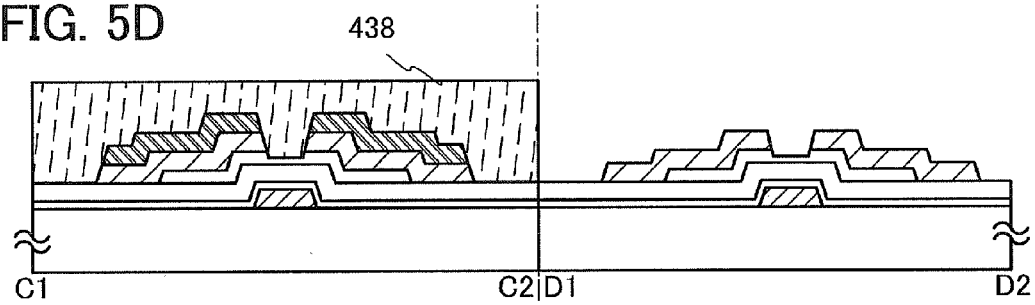

FIGS. 4A to 4C are cross-sectional views illustrating a process for manufacturing two thin film transistors.

First, in accordance with Embodiment 1, gate electrode layers 411 and 421 are formed over a substrate 400 having an insulating surface.

Next, over the gate electrode layers 411 and 421, a first gate insulating layer 402a and a second gate insulating layer 402b are stacked as a gate insulating layer.

Then, an oxide semiconductor film 430 with a thickness of 2 nm to 200 nm inclusive is formed over the second gate insulating layer 402b (see FIG. 4A). Note that the steps up to this point are the same as those in Embodiment 1, and FIG. 4A corresponds to FIG. 2A.

Next, the oxide semiconductor film is dehydrated or dehydrogenated in an inert gas atmosphere or under reduced pressure. The temperature of the first heat treatment for dehydration or dehydrogenation is set to greater than or equal to 350° C. and less than the strain point of the substrate, preferably greater than or equal to 400° C. In this embodiment, the substrate 400 over which the oxide semiconductor film 430 is formed is put in an electric furnace which is a kind of heat treatment apparatus, and the heat treatment is performed on the oxide semiconductor film 430 in a nitrogen atmosphere. After that, cooling is performed without exposure to the air water or hydrogen are prevented from being mixed into the oxide semiconductor film 430 again, whereby the oxide semiconductor film 430 is made to be in an oxygen-deficient state, and the resistance is reduced, that is, the oxide semiconductor film 430 is made to be n-type (e.g., n⁻ type). Then, an oxygen gas, a high-purity $N_2O$ gas, or ultra-dry air (having a dew point of less than or equal to −40° C., preferably less than or equal to −60° C.) is introduced to the same furnace and cooling is performed. It is preferable that the oxygen gas or the $N_2O$ gas do not contain water, hydrogen, and the like. In addition, the purity of the oxygen gas or the $N_2O$ gas which is introduced into the heat treatment apparatus is preferably greater than or equal to 6 N (99.9999%), more preferably greater than or equal to 7 N (99.99999%) (i.e., the impurity concentration in the oxygen gas or the $N_2O$ gas is preferably less than or equal to 1 ppm, more preferably less than or equal to 0.1 ppm).

In addition, after the first heat treatment for dehydration or dehydrogenation, heat treatment may be performed at 200° C. to 400° C. inclusive, preferably 200° C. to 300° C. inclusive in an oxygen gas atmosphere, an $N_2O$ gas atmosphere, or an ultra-dry air (having a dew point of less than or equal to −40° C., preferably less than or equal to −60° C.) atmosphere.

Through the above process, the entire oxide semiconductor film 430 is made to be in an oxygen-excess state so as to have higher resistance, that is, to be i-type. An oxide semiconductor film 444 is formed in this manner (see FIG. 4B). As a result, the reliability of thin film transistors formed later can be increased.

In this embodiment, an example in which dehydration or dehydrogenation are performed after the oxide semiconductor film 430 is formed is shown, but this embodiment is not limited thereto. The first heat treatment may be performed on island-like oxide semiconductor layers which have been processed from the oxide semiconductor film as in Embodiment 1.

The oxide semiconductor film 430 is dehydrated or dehydrogenated in an inert gas atmosphere or under reduced pressure and then cooled in an inert gas atmosphere. After that, a resist mask is formed through a photolithography process. Selective etching is performed on the oxide semiconductor film 444 using the resist mask, whereby island-like semiconductor layers are formed. Then, heat treatment may be performed at 200° C. to 400° C. inclusive, preferably 200° C. to 300° C. inclusive in an oxygen gas atmosphere, an $N_2O$ gas atmosphere, or an ultra-dry air (having a dew point of less than or equal to −40° C., preferably less than or equal to −60° C.) atmosphere.

In addition, before the oxide semiconductor film 430 is formed, heat treatment (at greater than or equal to 400° C. and less than the strain point of the substrate) may be performed in an inert gas atmosphere (nitrogen or a rare gas such as helium, neon, or argon), an oxygen atmosphere, an ultra-dry air (having a dew point of less than or equal to −40° C., preferably less than or equal to −60° C.) atmosphere, or under reduced pressure, thereby removing impurities such as hydrogen and water contained in the gate insulating layers.

Next, a resist mask is formed over the oxide semiconductor film 444 through a second photolithography process, and selective etching is performed on the oxide semiconductor film 444 using the resist mask, whereby island-like oxide semiconductor layers 443 and 445 are formed.

Then, the resist mask is removed. Further, as in FIGS. 2C, 2D, and 2E, and FIGS. 3A, 3B, and 3C of Embodiment 1, in a peripheral driver circuit portion, the oxide semiconductor layer is only partly etched away, and thus, the oxide semiconductor layer 443 has a groove (a depression portion). Then, low-resistance drain regions 408a and 408b which are in contact with the oxide semiconductor layer 443, a source electrode layer 415a and a drain electrode layer 415b which are metal conductive layers and in contact with the low-resistance drain regions 408a and 408b respectively, and an oxide insulating layer 416 in contact with part of the oxide semiconductor layer 443 are formed. A thin film transistor 449 for the driver circuit is formed in this manner. Meanwhile, in a pixel portion, the oxide semiconductor layer is only partly etched away, and thus, the oxide semiconductor layer 445 has a groove (a depression portion). Then, a source electrode layer 409a and a drain electrode layer 409b which are light-transmitting conductive layers and in contact with the oxide semiconductor layer 445, and the oxide insulating layer 416 in contact with part of the oxide semiconductor layer 445 are formed. A thin film transistor 451 for the pixel is formed in this manner.

Next, second heat treatment (preferably at 200° C. to 400° C. inclusive, e.g., 250° C. to 350° C. inclusive) is performed in an inert gas atmosphere or an oxygen gas atmosphere. For example, the second heat treatment is performed in a nitrogen atmosphere at 250° C. for one hour.

Next, a protective insulating layer 403 and a planarization insulating layer 404 are stacked so as to cover the thin film transistors 449 and 451 and be in contact with the oxide insulating layer 416. Further, a contact hole is formed in the protective insulating layer 403 and the planarization insulating layer 404 to reach the drain electrode layer 409b. Further, a light-transmitting conductive film is formed and selectively etched, whereby a conductive layer 417 and a pixel electrode layer 427 electrically connected to the thin film transistor 451 are formed (see FIG. 4C).

Through the above-described process, the thin film transistor 449 and the thin film transistor 451 in each of which the entire oxide semiconductor layer is i-type can be separately formed in the driver circuit and the pixel portion, respectively, over the same substrate with the use of seven masks. The thin film transistor 449 for the driver circuit is a channel-etched thin film transistor including the oxide semiconductor layer 443 which is entirely i-type, while the thin film transistor 451 for the pixel is a channel-etched thin film transistor including the oxide semiconductor layer 445 which is entirely i-type.

In addition, a storage capacitor that is constituted by a capacitor wiring layer and a capacitor electrode with the first gate insulating layer 452a and the second gate insulating layer 452b as dielectrics can be formed over the substrate over which the thin film transistors 449 and 451 are formed. The thin film transistors 451 and storage capacitors are arranged in matrix to correspond to individual pixels so that a pixel portion is formed, and a driver circuit including the thin film transistor 449 is arranged around the pixel portion, whereby one of the substrates for manufacturing an active matrix display device can be obtained.

The conductive layer 417 is provided so as to overlap with the channel formation region in the oxide semiconductor layer 443, whereby the amount of change in threshold voltage of the thin film transistor 449 before and after the BT test can be reduced. A potential of the conductive layer 417 may be the same as or different from that of the gate electrode layer 411. The conductive layer 417 can also function as a gate electrode layer. In addition, the potential of the conductive layer 417 may be placed in a GND state or a state of 0V, or the conductive layer 417 may be placed in a floating state.

(Embodiment 3)

A method for manufacturing a semiconductor device which is different from that in Embodiment 1 will be described with reference to FIGS. 5A to 5D. Portions which are the same as or have functions similar to those in Embodiment 1 are formed as in Embodiment 1, and steps which are the same as or similar to those in Embodiment 1 can be carried out as in Embodiment 1; therefore, the description thereof will not be repeated.

FIGS. 5A to 5D are cross-sectional views illustrating a process for manufacturing two thin film transistors.

First, as in FIG. 2A of Embodiment 1, over a substrate 400 having an insulating surface, a gate electrode layer 411 and a gate electrode layer 421 are formed. Then, over the gate electrode layers 411 and 421, a first gate insulating layer 402a and a second gate insulating layer 402b are formed as a gate insulating layer, and an oxide semiconductor film 430 is formed over the second gate insulating layer 402b (see FIG. 5A).

Then, a resist mask is formed over the oxide semiconductor film through a second photolithography process. Selective etching is performed on the oxide semiconductor film using the resist mask, whereby island-like semiconductor layers are formed.

Figure 2B:
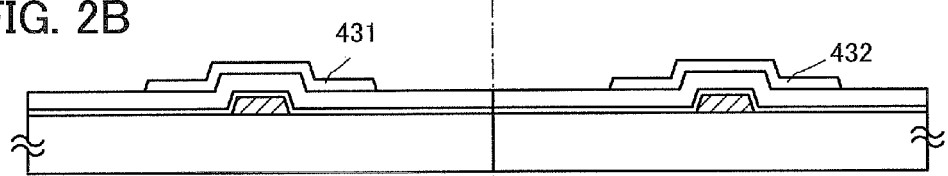
Figure 2C:
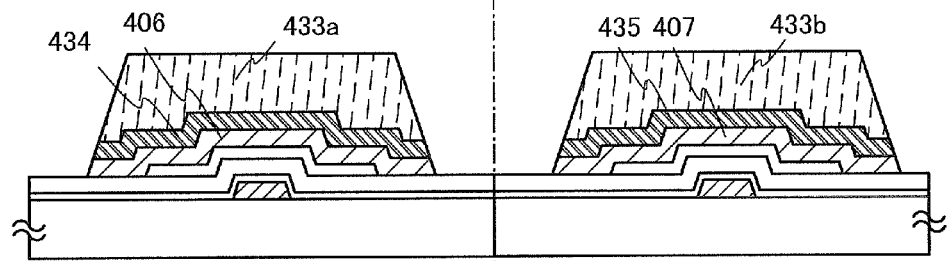
Figure 2D:
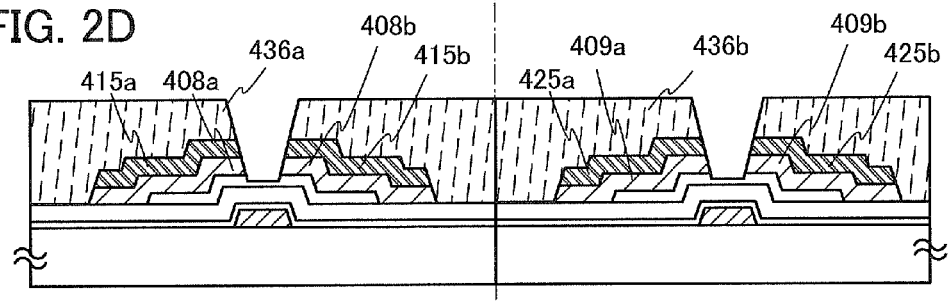
Figure 2E:
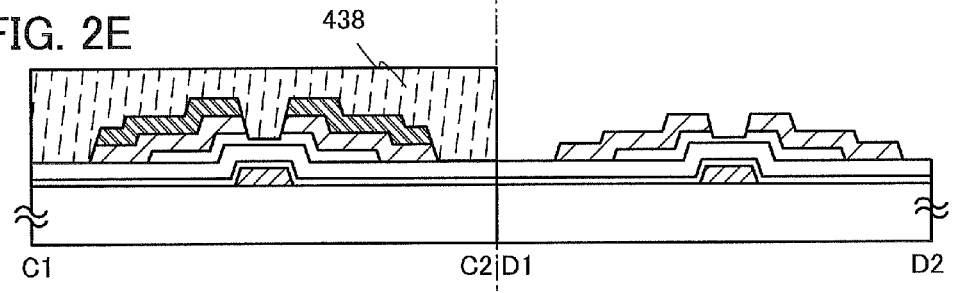

Then, the resist mask is removed and first heat treatment is performed as in FIG. 2B of Embodiment 1, whereby the oxide semiconductor layers are dehydrated or dehydrogenated. The temperature of the first heat treatment for dehydration or dehydrogenation is greater than or equal to 350° C. and less than the strain point of the substrate, preferably greater than or equal to 400° C. Here, the substrate over which the oxide semiconductor layers are formed is put in an electric furnace which is a kind of heat treatment apparatus and heat treatment is performed on the oxide semiconductor layers in a nitrogen atmosphere, cooling is performed without exposure to the air, and water or hydrogen are prevented from being mixed into the oxide semiconductor layers again; thus, oxide semiconductor layers 431 and 432 are obtained (see FIG. 5B).

Then, an oxide conductive film is formed over the oxide semiconductor layers 431 and 432 and the second gate insulating layer 402b, and a metal conductive film is formed over the oxide conductive film. After that, resist masks 445a and 445b are formed through a third photolithography process, and selective etching is performed using the resist masks 445a and 445b, whereby a low-resistance drain region 408a, a low-resistance drain region 408b, a source electrode layer 409a, a drain electrode layer 409b, a source electrode layer 415a, a drain electrode layer 415b, a conductive layer 425a, and a conductive layer 425b are formed (see FIG. 5C). Materials similar to those in Embodiment 1 can be used for the oxide conductive film and the metal conductive film. Note that as for the oxide semiconductor layers, only part thereof are etched away by etching, whereby the oxide semiconductor layers 431 and 432 each have a groove (a depression portion).

Note that in this etching process, etching conditions may be set as appropriate such that the oxide semiconductor layers 431 and 432 in lower layers can remain. For example, the etching time may be controlled.

In addition, a material for forming the oxide semiconductor layers 431 and 432 and a material for forming the low-resistance drain regions 408a and 408b, the source electrode layer 409a, and the drain electrode layer 409b each preferably has a high etching selectivity ratio with respect to other materials. For example, a metal oxide material containing Sn (e.g., $SnZnO_x$ (x>0), $SnGaZnO_x$, or the like) may be used for the material for the oxide semiconductor layers 431 and 432, and ITO or the like may be used for the material for the low-resistance drain regions 408a and 408b, the source electrode layer 409a, and the drain electrode layer 409b.

Then, the resist masks 445a and 445b are removed, and a resist mask 438 is formed through a fourth photolithography process. Then, selective etching is performed using the resist mask 438, whereby the conductive layers 425a and 425b are removed (see FIG. 5D).

Since the conductive layers which overlap with the source electrode layer 409a and the drain electrode layer 409b are selectively removed through the fourth photolithography process, materials for the oxide semiconductor layer 432, the source electrode layer 409a, and the drain electrode layer 409b and etching conditions are adjusted as appropriate so that they are not removed in etching the conductive layers.

The oxide semiconductor layers 431 and 432 preferably have a thickness of less than or equal to 50 nm so as to be kept in an amorphous state. Particularly in the channel-etched thin film transistor, the oxide semiconductor layer is further etched, and the thickness of a thin region, that is, a channel formation region is less than or equal to 30 nm, and the thickness of a thin region in the thin film transistor which is completed is set to 5 nm to 20 nm inclusive.

In addition, the channel width of the thin film transistor which is completed is preferably 0.5 μm to 10 μm inclusive.

Next, as in FIG. 3A of Embodiment 1, an oxide insulating layer 416 serving as a protective insulating film is formed in contact with the grooves (the depression portions) of the oxide semiconductor layers 431 and 432, and second heat treatment is performed. In this manner, a channel formation region 413 overlapping with the gate electrode layer 411 becomes i-type, and a channel formation region 423 overlapping with the gate electrode layer 421 also becomes i-type. Further, a high-resistance drain region 414a overlapping with the source electrode layer 415a and a high-resistance drain region 414b overlapping with the drain electrode layer 415b are formed in a self-aligned manner, and a high-resistance drain region 424a overlapping with the source electrode layer 409a and a high-resistance drain region 424b overlapping with the drain electrode layer 409b are formed in a self-aligned manner.

Then, as in FIG. 3B of Embodiment 1, a protective insulating layer 403 is formed over the oxide insulating layer 416, and a planarization insulating layer 404 is formed over the protective insulating layer 403. A resist mask is formed through a fifth photolithography process and etching is performed using the resist mask on the planarization insulating layer 404, the protective insulating layer 403, and the oxide insulating layer 416, whereby a contact hole 441 is formed to reach the drain electrode layer 409b.

Next, after the resist mask is removed as in FIG. 3C of Embodiment 1, a light-transmitting conductive film is formed. Next, a sixth photolithography process is performed, so that a resist mask is formed, and unnecessary portions of the light-transmitting conductive film are removed by etching using the resist mask to form the pixel electrode layer 427 and the conductive layer 417.

Through the above-described steps, a thin film transistor 410 and a thin film transistor 420 can be separately formed in the driver circuit and the pixel portion, respectively, over one substrate with the use of six masks. The number of masks can be smaller than in the manufacturing process of Embodiment 1. The thin film transistor 410 for the driver circuit is a channel-etched thin film transistor including the oxide semiconductor layer 412 which has the high-resistance drain region 414a, the high-resistance drain region 414b, and the channel formation region 413. Meanwhile, the thin film transistor 420 for the pixel is a channel-etched thin film transistor including the oxide semiconductor layer 422 which has the high-resistance drain region 424a, the high-resistance drain region 424b, and the channel formation region 423. In the thin film transistors 410 and 420, even when a high electric field is applied, the high-resistance drain regions 414a, 414b, 424a, and 424b serves as buffers and the high electric field is not applied locally, so that the withstand voltage of the transistor can be improved.

(Embodiment 4)

A semiconductor device different from that of Embodiment 1 and a method for manufacturing the semiconductor device will be described with reference to FIGS. 6A1 to 6C, FIGS. 38A to 38E, and FIGS. 39A to 39C. FIGS. 6B and 6C illustrate an example of a cross-sectional structure of two thin film transistors whose structures are different from each other and which are formed over one substrate. A thin film transistor 460 and a thin film transistor 470 illustrated in FIGS. 6A1 to 6C are each a kind of a channel-etched bottom gate transistor.

FIG. 6A1 is a plan view of the channel-etched thin film transistor 460 arranged in a driver circuit, FIG. 6A2 is a plan view of the channel-etched thin film transistor 470 arranged in a pixel, FIG. 6B is a cross-sectional view illustrating a cross-sectional structure along line G1-G2 in FIG. 6A1 and a cross-sectional structure along line H1-H2 in FIG. 6A2, and FIG. 6C is a cross-sectional view illustrating a cross-sectional structure along line G3-G4 in FIG. 6A1 and a cross-sectional structure along line H3-H4 in FIG. 6A2.

The thin film transistor 460 arranged in the driver circuit is a channel-etched thin film transistor and includes a gate electrode layer 461; a first gate insulating layer 452a; a second gate insulating layer 452b; an oxide semiconductor layer 462 including at least a channel formation region 463, a high-resistance drain region 464a, and a high-resistance drain region 464b; a low-resistance drain region 446a; a low-resistance drain region 446b; a source electrode layer 465a; and a drain electrode layer 465b over a substrate 450 having an insulating surface. Moreover, an oxide insulating layer 466 which covers the thin film transistor 460 and is in contact with the channel formation region 463 is provided.

The high-resistance drain region 464a is formed in contact with a bottom surface of the low-resistance drain region 446a in a self-aligned manner. The high-resistance drain region 464b is formed in contact with a bottom surface of the low-resistance drain region 446b in a self-aligned manner. The channel formation region 463 is in contact with the oxide insulating layer 466, has a small thickness, and is a region with higher resistance than the high-resistance drain region 464a and the high-resistance drain region 464b (an i-type region).

In addition, because the low-resistance drain regions 446a and 446b are provided, the thin film transistor 460 can be operated more stably also in terms of heat than a thin film transistor with a Schottky junction. By intentionally providing the low-resistance drain region with a higher carrier concentration than that of the oxide semiconductor layer as described above, ohmic contact is obtained.

In order to reduce the resistance of the wiring in the thin film transistor 460, a metal material is preferably used for the source electrode layer 465a and the drain electrode layer 465b.

When a pixel portion and a driver circuit are formed over one substrate in a semiconductor device of this embodiment, in the driver circuit, positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a VCO. Consequently, the width of the high-resistance drain region 464b that needs high withstand voltage may be designed to be larger than the width of the high-resistance drain region 464a. Moreover, the width of a region of each of the high-resistance drain region 464a and the high-resistance drain region 464b which overlaps with the gate electrode layer 461 may be increased.

The thin film transistor 460 arranged in the driver circuit is described using a single-gate thin film transistor; a multi-gate thin film transistor including a plurality of channel formation regions can be formed when needed.

Furthermore, a conductive layer 467 is provided above the channel formation region 463 so as to overlap with the channel formation region 463. The conductive layer 467 is electrically connected to the gate electrode layer 461 so that the conductive layer 467 and the gate electrode layer 461 have the same potential, whereby a gate voltage can be applied from above and below the oxide semiconductor layer 462 placed between the gate electrode layer 461 and the conductive layer 467. Alternatively, when the gate electrode layer 461 and the conductive layer 467 are made to have different potentials, for example, one of them has a fixed potential, a GND potential, or 0 V, electrical characteristics of the TFT, such as the threshold voltage, can be controlled. In other words, one of the gate electrode layer 461 and the conductive layer 467 functions as a first gate electrode layer, and the other of the gate electrode layer 461 and the conductive layer 467 functions as a second gate electrode layer, whereby the thin film transistor 460 can be used as a thin film transistor having four terminals.

Further, a protective insulating layer 453 and a planarization insulating layer 454 are stacked between the conductive layer 467 and the oxide insulating layer 466.

The protective insulating layer 453 is preferably in contact with the first gate insulating layer 452a or an insulating film serving as a base provided below the protective insulating layer 453, and blocks entry of impurities such as moisture, a hydrogen ion, and OH⁻ from a side surface of the substrate 450. It is particularly effective to use a silicon nitride film as the first gate insulating layer 452a or the insulating film serving as the base, which is in contact with the protective insulating layer 453.

The thin film transistor 470 arranged in the pixel is a channel-etched thin film transistor and includes a gate electrode layer 471; the first gate insulating layer 452a, the second gate insulating layer 452b; an oxide semiconductor layer 472 including at least a channel formation region 473, a high-resistance drain region 474a, and a high-resistance drain region 474b; a source electrode layer 447a, and a drain electrode layer 447b over the substrate 450 having an insulating surface. In addition, the oxide insulating layer 466 which covers the thin film transistor 470 and is in contact with the upper surface and the side surfaces of the oxide semiconductor layer 472 is provided.

Note that AC drive is performed in a semiconductor device of this embodiment in order to prevent deterioration in liquid crystal. Through the AC drive, the polarity of a signal potential applied to a pixel electrode layer is inverted to be positive or negative every predetermined period. In a TFT which is connected to the pixel electrode layer, a pair of electrodes function as a source electrode layer and a drain electrode layer. In this specification, for convenience, one of a pair of electrodes of a thin film transistor in a pixel is referred to as a source electrode layer and the other of the electrodes is referred to as a drain electrode layer; however, practically, one of the electrodes alternately functions as the source electrode layer and the drain electrode layer in the case of AC drive. In addition, in order to reduce the amount of leakage current, the width of the gate electrode layer in the thin film transistor 470 arranged in the pixel may be made smaller than the width of the gate electrode layer in the thin film transistor 460 arranged in the driver circuit. Alternatively, in order to reduce the amount of leakage current, the gate electrode layer 471 in the thin film transistor 470 arranged in the pixel may be designed so as not to overlap with the source electrode layer 447a or the drain electrode layer 447b.

The high-resistance drain region 474a is formed in contact with a bottom surface of the source electrode layer 447a in a self-aligned manner. The high-resistance drain region 474b is formed in contact with a bottom surface of the drain electrode layer 447b in a self-aligned manner. The channel formation region 473 is in contact with the oxide insulating layer 466, has a small thickness, and is a region having higher resistance than the high-resistance drain regions 474a and 474b (an i-type region).

Heat treatment for reducing impurities such as moisture (heat treatment for dehydration or dehydrogenation) is performed after an oxide semiconductor film used for forming the oxide semiconductor layers 462 and 472 is deposited. Reduction of the carrier concentration of the oxide semiconductor layers 462 and 472, by, for example, forming an oxide insulating film in contact with the formed oxide semiconductor layers after the heat treatment for dehydration or dehydrogenation and slow cooling leads to improvement of the electrical characteristics and reliability of the thin film transistors 460 and 470.

The oxide semiconductor layer 462 is formed below and to overlap with part of the source electrode layer 465a and the drain electrode layer 465b. In addition, the oxide semiconductor layer 462 overlaps with the gate electrode layer 461 with the first gate insulating layer 452a and the second gate insulating layer 452b interposed therebetween. Further, the oxide semiconductor layer 472 is formed below and to overlap with part of the source electrode layer 447a and the drain electrode layer 447b. In addition, the oxide semiconductor layer 472 overlaps with the gate electrode layer 471 with the first gate insulating layer 452a and the second gate insulating layer 452b interposed therebetween.

A light-transmitting conductive film is used for the source electrode layer 447a and the drain electrode layer 447b of the thin film transistor 470 so as to realize a display device with a high aperture ratio.

Moreover, a light-transmitting conductive film is also used for the gate electrode layer 471 in the thin film transistor 470.

In the pixel in which the thin film transistor 470 is arranged, a conductive film that transmits visible light is used for a pixel electrode layer 477 or a different electrode layer (e.g., a capacitor electrode layer) or a different wiring layer (e.g., a capacitor wiring layer), which realizes a display device with a high aperture ratio. Needless to say, it is preferable to use a film that transmits visible light for the first gate insulating layer 452a, the second gate insulating layer 452b, and the oxide insulating layer 466.

A process for manufacturing the thin film transistors 460 and 470 over the same substrate will be described below with reference to FIGS. 38A to 38E and FIGS. 39A to 39C.

First, a light-transmitting conductive film is formed over the substrate 450 having an insulating surface. Then, a resist mask is formed over the conductive film through a first photolithography process and selective etching is performed using the resist mask, whereby the gate electrode layers 461 and 471 are formed. Moreover, a capacitor wiring is formed in the pixel portion from the same material as that for the gate electrode layers 461 and 471 through the first photolithography process. Furthermore, when a capacitor is necessary in the driver circuit in addition to the pixel portion, the capacitor wiring is also formed in the driver circuit. Note that the resist mask may be formed by an ink jet method. A photomask is not used when the resist mask is formed by an ink-jet method, which results in reducing manufacturing costs.

Although there is no particular limitation on a substrate which can be used for the substrate 450 having an insulating surface, the substrate needs to have heat resistance high enough to withstand at least heat treatment to be performed later. As the substrate 450 having an insulating surface, a glass substrate of barium borosilicate glass, aluminoborosilicate glass, or the like can be used.

When the temperature of the heat treatment performed later is high, a substrate having a strain point of greater than or equal to 730° C. is preferably used as a glass substrate applicable to the substrate 450. As the glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boric acid. Therefore, a glass substrate containing a larger amount of BaO than $B_2O_3$ is preferably used.

Note that a substrate formed of an insulator, such as a ceramic substrate, a quartz substrate, or a sapphire substrate, may be used as the substrate 450 instead of the glass substrate. Alternatively, crystallized glass or the like may be used as the substrate 450.

An insulating film serving as a base film may be provided between the substrate 450 and the gate electrode layers 461 and 471. The base film has a function of preventing diffusion of an impurity element from the substrate 450, and can be formed with a single film or a stack film using one or more of a silicon nitride film, a silicon oxide film, a silicon nitride oxide film, and a silicon oxynitride film.

As a material for the gate electrode layers 461 and 471, a conductive material that transmits visible light, for example, any of the following metal oxides can be used: an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide. The thickness of the gate electrode layers 461 and 471 is set within the range of 50 nm to 300 nm inclusive. The metal oxide used for the gate electrode layers 461 and 471 is deposited by a sputtering method, a vacuum evaporation method (e.g., an electron beam evaporation method), an arc discharge ion plating method, or a spray method. When a sputtering method is employed, it is preferable that deposition be performed using a target containing $SiO_2$ of 2 wt % to 10 wt % inclusive and SiOx (x>0) which inhibits crystallization be contained in the light-transmitting conductive film which is formed so as to prevent crystallization at the time of the heat treatment for dehydration or dehydrogenation in a later step.

Then, the resist mask is removed, and a gate insulating layer is formed over the gate electrode layers 461 and 471.

The gate insulating layer can be formed with a single layer or a stack using one or more of a silicon oxide layer, a silicon nitride layer, a silicon oxynitride layer, and a silicon nitride oxide layer by a plasma CVD method, a sputtering method, or the like. For example, when a silicon oxynitride layer is formed, it may be formed using $SiH_4$, oxygen, and nitrogen as deposition gases by a plasma CVD method.

In this embodiment, the gate insulating layer is a stack of the first gate insulating layer 452a with a thickness of 50 nm to 200 nm inclusive and the second gate insulating layer 452b with a thickness of 50 nm to 300 nm inclusive. As the first gate insulating layer 452a, a 100-nm-thick silicon nitride film or silicon nitride oxide film is used. As the second gate insulating layer 452b, a 100-nm-thick silicon oxide film is used.

Figure 38A:
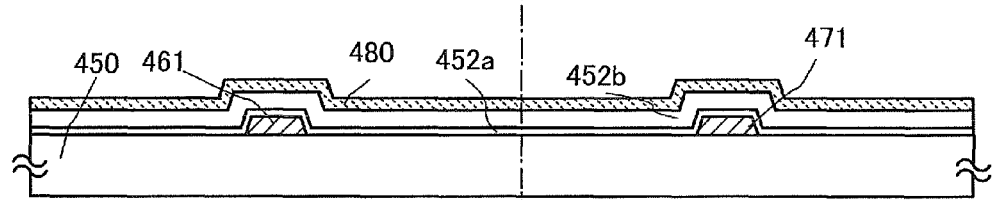
FIGS. 38A to 38E illustrate a method for manufacturing a semiconductor device.
Figure 38B:
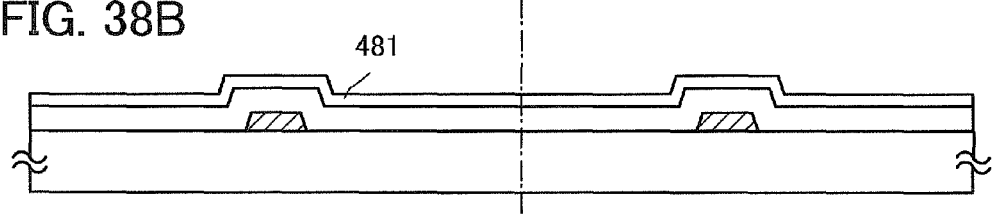

An oxide semiconductor film 480 with a thickness of 2 nm to 200 nm inclusive is formed over the second gate insulating layer 452b (see FIG. 38A). The oxide semiconductor film 480 preferably has a thickness of less than or equal to 50 nm such that oxide semiconductor layers formed later are in an amorphous state even when heat treatment for dehydration or dehydrogenation are performed after the oxide semiconductor film 480 is formed. The small thickness of the oxide semiconductor film 480 can prevent the oxide semiconductor layers formed later from being crystallized when heat treatment is performed after the formation of the oxide semiconductor film 480.

Note that before the oxide semiconductor film 480 is formed by a sputtering method, dust attached to a surface of the second gate insulating layer 452b is preferably removed by reverse sputtering in which plasma is generated by introduction of an argon gas.

As the oxide semiconductor film 480, an In—Ga—Zn—O-based non-single-crystal film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 480 is formed by a sputtering method with the use of an In—Ga—Zn—O-based oxide semiconductor target. Alternatively, the oxide semiconductor film 480 can be formed by a sputtering method in a rare gas (typically argon) atmosphere, an oxygen atmosphere, or an atmosphere containing a rare gas (typically argon) and oxygen. When a sputtering method is employed, it is preferable that deposition of the oxide semiconductor film 480 be performed using a target containing $SiO_2$ of 2 wt % to 10 wt % inclusive and SiOx (x>0) which inhibits crystallization be contained in the oxide semiconductor film 480 so as to prevent crystallization of the oxide semiconductor layer formed later at the time of the heat treatment for dehydration or dehydrogenation in a later step.

Then, the oxide semiconductor film 480 is subjected to dehydration or dehydrogenation. The temperature of first heat treatment for dehydration or dehydrogenation is greater than or equal to 350° C. and less than the strain point of the substrate, preferably greater than or equal to 400° C. Here, the substrate 450 over which the oxide semiconductor film 480 is formed is put in an electric furnace which is a kind of heat treatment apparatus and heat treatment is performed on the oxide semiconductor film 480 in a nitrogen atmosphere, and then, cooling is performed without exposure to the air, and water or hydrogen are prevented from being mixed into the oxide semiconductor film 480 again; thus, an oxide semiconductor film 481 is obtained (see FIG. 38B). In this embodiment, the same furnace is used from the heat temperature T at which the oxide semiconductor film 480 is subjected to dehydration or dehydrogenation to a temperature low enough to prevent water from entering again; specifically, slow cooling is performed in a nitrogen atmosphere until the temperature drops by 100° C. or more from the heat temperature T. Moreover, without limitation to a nitrogen atmosphere, dehydration or dehydrogenation may be performed in a rare gas atmosphere (e.g., helium, neon, or argon) or under reduced pressure.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

In some cases, the oxide semiconductor layer is crystallized to be a microcrystalline layer or a polycrystalline layer depending on the conditions of the first heat treatment or the material of the oxide semiconductor film 480.

In addition, the first heat treatment can also be performed on island-like oxide semiconductor layers which have been processed from the oxide semiconductor film.

In addition, before the oxide semiconductor film 480 is formed, heat treatment (at greater than or equal to 400° C. and less than the strain point of the substrate) may be performed in an inert gas atmosphere (nitrogen or a rare gas such as helium, neon, or argon), an oxygen atmosphere, or under reduced pressure, thereby removing impurities such as hydrogen and water contained in the gate insulating layers.

Then, an oxide conductive film and a metal conductive film are sequentially formed over the oxide semiconductor film 481.

As a material of the oxide conductive film, a conductive material that transmits visible light, for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed. The thickness of the oxide conductive film is selected as appropriate in the range of 50 nm to 300 nm inclusive. As a deposition method of the oxide conductive film, a sputtering method, a vacuum evaporation method (e.g., an electron beam evaporation method), an arc discharge ion plating method, or a spray method is used. When a sputtering method is employed, it is preferable that deposition be performed using a target containing $SiO_2$ of 2 wt % to 10 wt % inclusive and $SiO_x$ (x>0) which inhibits crystallization be contained in the light-transmitting conductive film so as to prevent crystallization of oxide conductive layers 442 and 447 which are formed later at the time of the heat treatment for dehydration or dehydrogenation in a later step.

Examples of the material for the metal conductive film are an element selected from Al, Cr, Cu, Ta, Ti, Mo, and W; an alloy containing any of these elements as a component; and an alloy containing these elements in combination.

As the metal conductive film, a three-layer stack film including a titanium film, an aluminum film provided over the titanium film, and a titanium film provided over the aluminum film, or a three-layer stack film including a molybdenum film, an aluminum film provided over the molybdenum film, and a molybdenum film provided over the aluminum film is preferably used. Of course, a single layer film, a two-layer stack film, or a stack film of four or more layers may also be used as the metal conductive film.

After the oxide conductive film and the metal conductive film are formed, resist masks 482a and 482b are formed through a second photolithography process. Note that the resist masks 482a and 482b may be formed by an ink jet method. A photomask is not used when the resist masks 482a and 482b are formed by an ink jet method, which results in reducing manufacturing costs.

The resist mask 482a and the resist mask 482b in this embodiment are each a resist mask having a depression portion or a projection portion. In other words, such a resist mask can also be referred to as a resist mask including a plurality of regions (here, two regions) having different thicknesses. In the resist mask 482a or 482b, a thick region is called a projection portion and a thin region is called a depression portion.

In each of the resist masks 482a and 482b, the projection portion is formed in a region where source and drain electrode layers are formed later, and the depression portion is formed in a region which is to be a channel formation region between the source electrode layer and the drain electrode layer.

The resist masks 482a and 482b can be formed using a multi-tone mask. The multi-tone mask is a mask capable of light exposure with multi-level light intensity, and typically, light exposure is performed with three levels of light intensity to provide an exposed region, a half-exposed region, and an unexposed region. By one light exposure and development step with the use of a multi-tone mask, a resist mask with plural thicknesses (typically, two kinds of thicknesses) can be formed. Therefore, by the usage of a multi-tone mask, the number of photomasks can be reduced.

By light exposure using the multi-tone mask and development, the resist masks 482a and 482b each of which has regions having different thicknesses can be formed. Note that without limitation thereto, the resist masks 482a and 482b may be formed without a multi-tone mask.

Figure 38C:
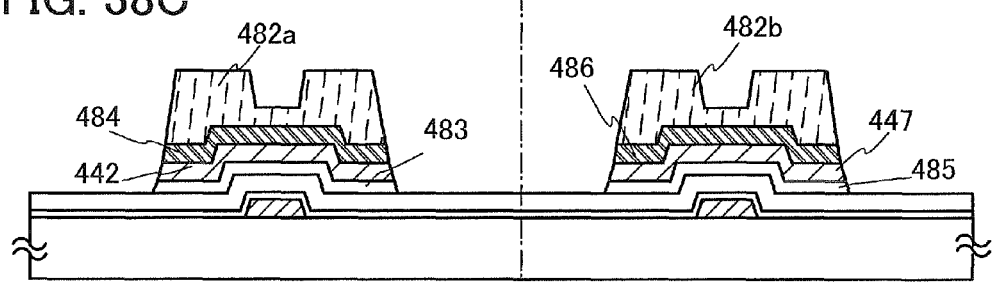

Next, by using the resist masks 482a and 482b, the metal conductive film, the oxide conductive film, and the oxide semiconductor film 481 are selectively and concurrently etched, whereby island-like oxide semiconductor layers 483 and 485, oxide conductive layers 442 and 447, and conductive layers 484 and 486 are formed (see FIG. 38C). When a stack conductive film including a titanium film, an aluminum film, and a titanium film is used as the conductive film, etching can be performed by a dry etching method with the use of a chlorine gas.

Next, resist masks 487a and 487b are formed by reducing (downsizing) the resist masks 482a and 482b. In order to reduce (downsize) the resist masks, ashing using oxygen plasma or the like may be performed. When the resist masks are reduced (downsized), part of the conductive layers 484 and 486 are exposed.

Figure 38D:
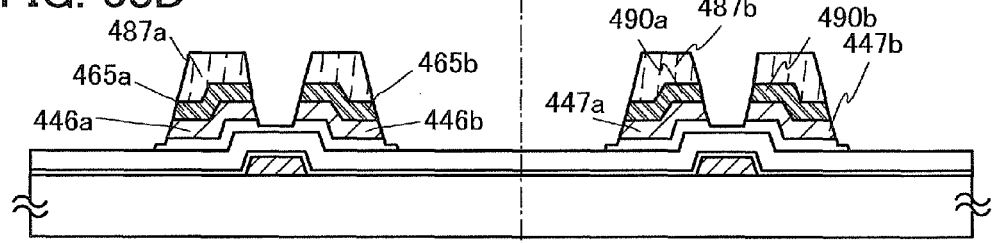
Figure 38E:
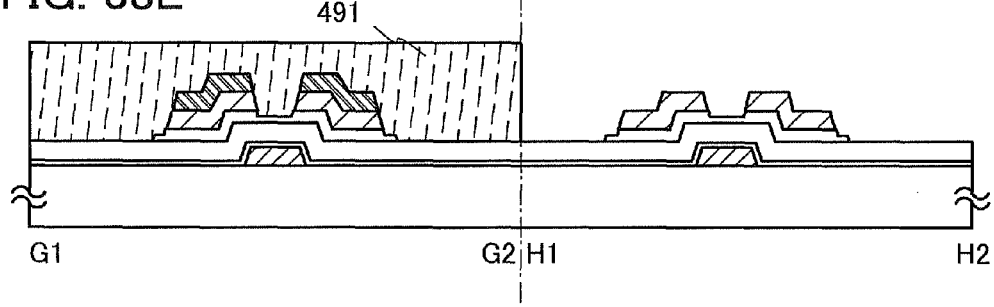

Next, selective etching is performed using the resist masks 487a and 487b, whereby a source electrode layer 465a, a drain electrode layer 465b, a low-resistance drain region 446a, a low-resistance drain region 446b, a source electrode layer 447a, a drain electrode layer 447b, a conductive layer 490a, and a conductive layer 490b are formed (see FIG. 38D). Note that, as for the oxide semiconductor layers 483 and 485, only part thereof are etched away at this time and oxide semiconductor layers each having a groove (a depression portion) are obtained.

Note that as illustrated in FIG. 38D, by etching using the resist masks 487a and 487b obtained by reducing (downsizing) the resist masks 482a and 482b, thin regions are formed at the edge portions of the oxide semiconductor layers 483 and 485. That is, the end portions of the oxide semiconductor layer 483 extend beyond the end portions of the low-resistance drain regions 408a and 408b, and the end portions of the oxide semiconductor layer 485 extend beyond the end portions of the source and drain electrode layers 447a and 447b. Note that the edge portions of the oxide semiconductor layer 483 have the same thickness as that at the groove (depression portion) of the oxide semiconductor layer 483 which is to be a channel formation region. In addition, the edge portions of the oxide semiconductor layer 485 have the same thickness as that at the groove (depression portion) of the oxide semiconductor layer 485 which is to be a channel formation region.

Note that in this etching process, etching conditions may be set as appropriate such that the oxide semiconductor layers 483 and 485 in lower layers can remain. For example, the etching time may be controlled.

In addition, a material for forming the oxide semiconductor layers 483 and 485 and a material for forming the oxide conductive layers 442 and 447 each preferably has a high etching selectivity ratio with respect to other materials. For example, a metal oxide material containing Sn (e.g., $SnZnO_x$ (x>0), $SnGaZnO_x$, or the like) may be used for the material for the oxide semiconductor layers 483 and 485, and ITO or the like may be used for the material for the oxide conductive layers 442 and 447.

Then, the resist masks 487a and 487b are removed, and a resist mask 491 is formed through a third photolithography process. Then, selective etching is performed, whereby the conductive layers 490a and 490b are removed (see FIG. 38E).

Since the conductive layers which overlap with the source electrode layer 447a and the drain electrode layer 447b are selectively removed through the third photolithography process, materials of the oxide semiconductor layer 432, the source electrode layer 447a, and the drain electrode layer 447b and etching conditions are adjusted as appropriate so that they are not removed in the etching of the conductive layers.

An oxide insulating layer 466 serving as a protective insulating film is formed in contact with the grooves (the depression portions) in the oxide semiconductor layers 483 and 485.

The oxide insulating layer 466 has a thickness of at least 1 nm and can be formed by a method by which impurities such as water or hydrogen are not mixed into the oxide insulating layer 466, such as a sputtering method, as appropriate. In this embodiment, a 300-nm-thick silicon oxide film is formed as the oxide insulating layer 466 by a sputtering method. The substrate temperature at the film formation may be in the range of room temperature to 300° C. inclusive, and is 100° C. in this embodiment. The silicon oxide film can be deposited by a sputtering method in a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed using a silicon target in an atmosphere containing oxygen and nitrogen by a sputtering method. The oxide insulating layer 466 which is formed in contact with the oxide semiconductor layers in regions whose resistance is reduced is formed using an inorganic insulating film that does not contain impurities such as moisture, a hydrogen ion, and OW and blocks entry of such impurities from the outside, typically a silicon oxide film, a silicon nitride oxide film, an aluminum oxide film, or an aluminum oxynitride film.

Figure 39A:
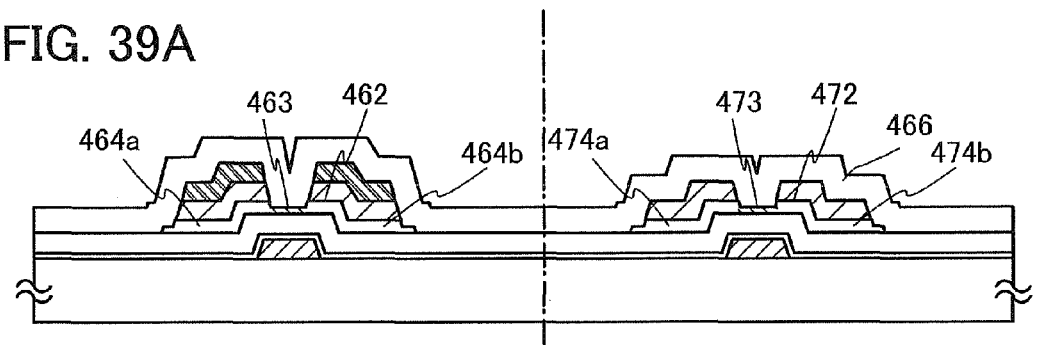
FIGS. 39A to 39C illustrate a method for manufacturing a semiconductor device.

Next, second heat treatment (preferably 200° C. to 400° C. inclusive, e.g., 250° C. to 350° C. inclusive) is performed (see FIG. 39A). For example, the second heat treatment is performed in a nitrogen atmosphere at 250° C. for one hour. With the second heat treatment, heat is applied while the grooves in the oxide semiconductor layers 483 and 485 are in contact with the oxide insulating layer 466.

Through the above process, the oxide semiconductor layer is converted to a high-resistance drain region (an HRN region), and part of the high-resistance drain region is made to be in an oxygen-excess state selectively. As a result, the channel formation region 463 overlapping with the gate electrode layer 461 becomes i-type, and the channel formation region 473 overlapping with the gate electrode layer 471 becomes i-type. Further, the high-resistance drain region 464a overlapping with the source electrode layer 465a, and the high-resistance drain region 464b overlapping with the drain electrode layer 465b are formed in a self-aligned manner, and the high-resistance drain region 474a overlapping with the source electrode layer 447a and the high-resistance drain region 474b overlapping with the drain electrode layer 447b are formed in a self-aligned manner.

Note that the high-resistance drain region 464b (or the high-resistance drain region 464a) is formed in the oxide semiconductor layer overlapping with the drain electrode layer 465b (or the source electrode layer 465a), so that the reliability of the driver circuit formed can be increased. Specifically, with the formation of the high-resistance drain region 464b, the conductivity can be gradually varied from the drain electrode layer 465b to the high-resistance drain region 464b and the channel formation region. Thus, when the transistor is operated while the drain electrode layer 465b is connected to a wiring that supplies a high power supply potential VDD, even when a high electric field is applied between the gate electrode layer 461 and the drain electrode layer 465b, the high-resistance drain region 474b serves as a buffer and the high electric field is not applied locally, so that the transistor can have increased withstand voltage.

When the high-resistance drain region 464b (or the high-resistance drain region 464a) is formed in the oxide semiconductor layer overlapping with the drain electrode layer 465b (or the source electrode layer 465a), the amount of leakage current in the channel formation region 463 in a driver circuit formed can be reduced.

Note that the high-resistance drain region 474b (or the high-resistance drain region 474a) is formed in the oxide semiconductor layer overlapping with the drain electrode layer 447b (or the source electrode layer 447a), so that the reliability of the pixel formed can be increased. Specifically, with the formation of the high-resistance drain region 474b, the conductivity can be gradually varied from the drain electrode layer 447b to the high-resistance drain region 474b and the channel formation region. Thus, when the transistor is operated while the drain electrode layer 447b is connected to a wiring that supplies a high power supply potential VDD, even when a high electric field is applied between the gate electrode layer 471 and the drain electrode layer 447b, the high-resistance drain region 474b serves as a buffer and the high electric field is not applied locally, so that the transistor can have increased withstand voltage.

When the high-resistance drain region 474b (or the high-resistance drain region 474a) is formed in the oxide semiconductor layer overlapping with the drain electrode layer 447b (or the source electrode layer 447a), the amount of leakage current in the channel formation region 473 in the pixel formed can be reduced.

Next, a protective insulating layer 453 is formed over the oxide insulating layer 466. In this embodiment, a silicon nitride film is formed by an RF sputtering method. Since an RF sputtering method has high productivity, it is preferably used as a deposition method of the protective insulating layer 453. An inorganic insulating film which does not contain impurities such as moisture, a hydrogen ion, and OW and blocks entry of such impurities from the outside is used to form the protective insulating layer 453, and a silicon nitride film, an aluminum nitride film, silicon nitride oxide film, an aluminum oxynitride film, or the like is used. Needless to say, the protective insulating layer 453 is a light-transmitting insulating film.

The protective insulating layer 453 is preferably in contact with the first gate insulating layer 452a or an insulating film serving as a base provided below the protective insulating layer 453, and blocks entry of impurities such as moisture, a hydrogen ion, and OH⁻ from the vicinity of a side surface of the substrate. It is particularly effective to use a silicon nitride film as the first gate insulating layer 452a or the insulating film serving as the base, which is in contact with the protective insulating layer 453. In other words, a silicon nitride film provided so as to surround a bottom surface, a top surface, and a side surface of the oxide semiconductor layer increases the reliability of the display device.

Next, a planarization insulating layer 454 is formed over the protective insulating layer 453. The planarization insulating layer 454 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer 454 may be formed by stacking a plurality of insulating films formed from these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 454. The planarization insulating layer 454 can be formed, depending on the material, by a method such as a sputtering method, an SOG method, a spin coating method, a dipping method, a spray coating method, or a droplet discharge method (e.g., an ink jet method, screen printing, or offset printing), or a tool such as a doctor knife, a roll coater, a curtain coater, or a knife coater.

Figure 39B:
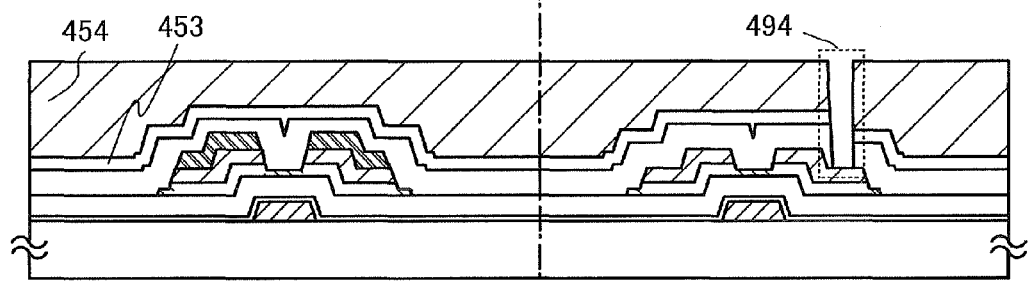

Then, a fourth photolithography process is performed so that a resist mask is formed and a contact hole 494 that reaches the drain electrode layer 447b is formed by etching of the planarization insulating layer 454, the protective insulating layer 453, and the oxide insulating layer 466 (see FIG. 39B). Moreover, contact holes that reach the gate electrode layers 461 and 471 are also formed with that etching. Alternatively, a resist mask for forming the contact hole that reaches the drain electrode layer 447b may be formed by an ink jet method. A photomask is not used when the resist mask is formed by an ink-jet method, which results in reducing manufacturing costs.

Next, the resist mask is removed and then a light-transmitting conductive film is formed. The light-transmitting conductive film can be formed from indium oxide ($In_2O_3$), an alloy of indium oxide and tin oxide ($In_2O_3$—$SnO_2$, abbreviated to ITO), or the like by a sputtering method, a vacuum evaporation method, or the like. As another material for the light-transmitting conductive film, an Al—Zn—O-based non-single-crystal film containing nitrogen (i.e., an Al—Zn—O—N-based non-single-crystal film), a Zn—O-based non-single-crystal film containing nitrogen, or an Sn—Zn—O-based non-single-crystal film containing nitrogen may be used. Note that the percentage (at. %) of zinc in the Al—Zn—O—N-based non-single-crystal film is less than or equal to 47 at. % and is higher than that of aluminum in the non-single-crystal film; the percentage (at. %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide and zinc oxide ($In_2O_3$—ZnO) may be used to improve etching processability.

Figure 39C:
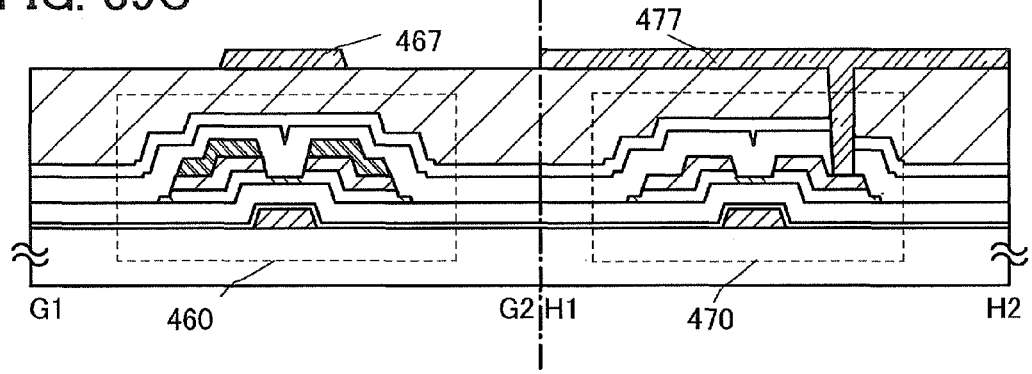

Next, a fifth photolithography process is performed so that a resist mask is formed, and unnecessary portions are removed by etching to form a pixel electrode layer 477 and a conductive layer 467 (see FIG. 39C).

Through the above-described steps, the thin film transistor 460 and the thin film transistor 470 can be separately formed in the driver circuit and the pixel portion, respectively, over the same substrate with the use of five masks. The thin film transistor 460 for the driver circuit is a channel-etched thin film transistor including the oxide semiconductor layer 462 having the high-resistance drain region 464a, the high-resistance drain region 464b, and the channel formation region 463. The thin film transistor 470 for the pixel is a channel-etched thin film transistor including the oxide semiconductor layer 472 having the high-resistance drain region 474a, the high-resistance drain region 474b, and the channel formation region 473. Even when a high electric field is applied, the high-resistance drain region serves as a buffer and the high electric field is not applied locally, so that the thin film transistors 460 and 470 can have high withstand voltage.

In addition, a storage capacitor that is constituted by a capacitor wiring and a capacitor electrode with the first gate insulating layer 452a and the second gate insulating layer 452b as dielectrics can be formed over the same substrate. The thin film transistors 470 and storage capacitors are arranged in matrix to correspond to individual pixels so that a pixel portion is formed, and a driver circuit including the thin film transistor 460 is arranged around the pixel portion, whereby one of the substrates for manufacturing an active matrix display device can be obtained.

The pixel electrode layer 477 is electrically connected to the capacitor electrode layer through a contact hole formed in the planarization insulating layer 454, the protective insulating layer 453, and the oxide insulating layer 466. Note that the capacitor electrode layer can be formed from the same material in the same step as the source electrode layer 447a and the drain electrode layer 447b.

The conductive layer 467 is provided so as to overlap with the channel formation region 463 in the oxide semiconductor layer, whereby the amount of change in threshold voltage of the thin film transistor 460 before and after a bias-temperature stress test (referred to as a BT test) for examining the reliability of a thin film transistor can be reduced. A potential of the conductive layer 467 may be the same as or different from that of the gate electrode layer 461. The conductive layer 467 can also function as a second gate electrode layer. In addition, the potential of the conductive layer 467 may be placed in a GND state or a state of 0V, or the conductive layer 467 may be placed in a floating state.

Note that the resist mask for forming the pixel electrode layer 477 and the conductive layer 467 may be formed by an ink jet method. A photomask is not used when the resist mask is formed by an ink jet method, which results in reducing manufacturing costs.

(Embodiment 5)

Figure 40A:
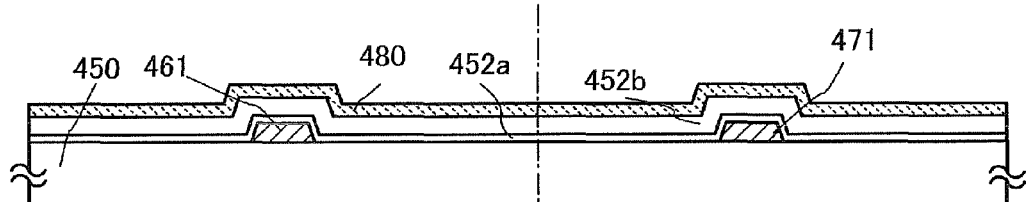
FIGS. 40A to 40C illustrate a method for manufacturing a semiconductor device.
Figure 40B:
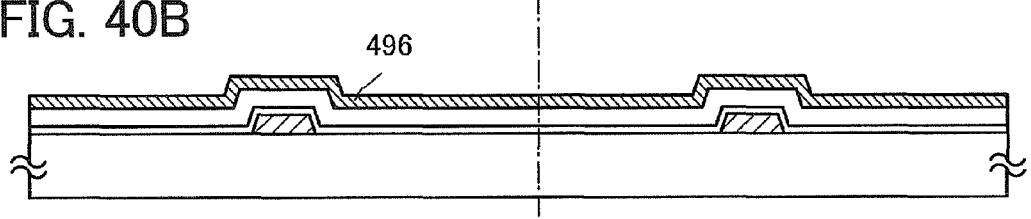
Figure 40C:
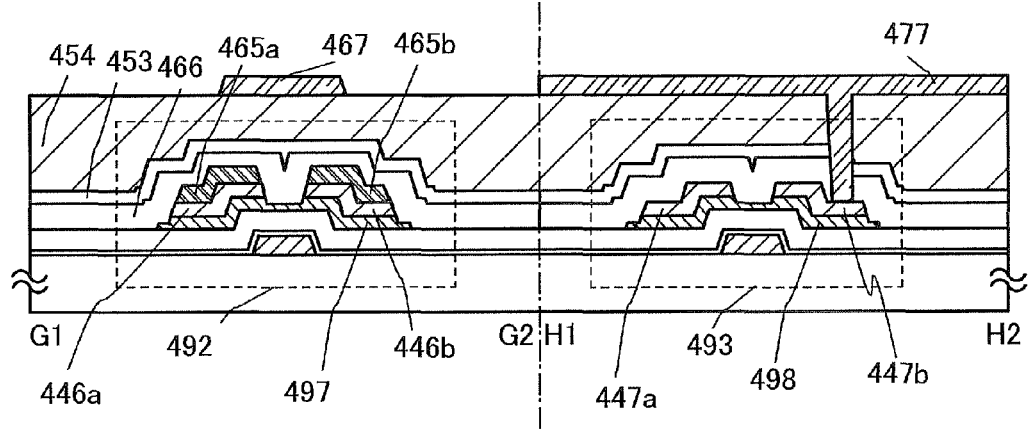

In this embodiment, an example where the first heat treatment is different from that in Embodiment 4 is illustrated in FIGS. 40A to 40C. Since FIGS. 40A to 40C are the same as FIGS. 6A1 to 39C except for part of the steps, the same reference numerals are used for the same portions and detailed description of the same portions is not repeated.

FIGS. 40A to 40C are cross-sectional views illustrating a process for manufacturing two thin film transistors.

First, according to Embodiment 4, a light-transmitting conductive film is formed over a substrate 450 having an insulating surface. Then, a resist mask is formed over the conductive film through a first photolithography process and selective etching is performed using the resist mask, whereby gate electrode layers 461 and 471 are formed.

Next, a stack of a first gate insulating layer 452a and a second gate insulating layer 452b is formed over the gate electrode layers 461 and 471.

Then, an oxide semiconductor film 480 with a thickness of 2 nm to 200 nm inclusive is formed over the second gate insulating layer 452b (see FIG. 40A). Note that the steps so far are the same as the steps in Embodiment 4; FIG. 40A corresponds to FIG. 38A.

Next, the oxide semiconductor film is subjected to dehydration or dehydrogenation in an inert gas atmosphere or under reduced pressure. The temperature of first heat treatment for dehydration or dehydrogenation is greater than or equal to 350° C. and less than the strain point of the substrate, preferably greater than or equal to 400° C. Here, after the substrate is put in an electric furnace which is a kind of heat treatment apparatus and heat treatment is performed on the oxide semiconductor film in a nitrogen atmosphere, cooling is performed without exposure to the air, and water or hydrogen are prevented from being mixed into the oxide semiconductor film again; thus, the oxide semiconductor film is changed into an oxygen-deficient oxide semiconductor film so as to be a low-resistance oxide semiconductor film, i.e., an n-type ($n^-$-type or $n^+$-type) oxide semiconductor film. After that, cooling is performed by introducing a high-purity oxygen gas or a high-purity $N_2O$ gas into the same furnace. It is preferable that water, hydrogen, and the like be not contained in an oxygen gas or a $N_2O$ gas. Alternatively, the purity of an oxygen gas or a $N_2O$ gas which is introduced into the heat treatment apparatus is preferably greater than or equal to 6 N (99.9999%), more preferably greater than or equal to 7 N (99.99999%) (i.e., the impurity concentration of the oxygen gas or the N₂O gas is preferably less than or equal to 1 ppm, more preferably less than or equal to 0.1 ppm).

Moreover, after the first heat treatment for dehydration or dehydrogenation, heat treatment may be performed at 200° C. to 400° C. inclusive, preferably 200° C. to 300° C. inclusive, in an oxygen gas, an N₂O gas atmosphere, or an ultra-dry air (with a dew point of less than or equal to −40° C., preferably less than or equal to −60° C.) atmosphere.

The entire oxide semiconductor film is made to contain an excess amount of oxygen through the above steps; thus, an oxide semiconductor film 496 with increased resistance, that is, an i-type oxide semiconductor film 496 is obtained (see FIG. 40B). As a result, reliability of the thin film transistor to be completed later can be improved.

In this embodiment, an example in which dehydration or dehydrogenation are performed after the oxide semiconductor film is formed is shown, but this embodiment is not limited thereto. The first heat treatment may also be performed on island-like oxide semiconductor layers which have been processed from the oxide semiconductor film as in Embodiment 4.

In addition, the oxide semiconductor film is dehydrated or dehydrogenated in an inert gas atmosphere or under reduced pressure and cooled in an inert gas atmosphere. Then, the oxide semiconductor film is processed into island-like oxide semiconductor layers through a photolithography process. After that, heat treatment may be performed at 200° C. to 400° C. inclusive, preferably 200° C. to 300° C. inclusive, in an oxygen gas atmosphere, an N₂O gas atmosphere, or an ultra-dry air (with a dew point of less than or equal to −40° C., preferably less than or equal to −60° C.) atmosphere.

In addition, before the oxide semiconductor film is formed, heat treatment (at greater than or equal to 400° C. and less than the strain point of the substrate) may be performed in an inert gas atmosphere (nitrogen, or helium, neon, argon, or the like), an oxygen atmosphere, an ultra-dry air (with a dew point of less than or equal to −40° C., preferably less than or equal to −60° C.) atmosphere, or under reduced pressure, thereby removing impurities such as hydrogen and water contained in the gate insulating layers.

Then, the oxide semiconductor film 496 is processed into the island-like oxide semiconductor layers 497 and 498 through a second photolithography process.

After that, as in FIGS. 38C, 38D, and 38E, and FIGS. 39A, 39B, and 39C of Embodiment 4, in the peripheral driver circuit portion, the oxide semiconductor layer 497 is only partly etched away to form an oxide semiconductor layer having a groove (a depression portion), low-resistance drain regions 446*a* and 446*b* in contact with the oxide semiconductor layer 497 are formed, a source electrode layer 465*a* and a drain electrode layer 465*b* which are metal conductive layers and in contact with the low-resistance drain regions 446*a* and 446*b* respectively are formed, and an oxide insulating layer 466 in contact with part of the oxide semiconductor layer 497 is formed, whereby a thin film transistor 492 for the driver circuit is manufactured. Meanwhile, in the pixel portion, a source electrode layer 447*a* and a drain electrode layer 447*b* which are light-transmitting conductive layers and in contact with the oxide semiconductor layer 498 are formed, and the oxide insulating layer 466 in contact with part of the oxide semiconductor layer 498 is formed, whereby a thin film transistor 493 for the pixel is manufactured.

Next, second heat treatment (preferably 200° C. to 400° C. inclusive, for example, 250° C. to 350° C. inclusive) is performed in an inert gas atmosphere or an oxygen gas atmosphere. For example, the second heat treatment is performed at 250° C. for one hour in a nitrogen atmosphere.

Then, a protective insulating layer 453 and a planarization insulating layer 454 are stacked so as to cover the thin film transistors 492 and 493 and to be in contact with the oxide insulating layer 466. A contact hole that reaches the drain electrode layer 447*b* is formed in the protective insulating layer 453 and the planarization insulating layer 454, and a light-transmitting conductive film is formed in the contact hole and over the planarization insulating layer 454. The light-transmitting conductive film is selectively etched to form a conductive layer 467 and a pixel electrode layer 477 electrically connected to the thin film transistor 493 (see FIG. 40C).

Through the above-described steps, the thin film transistor 492 and the thin film transistor 493 in each of which the entire oxide semiconductor layer is i-type can be separately formed in the driver circuit and the pixel portion, respectively, over the same substrate with the use of five masks. The thin film transistor 492 for the driver circuit is a channel-etched thin film transistor including the oxide semiconductor layer 497 which is entirely i-type. The thin film transistor 493 for the pixel is a channel-etched thin film transistor including the oxide semiconductor layer 498 which is entirely i-type.

In addition, a storage capacitor that is constituted by a capacitor wiring layer and a capacitor electrode with the first gate insulating layer 452*a* and the second gate insulating layer 452*b* as dielectrics can be formed over the same substrate. The thin film transistors 493 and storage capacitors are arranged in matrix so as to correspond to individual pixels so that a pixel portion is formed, and a driver circuit including the thin film transistor 492 is arranged around the pixel portion, whereby one of the substrates for manufacturing an active matrix display device can be obtained.

The conductive layer 467 is provided so as to overlap with a channel formation region in the oxide semiconductor layer 497, whereby the amount of change in threshold voltage of the thin film transistor 449 before and after a bias-temperature stress test (referred to as a BT test) for examining the reliability of a thin film transistor can be reduced. A potential of the conductive layer 467 may be the same as or different from that of the gate electrode layer 461. The conductive layer 467 can also function as a second gate electrode layer. In addition, the potential of the conductive layer 467 may be placed in a GND state or a state of 0V, or the conductive layer 467 may be placed in a floating state.

(Embodiment 6)

This embodiment will show an example in which an active matrix liquid crystal display device is manufactured with the active matrix substrate described in Embodiment 1. Note that this embodiment can also be applied to any of the active matrix substrates described in Embodiments 2 to 5.

FIG. 7A illustrates an example of a cross-sectional structure of the active matrix substrate.

The thin film transistor arranged in the driver circuit and the thin film transistor arranged in the pixel portion over one substrate are shown in Embodiment 1; in this embodiment, a storage capacitor, a gate wiring, and a terminal portion of a source wiring are also shown in addition to these thin film transistors. The capacitor, the gate wiring, and the terminal portion of the source wiring can be formed in the same manufacturing steps as in Embodiment 1 and can be manufactured without an increase in the number of photomasks and an increase in the number of steps. Moreover, in a portion to serve as a display region in the pixel portion, all the gate wiring, the source wiring, and a capacitor wiring layer are formed from a light-transmitting conductive film, resulting in a high aperture ratio. Furthermore, a metal wiring can be used for the source wiring layer in a portion that is not the display region in order to reduce the wiring resistance.

In FIG. 7A, a thin film transistor 210 is a channel-etched thin film transistor arranged in a driver circuit, and a thin film transistor 220 electrically connected to a pixel electrode layer 227 is a channel-etched thin film transistor arranged in a pixel portion.

In this embodiment, the thin film transistor 220 formed over a substrate 200 has the same structure as the thin film transistor 410 in Embodiment 1.

A capacitor wiring layer 230 which is formed from the same light-transmitting material and in the same step as a gate electrode layer of the thin film transistor 220 overlaps with a capacitor electrode layer 231, with a first gate insulating layer 202a and a second gate insulating layer 202b serving as dielectrics placed therebetween; thus, a storage capacitor is formed. The capacitor electrode layer 231 is formed from the same light-transmitting material and in the same step as a source electrode layer or a drain electrode layer of the thin film transistor 220. Since the storage capacitor as well as the thin film transistor 220 has a light-transmitting property, the aperture ratio can be increased.

The light-transmitting property of the storage capacitor is important in increasing the aperture ratio. For small liquid crystal display panels of 10 inches or smaller in particular, even when the size of pixels is decreased in order to realize higher resolution of display images by increasing the number of gate wirings, for example, a high aperture ratio can be achieved. Moreover, by using a light-transmitting film for components in the thin film transistor 220 and the storage capacitor, a high aperture ratio can be achieved even when one pixel is divided into a plurality of sub-pixels in order to realize a wide viewing angle. That is, a high aperture ratio can be maintained even when a group of high-density thin film transistors is arranged, and the display region can have a sufficient area. For example, when one pixel includes two to four sub-pixels and storage capacitors, since the storage capacitors as well as the thin film transistors have a light-transmitting property, the aperture ratio can be increased.

Note that the storage capacitor is provided below the pixel electrode layer 227, and the capacitor electrode layer 231 is electrically connected to the pixel electrode layer 227.

This embodiment shows the example in which the storage capacitor is constituted by the capacitor electrode layer 231 and the capacitor wiring layer 230; however, there is no particular limitation on the structure of the storage capacitor. For example, a storage capacitor may be formed in such a manner that, without providing a capacitor wiring layer, a pixel electrode layer overlaps with a gate wiring in an adjacent pixel with a planarization insulating layer, a protective insulating layer, a first gate insulating layer, and a second gate insulating layer placed therebetween.

A plurality of gate wirings, source wirings, and capacitor wiring layers are provided in accordance with the pixel density. In the terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. There is no particular limitation on the number of each of the terminal electrodes, and the number of the terminals can be determined by a practitioner as appropriate.

In the terminal portion, the first terminal electrode which has the same potential as the gate wiring can be formed from the same light-transmitting material as the pixel electrode layer 227. The first terminal electrode is electrically connected to the gate wiring through a contact hole that reaches the gate wiring. The contact hole that reaches the gate wiring is formed by selective etching of a planarization insulating layer 204, a protective insulating layer 203, an oxide insulating layer 216, the second gate insulating layer 202b, and the first gate insulating layer 202a with the use of a photomask for forming a contact hole for electrically connecting the drain electrode layer of the thin film transistor 220 and the pixel electrode layer 227.

A gate electrode layer of the thin film transistor 210 arranged in the driver circuit may be electrically connected to a conductive layer 217 provided above an oxide semiconductor layer. In that case, a contact hole is formed by selective etching of the planarization insulating layer 204, the protective insulating layer 203, the oxide insulating layer 216, the second gate insulating layer 202b, and the first gate insulating layer 202a with the use of the photomask for forming the contact hole for electrically connecting the drain electrode layer of the thin film transistor 220 and the pixel electrode layer 227. The conductive layer 217 and the gate electrode layer of the thin film transistor 210 arranged in the driver circuit are electrically connected through the contact hole.

A second terminal electrode 235 which has the same potential as a source wiring (a source wiring 234a to a source wiring 234c) in the driver circuit can be formed from the same light-transmitting material as the pixel electrode layer 227. The second terminal electrode 235 is electrically connected to the source wiring in the driver circuit through a contact hole that reaches the source wiring. The source wiring in the driver circuit is a metal wiring, is formed from the same material and in the same step as a source electrode layer of the thin film transistor 210, and has the same potential as the source electrode layer of the thin film transistor 210.

The third terminal electrode which has the same potential as the capacitor wiring layer 230 can be formed from the same light-transmitting material as the pixel electrode layer 227. Moreover, a contact hole that reaches the capacitor wiring layer 230 can be formed using the same photomask in the same step as those for forming a contact hole for electrically connecting the capacitor electrode layer 231 and the pixel electrode layer 227.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed to each other. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed from the same light-transmitting material as the pixel electrode layer 227.

There is no particular limitation on the structure in which the source electrode layer of the thin film transistor 220 and the source electrode layer of the thin film transistor 210 are electrically connected to each other; for example, a connection electrode for connecting the source electrode layer of the thin film transistor 220 and the source electrode layer of the thin film transistor 210 may be formed in the same step as the pixel electrode layer 227. Alternatively, in the portion that is not the display region, the source electrode layer of the thin film transistor 220 and the source electrode layer of the thin film transistor 210 may be in contact with each other to overlap with each other.

Note that FIG. 7A illustrates a cross-sectional structure of a gate wiring layer 232 in the driver circuit. Since this embodiment shows an example of a small liquid crystal display panel of less than or equal to 10 inches, the gate wiring layer 232 in the driver circuit is formed from the same light-transmitting material as the gate electrode layer of the thin film transistor 220.

When the same material is used for the gate electrode layer, the source electrode layer, the drain electrode layer, the pixel electrode layer, a different electrode layer, and a different wiring layer, a common sputtering target and a common manufacturing apparatus can be used and the material costs and costs of an etchant (or an etching gas) used for etching can be reduced; thus, manufacturing costs can be reduced.

When a photosensitive resin material is used for the planarization insulating layer 204 in the structure of FIG. 7A, the step for forming a resist mask can be omitted.

FIG. 7B illustrates a cross-sectional structure, part of which is different from the structure in FIG. 7A. FIG. 7B is the same as FIG. 7A except that the planarization insulating layer 204 is not provided; therefore, the same portions are denoted by the same reference numerals and detailed description of the same portions is not repeated. In FIG. 7B, a pixel electrode layer 227, a conductive layer 217, and a second terminal electrode 235 are formed on and in contact with a protective insulating layer 203.

With the structure in FIG. 7B, the step for forming the planarization insulating layer 204 can be omitted.

(Embodiment 7)

This embodiment will show an example in which part of a gate wiring is made from a metal wiring so that the wiring resistance is reduced, because there is a possibility that the resistance of a light-transmitting wiring might become a problem in the case where the size of a liquid crystal display panel exceeds 10 inches and reaches 60 inches and even 120 inches.

Note that in FIG. 8A, the same portions as in FIG. 7A are denoted by the same reference numerals and detailed description of the same portions is not repeated. This embodiment can also be applied to any of the active matrix substrates described in Embodiments 1 to 4.

FIG. 8A illustrates an example in which part of a gate wiring in a driver circuit is made from a metal wiring in contact with a light-transmitting wiring which is the same as a gate electrode layer of a thin film transistor 210. Note that the number of photomasks is larger than that in Embodiment 1 since the metal wiring is formed.

First, a heat-resistance conductive material film (with a thickness of 100 nm to 500 nm inclusive) that can withstand first heat treatment for dehydration or dehydrogenation is formed over a substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed from an element selected from Ta, W, Ti, Mo, Al, and Cu; an alloy containing any of these elements as its component, an alloy containing a combination of any of these elements, or a nitride containing any of these elements as its component. The heat-resistance conductive material film is not limited to a single layer containing the above-described element and may be a stack of two or more layers.

Through a first photolithography process, metal wirings are formed, so that a first metal wiring layer 236 and a second metal wiring layer 237 are formed. An ICP (inductively coupled plasma) etching method is preferably used for etching of the tungsten film and the tantalum nitride film. The films can be etched into a desired tapered shape with an ICP etching method with appropriate adjustment of etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in formation of a light-transmitting conductive film to be formed thereon can be reduced.

Then, after the light-transmitting conductive film is formed, a gate wiring layer 238, a gate electrode layer of the thin film transistor 210, and a gate electrode layer of the thin film transistor 220 are formed through a second photolithography process. The light-transmitting conductive film is formed using any of the conductive materials that transmit visible light described in Embodiment 1.

Note that for example, if there is an interface where the gate wiring layer 238 is in contact with the first metal wiring layer 236 or the second metal wiring layer 237, it is possible that, depending on the material of the light-transmitting conductive film, an oxide film is formed with later heat treatment or the like so that contact resistance is increased. Consequently, the second metal wiring layer 237 is preferably formed from a metal nitride film that prevents oxidation of the first metal wiring layer 236.

Next, a gate insulating layer, an oxide semiconductor layer, and the like are formed in the same step as in Embodiment 1. Subsequent steps are performed according to Embodiment 1 to complete the active matrix substrate.

This embodiment shows an example in which after the formation of a planarization insulating layer 204, the planarization insulating layer in a terminal portion is selectively removed using a photomask. It is preferable that the planarization insulating layer be not placed in the terminal portion so that the terminal portion can be connected to an FPC in a favorable manner.

In FIG. 8A, a second terminal electrode 235 is formed over a protective insulating layer 203. FIG. 8A illustrates the gate wiring layer 238 which overlaps with part of the second metal wiring layer 237; alternatively, the gate wiring layer 238 may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode that has the same potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

FIG. 8B illustrates a cross-sectional structure, part of which is different from the structure in FIG. 8A. FIG. 8B is the same as FIG. 8A except for a material of the gate electrode layer in the thin film transistor in the driver circuit; therefore, the same portions are denoted by the same reference numerals and detailed description of the same portions is not repeated.

FIG. 8B illustrates an example in which the gate electrode layer in the thin film transistor in the driver circuit is made from a metal wiring. In the driver circuit, a material of the gate electrode layer is not limited to a light-transmitting material.

In FIG. 8B, a thin film transistor 240 in the driver circuit includes a gate electrode layer in which a second metal wiring layer 242 is stacked over a first metal wiring layer 241. Note that the first metal wiring layer 241 can be formed from the same material in the same step as the first metal wiring layer 236. Moreover, the second metal wiring layer 242 can be formed from the same material in the same step as the second metal wiring layer 237.

In the case where the first metal wiring layer 241 is electrically connected to a conductive layer 217, it is preferable to use a metal nitride film as the second metal wiring layer 242 for preventing oxidation of the first metal wiring layer 241.

In this embodiment, metal wirings are used for some wirings so that the wiring resistance is reduced; high resolution of display images is achieved and a high aperture ratio can be realized even when the size of a liquid crystal display panel reaches 10 inches and reaches 60 inches and even 120 inches.

(Embodiment 8)

Figure 9A:
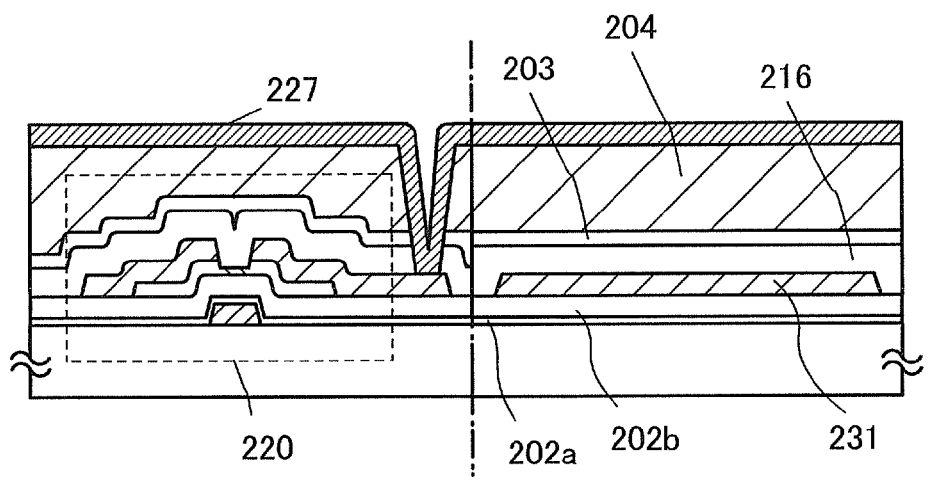
FIGS. 9A and 9B illustrate a semiconductor device.
Figure 9B:
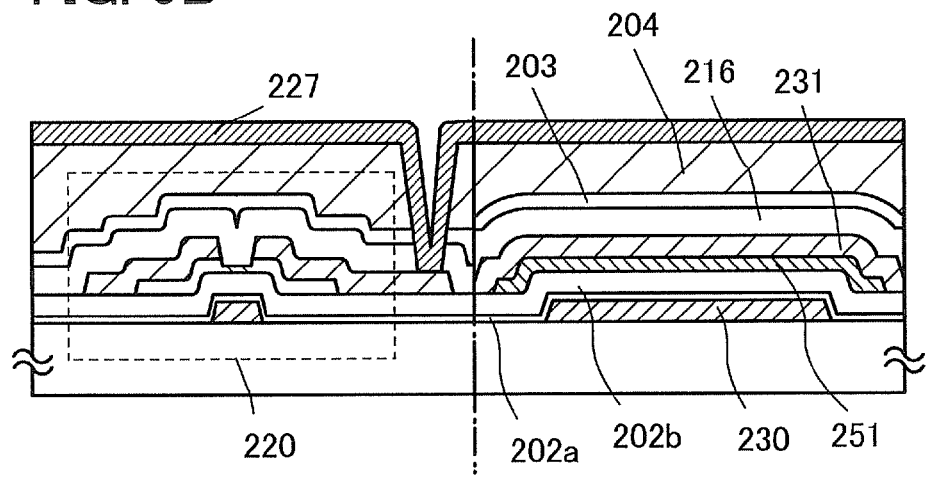

In this embodiment, an example of a structure of a storage capacitor, which is different from that in Embodiment 6, will be illustrated in FIGS. 9A and 9B. FIG. 9A is the same as FIG. 7A except for a structure of the storage capacitor; therefore, the same portions are denoted by the same reference numerals and detailed description of the same portions is not repeated. FIG. 9A illustrates a cross-sectional structure of a storage capacitor and a thin film transistor 220 in a pixel.

FIG. 9A illustrates an example in which the storage capacitor is constituted by a pixel electrode layer 227 and a capacitor wiring layer 231 that overlaps with the pixel electrode layer 227, with an oxide insulating layer 216, a protective insulating layer 203, and a planarization insulating layer 204 serving as dielectrics. Since the capacitor wiring layer 231 is formed from the same light-transmitting material in the same step as a source electrode layer of the thin film transistor 220 in the pixel, the capacitor wiring layer 231 is arranged so as not to overlap with a source wiring layer of the thin film transistor 220.

In the storage capacitor illustrated in FIG. 9A, a pair of electrodes and the dielectrics have light-transmitting properties, and thus, the storage capacitor as a whole has light-transmitting properties.

FIG. 9B illustrates an example of a structure of the storage capacitor, which is different from that in FIG. 9A. FIG. 9B is the same as FIG. 7A except for a structure of the storage capacitor; therefore, the same portions are denoted by the same reference numerals and detailed description of the same portions is not repeated.

FIG. 9B illustrates an example in which the storage capacitor is constituted by a capacitor wiring layer 230 and a stack of an oxide semiconductor layer 251 and a capacitor electrode layer 231 which overlap with the storage wiring layer 230 with a first gate insulating layer 202a and a second gate insulating layer 202b serving as dielectrics. The capacitor electrode layer 231 is stacked on and in contact with the oxide semiconductor layer 251 and functions as one electrode of the storage capacitor. Note that the capacitor electrode layer 231 is formed from the same light-transmitting material in the same step as a source electrode layer or a drain electrode layer of a thin film transistor 220. Moreover, since the capacitor wiring layer 230 is formed from the same light-transmitting material in the same step as a gate electrode layer of the thin film transistor 220, the capacitor wiring layer 230 is arranged so as not to overlap with a gate wiring layer of the thin film transistor 220.

The capacitor electrode layer 231 is electrically connected to a pixel electrode layer 227.

Also in the storage capacitor illustrated in FIG. 9B, a pair of electrodes and the dielectrics have light-transmitting properties, and thus, the storage capacitor as a whole has light-transmitting properties.

Each of the storage capacitors illustrated in FIGS. 9A and 9B has light-transmitting properties; thus, sufficient capacitance and a high aperture ratio can be obtained even when the size of the pixel is decreased in order to realize higher resolution of display images by increasing the number of gate wirings, for example.

(Embodiment 9)

In this embodiment, an example of a semiconductor device will be described below in which at least some of driver circuits and a pixel portion are formed over one substrate.

A thin film transistor placed in the pixel portion is formed according to any of Embodiments 1 to 5. Since the thin film transistor described in any of Embodiments 1 to 5 is an n-channel TFT, some of driver circuits that can be constituted by n-channel TFTs among the driver circuits are formed over a substrate over which the thin film transistor in the pixel portion is formed.

Figure 14A:
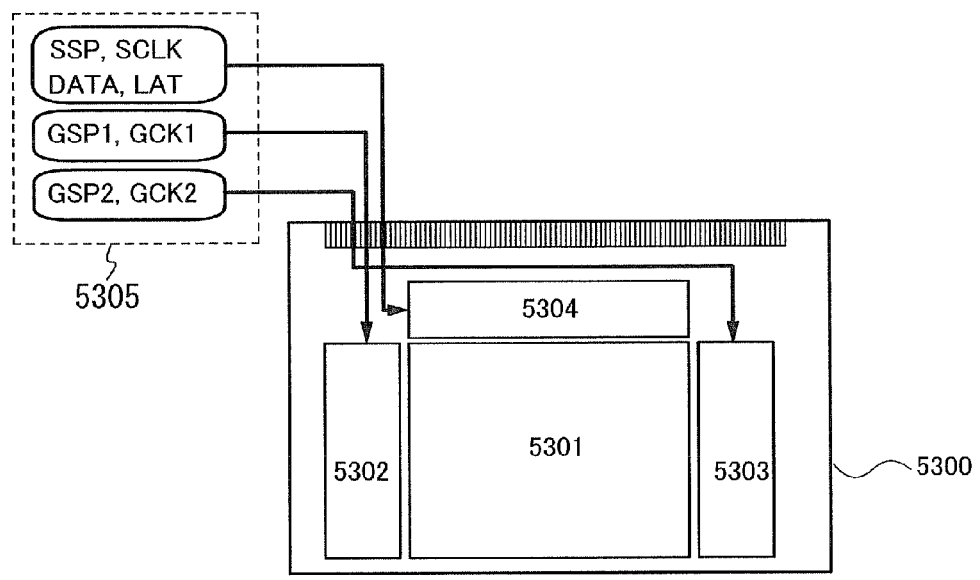
FIGS. 14A and 14B are block diagrams each illustrating a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed, and a plurality of scan lines extended from the first scan line driver circuit 5302 and the second scan line driver circuit 5303 are placed. Note that pixels each including a display element are arranged in matrix in regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion in the case where wirings are extended from a driver circuit provided outside the substrate 5300 can be reduced, and the reliability or yield can be increased.

Note that the timing control circuit 5305 supplies a first scan line driver circuit start signal (GSP1) (a start signal is also referred to as a start pulse) and a first scan line driver circuit clock signal (GCK1), for example, to the first scan line driver circuit 5302. Furthermore, the timing control circuit 5305 supplies a second scan line driver circuit start signal (GSP2) and a second scan line driver circuit clock signal (GCK2), for example, to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT), for example, to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
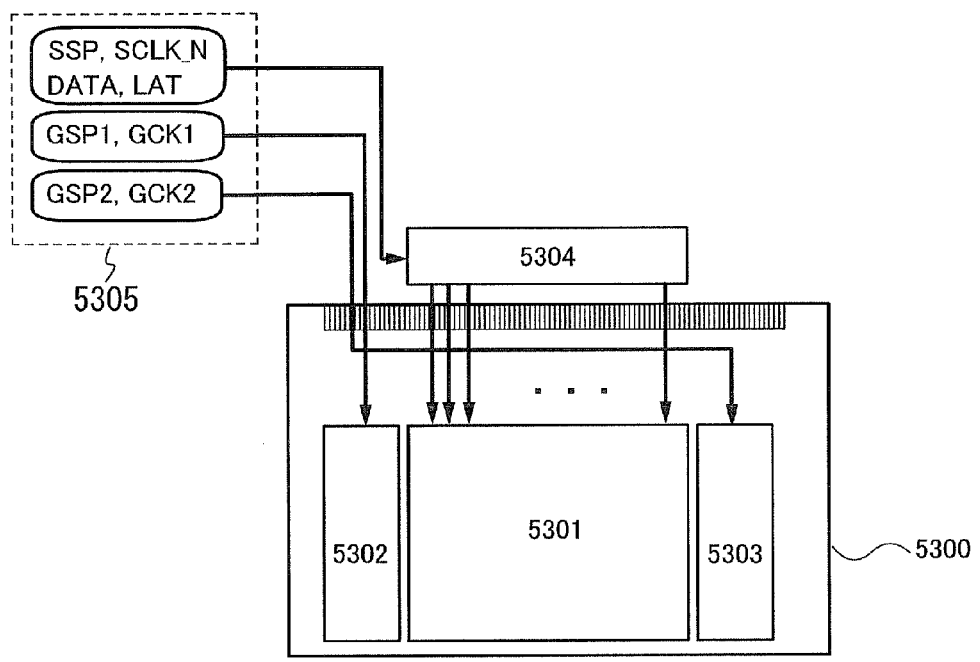

FIG. 14B illustrates a structure in which the first scan line driver circuit 5302 and the second scan line driver circuit 5303 are formed over the substrate 5300 where the pixel portion 5301 is formed, and the signal line driver circuit 5304 is formed over a substrate which is different from the substrate 5300 where the pixel portion 5301 is formed.

Figure 15A:
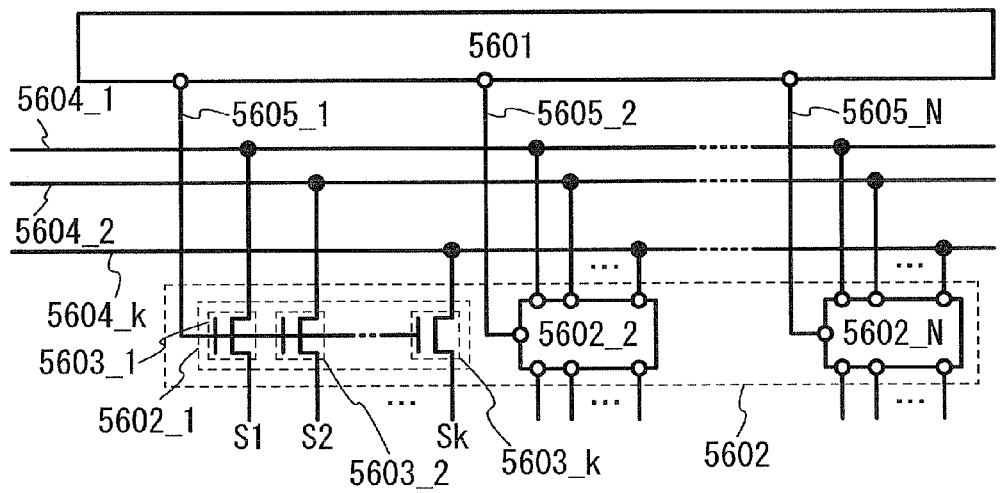
FIGS. 15A and 15B are respectively a circuit diagram and a timing chart of a signal line driver circuit.
Figure 15B:
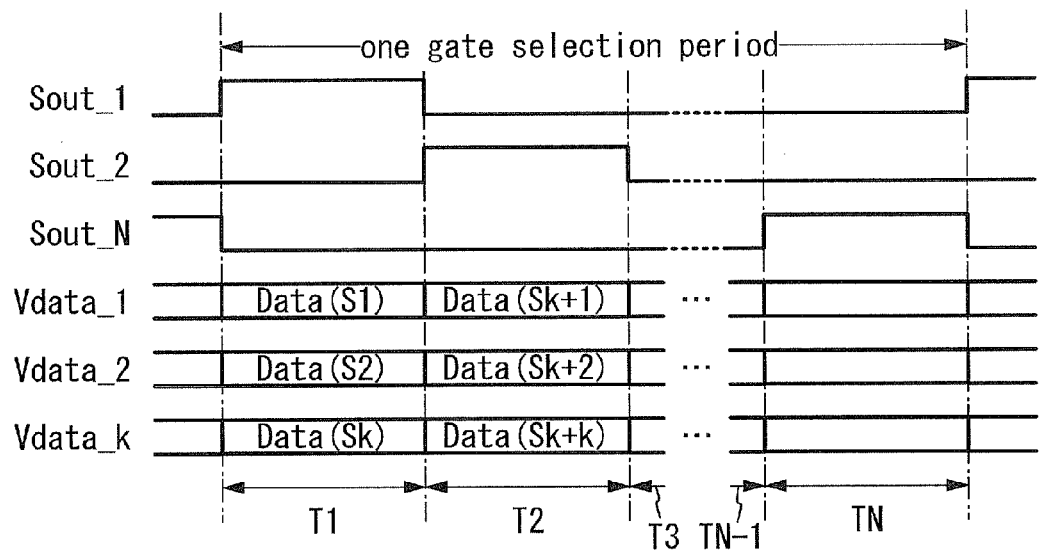

The thin film transistors in Embodiments 1 to 5 are n-channel TFTs. FIGS. 15A and 15B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number of greater than or equal to 2). The switching circuits 5602_1 to 5602_N each include a plurality of thin film transistors 5603_1 to 5603_k_ (k is a natural number of greater than or equal to 2). The example where the thin film transistors 5603_1 to 5603_k_ are n-channel TFTs is described below.

A connection relation in the signal line driver circuit is described by using the switching circuit 5602_1 as an example. First terminals of the thin film transistors 5603_1 to 5603_k_ are connected to wirings 5604_1 to 5604_k_, respectively. Second terminals of the thin film transistors 5603_1 to 5603_k_ are connected to signal lines S1 to Sk, respectively. Gates of the thin film transistors 5603_1 to 5603_k_ are connected to a wiring 5605_1.

The shift register 5601 has a function of sequentially selecting the switching circuits 5602_1 to 5602_N by sequentially outputting H-level signals (also referred to as an H signal or a signal at a high power supply potential level) to wirings 5605_1 to 5605_N.

The switching circuit 5602_1 has a function of controlling a conduction state between the wirings 5604_1 to 5604_k_ and the signal lines S1 to Sk (conduction between the first terminals and the second terminals), that is, a function of controlling whether potentials of the wirings 5604_1 to 5604_k_ are supplied to the signal lines S1 to Sk. In this manner, the switching circuit 5602_1 functions as a selector. Moreover, the thin film transistors 5603_1 to 5603_k_ have functions of controlling conduction states between the wirings 5604_1 to 5604_k_ and the signal lines S1 to Sk, respectively, that is, functions of controlling whether potentials of the wirings 5604_1 to 5604_k_ are supplied to the signal lines Si to Sk, respectively. In this manner, each of the thin film transistors 5603_1 to 5603_k_ functions as a switch.

Video signal data (DATA) is input to each of the wirings 5604_1 to 5604_k_. The video signal data (DATA) is often an analog signal that corresponds to image data or an image signal.

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k_. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each of the structures illustrated in drawings and the like in this embodiment are exaggerated for simplicity in some cases. Therefore, this embodiment is not necessarily limited to the scale illustrated in the drawing and the like.

In the periods T1 to TN, the shift register 5601 sequentially outputs H-level signals to the wirings 5605_1 to 5605_N. For example, in the period T1, the shift register 5601 outputs a high-level signal to the wiring 5605_1. Then, the thin film transistors 5603_1 to 5603_k_ are turned on, so that the wirings 5604_1 to 5604_k_ and the signal lines Si to Sk are brought into conduction. At this time, Data(S1) to Data(Sk) are input to the wirings 5604_1 to 5604_k_, respectively. The Data(S1) to Data(Sk) are written into pixels in first to kth columns in a selected row through the thin film transistors 5603_1 to 5603_k_, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that a circuit constituted by any of the thin film transistors in Embodiments 1 to 5 can be used for the shift register 5601 and the switching circuit 5602. In that case, the shift register 5601 can be constituted by only n-channel transistors.

Further, an example of part of the scan line driver circuit and part of the signal line driver circuit, or a shift register used for part of the scan line driver circuit or part of the signal line driver circuit will be described.

The scan line driver circuit includes a shift register. Additionally, the scan line driver circuit may include a level shifter, a buffer, and the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large current is used.

Further, one embodiment of part of the scan line driver circuit and part of the signal line driver circuit, or a shift register used for part of the scan line driver circuit or part of the signal line driver circuit is described with reference to FIGS. 16A to 16C and FIGS. 17A and 17B.

Figure 16A:
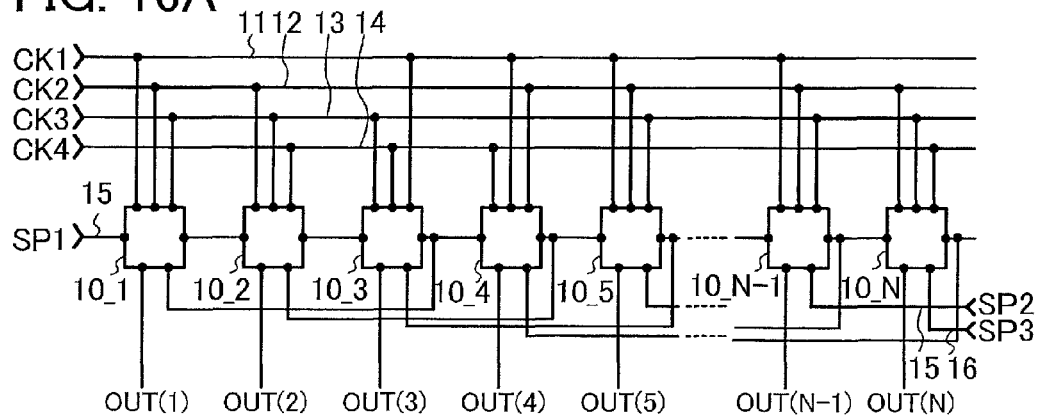
FIGS. 16A to 16C are circuit diagrams each illustrating a configuration of a shift register.

The shift register includes first to Nth pulse output circuits 10_1 to 10_N(N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n_ of the second or subsequent stage (n is a natural number of greater than or equal to 2 and less than or equal to N), a signal from the pulse output circuit of the previous stage is input. To the first pulse output circuit 10_1, a signal from the third pulse output circuit 10_3 of the stage following the next stage is input. In a similar manner, to the nth pulse output circuit 10_n_ of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuit of each stage outputs a first output signal (OUT(1)(SR) to OUT(N)(SR)) to be input to the pulse output circuit of the next stage and/or the pulse output circuit of the stage before the previous stage and a second output signal (OUT(1) to OUT(N)) to be input to a different wiring or the like. Note that since the subsequent-stage signal OUT(n+2) is not input to the last two stages of the shift register as illustrated in FIG. 16A, a second start pulse SP2 and a third start pulse SP3 may be additionally input to the stage before the last stage and the last stage, respectively, for example.

Note that a clock signal (CK) is a signal whose level alternates between an H-level and an L-level (also referred to as an L signal or a signal at low power supply potential level) at regular intervals. Here, the first clock signal (CK1) to the fourth clock signal (CK4) are each delayed by ¼ cycle sequentially. In this embodiment, driving of the pulse output circuit or the like is controlled with the first to fourth clock signals (CK1) to (CK4). Note that the clock signal is also referred to as GCK or SCK in some cases depending on a driver circuit to which the clock signal is input; the clock signal is referred to as CK in the following description.

Figure 16B:
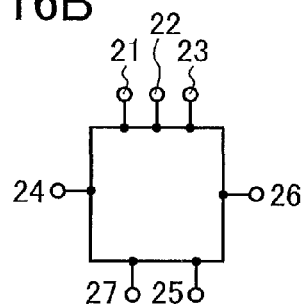

In addition, each of the first to Nth pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 16B). Each of the first input terminal 21, the second input terminal 22, and the third input terminal 23 is electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

In the first to Nth pulse output circuits 10_1 to 10_N, a thin film transistor (TFT) having four terminals described in the above embodiment can be used in addition to a thin film transistor having three terminals.

When an oxide semiconductor is used for a channel formation region in the thin film transistor, the threshold voltage sometimes shifts in the positive or negative direction depending on a manufacturing process. For that reason, the thin film transistor in which an oxide semiconductor is used for a channel formation layer preferably has a structure in which the threshold voltage can be controlled.

Next, an example of a specific circuit configuration of the pulse output circuit will be described with reference to FIG. 16C.

Figure 16C:
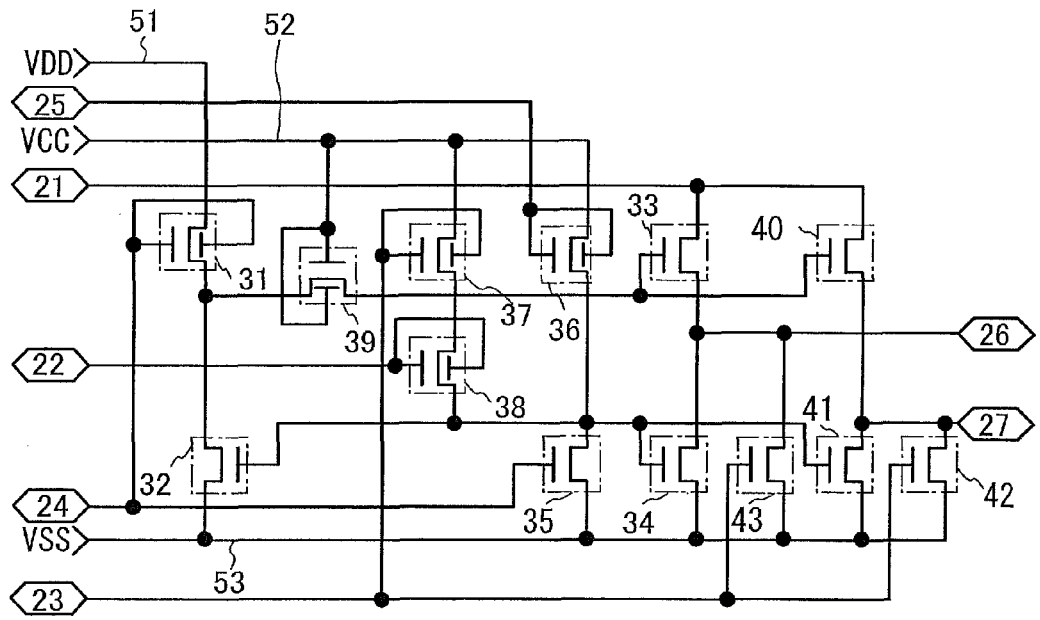

The pulse output circuit illustrated in FIG. 16C includes first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 16C is as follows: the first power supply potential VDD is greater than or equal to the second power supply potential VCC, and the second power supply potential VCC is higher than the third power supply potential VSS. Note that the first to fourth clock signals (CK1) to (CK4) are signals whose level alternates between an H-level and an L-level at regular intervals; the potential of the clock signal at the H level is VDD and that at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. A thin film transistor with four terminals is preferably used as the first transistor 31 and the sixth to ninth transistors 36 to 39 among the first to thirteenth transistors 31 to 43. The first transistor 31 and the sixth to ninth transistors 36 to 39 need to operate so that a potential of the gate electrode of the transistor 33 and a potential of the gate electrode of the transistor 40 are switched with a control signal of the gate electrode, and can further reduce a malfunction of the pulse output circuit since response to the control signal input to the gate electrode is fast (the rise of on-state current is steep). Thus, by using the thin film transistor with four terminals, the threshold voltage can be controlled, and a malfunction of the pulse output circuit can be further reduced.

Note that a thin film transistor is an element having at least three terminals of a gate, a drain, and a source. The thin film transistor has a semiconductor region where a channel region (also referred to as a channel formation region) is formed in a region overlapping with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

In FIG. 16C, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a first gate electrode and a second gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 16C, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 17A:
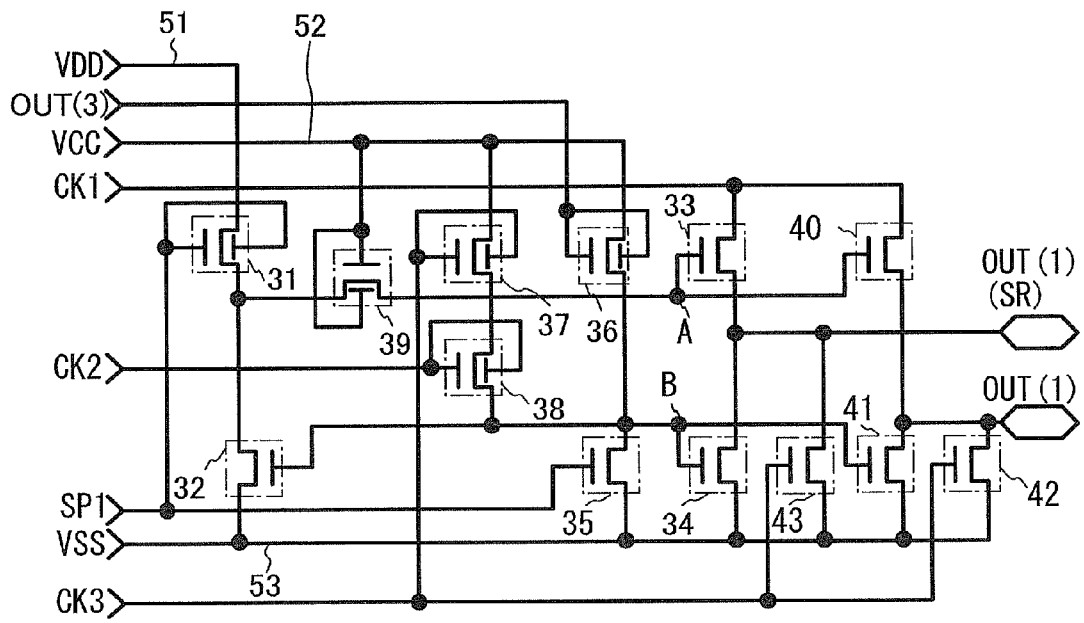
FIGS. 17A and 17B are respectively a timing chart and a circuit diagram of a shift register.

FIG. 17A illustrates signals that are input to or output from the first to fifth input terminals 21 to 25 and the first and second output terminals 26 and 27 in the case where the pulse output circuit illustrated in FIG. 16C is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that in FIG. 16C and FIG. 17A, a capacitor for performing bootstrap operation by placing the node A into a floating state may be additionally provided. Furthermore, a capacitor having one electrode electrically connected to the node B may be additionally provided in order to hold a potential of the node B.

Figure 17B:
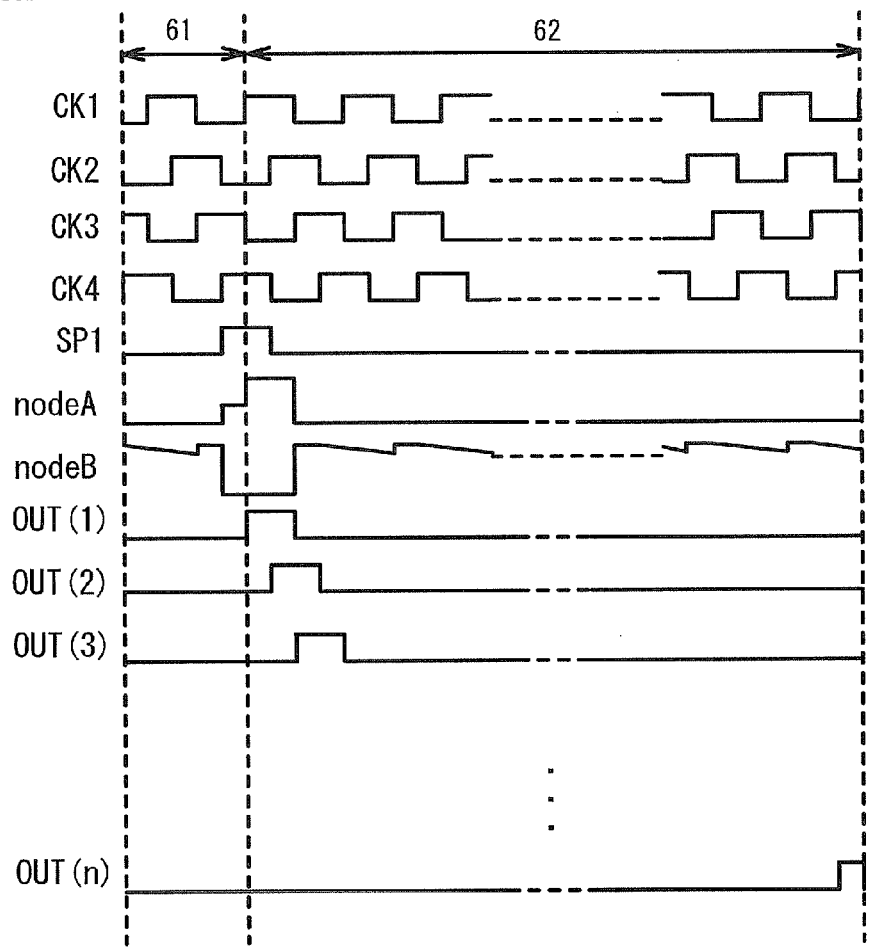

FIG. 17B illustrates a timing chart of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that the placement of the ninth transistor 39 in which the second power supply potential VCC is applied to the gate as illustrated in FIG. 17A has the following advantages before and after bootstrap operation.

Without the ninth transistor 39 in which the second potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal side, that is, on the power supply line 51 side. Consequently, in the first transistor 31, a high bias voltage is applied and thus significant stress is applied between the gate and the source and between the gate and the drain, which might cause deterioration of the transistor. Therefore, with the ninth transistor 39 in which the second power supply potential VCC is applied to the gate electrode, an increase in potential of the second terminal of the first transistor 31 can be prevented while the potential of the node A is raised by bootstrap operation. In other words, the placement of the ninth transistor 39 can lower the value of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected to the second terminal of the first transistor 31 and the gate of the third transistor 33 respectively. Note that in the case of the shift register including a plurality of pulse output circuits in this embodiment, in a signal line driver circuit having a larger number of stages than a scan line driver circuit, the ninth transistor 39 can be omitted, and thus, the number of transistors can be reduced.

Note that an oxide semiconductor is used for semiconductor layers of the first to thirteenth transistors 31 to 43, whereby the off-state current of the thin film transistors can be reduced, the on-state current and the field-effect mobility can be increased, and the degree of deterioration of the transistors can be reduced. Thus, a malfunction in the circuit can be reduced. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar effect is obtained even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 are supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, in FIG. 17A, when a state of the seventh transistor 37 and the eighth transistor 38 is changed in the shift register so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 is reduced to one time, which is caused by fall in potential of the gate electrode of the eighth transistor 38. Therefore, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at L level; thus, a malfunction of the pulse output circuit can be suppressed.

(Embodiment 10)

Thin film transistors are manufactured, and a semiconductor device having a display function (also referred to as a display device) can be manufactured using the thin film transistors in a pixel portion and also in a driver circuit. Moreover, part of the driver circuit or the entire driver circuit, which includes a thin film transistor, can be formed over a substrate where a pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is formed, a state after formation of a conductive film to be a pixel electrode and before etching of the conductive film to form the pixel electrode, or any other states.

Note that a display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view along M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A1 illustrates an example in which the signal line driver circuit 4003 is mounted by a COG method. FIG. 10A2 illustrates an example in which the signal line driver circuit 4003 is mounted by a TAB method.

The pixel portion 4002 and the scan line driver circuit 4004 provided over the first substrate 4001 each include a plurality of thin film transistors. FIG. 10B illustrates a thin film transistor 4010 included in the pixel portion 4002 and a thin film transistor 4011 included in the scan line driver circuit 4004, as an example. An oxide insulating layer 4041, a protective insulating layer 4020, and an insulating layer 4021 are provided in order over the thin film transistors 4010 and 4011.

Any of the highly reliable thin film transistors including the oxide semiconductor layers which are described in Embodiments 1 to 5 can be used as the thin film transistors 4010 and 4011. Any of the thin film transistors 410, 449, 460 and 492 described in Embodiments 1 to 5 can be used as the thin film transistor 4011 for the driver circuit. Any of the thin film transistors 420, 451, 470, and 493 can be used as the thin film transistor 4010 for the pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same as or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be placed in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiber-reinforced plastics (FRP) plate, a polyvinyl fluoride (PVF) film, a polyester film, or an acrylic resin film can be used.

A spacer 4035 is a columnar spacer obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between a pair of substrates using a common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of the temperature, a liquid crystal composition containing a chiral agent at greater than or equal to 5 wt % is used for the liquid crystal layer 4008 in order to widen the temperature range. The liquid crystal composition including liquid crystal exhibiting a blue phase and a chiral agent has a short response time of less than or equal to 1 msec and is optically isotropic; therefore, alignment treatment is not necessary and viewing angle dependence is small.

In addition, the liquid crystal display device of this embodiment may be a transmissive liquid crystal display device or a semi-transmissive liquid crystal display device.

In the example of the liquid crystal display device according to this embodiment, a polarizing plate is provided on the outer surface of the substrate (on the viewer side) and a coloring layer (a color filter) and an electrode layer used for a display element are sequentially provided on the inner surface of the substrate; alternatively, the polarizing plate may be provided on the inner surface of the substrate. The layered structure of the polarizing plate and the coloring layer is not limited to that in this embodiment and may be set as appropriate depending on materials of the polarizing plate and the coloring layer or conditions of the manufacturing process.

The protective insulating layer 4020 can be formed using a material and a method similar to those of the protective insulating layer 403 described in Embodiment 1, for example. In this embodiment, a silicon nitride film is formed as the protective insulating layer 4020 by a PCVD method.

The insulating layer 4021 can be formed using a material and a method similar to those of the planarization insulating layer 404 described in Embodiment 1, and a heat-resistance organic material such as polyimide, acrylic, benzocyclobutene, polyamide, or epoxy can be used for the insulating layer 4021. Other than such organic materials, it is also possible to use a low-dielectric constant material (a low-k material), a siloxane-based resin, PSG (phosphosilicate glass), BPSG (borophosphosilicate glass), or the like for the insulating layer 4021. Note that the insulating layer 4021 may be formed by stacking a plurality of insulating films formed from these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the insulating layer 4021, and the following method or means can be employed depending on the material, by a method such as a sputtering method, an SOG method, a spin coating method, a dipping method, a spray coating method, or a droplet discharge method (e.g., an ink jet method, screen printing, or offset printing), or a tool such as a doctor knife, a roll coater, a curtain coater, a knife coater, or the like. A baking step of the insulating layer 4021 also serves as annealing of the semiconductor layer, whereby a semiconductor device can be efficiently manufactured.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. Examples thereof are polyaniline or a derivative thereof, polypyrrole or a derivative thereof, polythiophene or a derivative thereof, and a copolymer of two or more kinds of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as that for the pixel electrode layer 4030 included in the liquid crystal element 4013. A terminal electrode 4016*a* is formed using the same conductive film as a low-resistance drain region of the thin film transistor 4011, while a terminal electrode 4016*b* is formed using the same conductive film as a source electrode layer and a drain electrode layer of the thin film transistor 4011.

The connection terminal electrode 4015 is electrically connected to a terminal included in the FPC 4018 through an anisotropic conductive film 4019.

Note that FIGS. 10A1, 10A2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
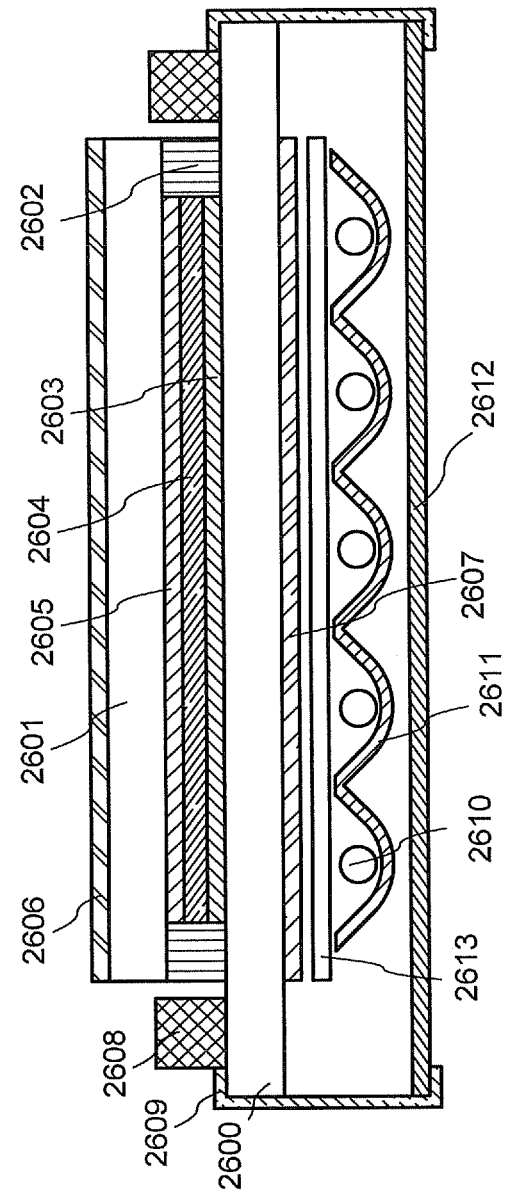
FIG. 19 illustrates a semiconductor device.

FIG. 19 illustrates an example of a liquid crystal display module which is formed as a semiconductor device by using a TFT substrate 2600 manufactured according to the manufacturing method disclosed in this specification.

FIG. 19 shows an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above steps, a highly reliable liquid crystal display panel can be manufactured as a semiconductor device.

(Embodiment 11)

An example of an electronic paper will be described as one embodiment of a semiconductor device.

A semiconductor device can be used for an electronic paper in which electronic ink is driven by an element electrically connected to a switching element. The electronic paper is also referred to as an electrophoretic display device (an electrophoretic display) and has advantages in that it has the same level of readability as regular paper, it has lower power consumption than other display devices, and it can be made thin and lightweight.

Electrophoretic displays can have various modes. An electrophoretic display contains a plurality of microcapsules dispersed in a solvent or a solute, each of which contains first particles that are positively charged and second particles that are negatively charged. By applying an electric field to the microcapsules, the particles in the microcapsules move in opposite directions to each other and only the color of the particles gathering on one side is displayed. Note that the first particles and the second particles contain a pigment and do not move without an electric field. Moreover, the first particles and the second particles have different colors (which may be colorless).

In this way, an electrophoretic display utilizes a so-called dielectrophoretic effect by which a substance having a high dielectric constant moves to a high-electric field region. An electrophoretic display does not need to use a polarizing plate and a counter substrate which are necessary in a liquid crystal display device, and both the thickness and weight of the electrophoretic display device are reduced.

A solution in which the above-described microcapsules are dispersed in a solvent is referred to as electronic ink. This electronic ink can be printed on a surface of glass, plastic, cloth, paper, or the like. Furthermore, color display can be achieved with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate with the use of any of the thin film transistors in Embodiments 1 to 5 can be used.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 18:
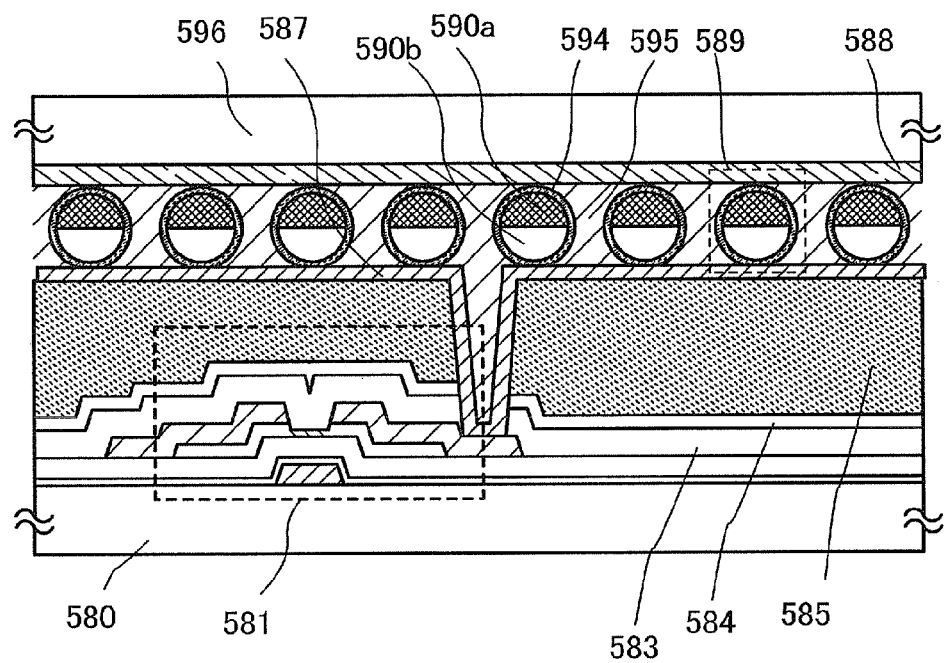
FIG. 18 illustrates a semiconductor device.

FIG. 18 illustrates an active matrix electronic paper as an example of a semiconductor device. A thin film transistor 581 can be formed in a manner similar to the thin film transistor described in Embodiment 1 and is a highly reliable thin film transistor including an oxide semiconductor layer. Moreover, any of the thin film transistors described in Embodiments 2 to 5 can also be used as the thin film transistor 581.

The electronic paper in FIG. 18 is an example using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom gate thin film transistor and covered with an insulating film 583 in contact with a semiconductor layer and an insulating layer 584. A source electrode layer or a drain electrode layer of the thin film transistor 581 is in contact with and electrically connected to a first electrode layer 587 at an opening formed in the insulating film 583, the insulating layer 584, and an insulating layer 585. Spherical particles 589 are provided between the first electrode layer 587 and a second electrode layer 588 formed on a second substrate 596. Each of the spherical particles 589 includes a black region 590*a*, a white region 590*b*, and a cavity 594 filled with liquid around the black region 590*a* and the white region 590*b*. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between a pair of substrates.

Alternatively, it is possible to use an electrophoretic element instead of the twisting ball. A microcapsule having a diameter of approximately 10 μm to 200 μm, in which transparent liquid, positively charged white microparticles, and negatively charged black microparticles are encapsulated, is used. In the microcapsule provided between a first electrode layer and a second electrode layer, when an electric field is applied by the first electrode layer and the second electrode layer, the white microparticles and the black microparticles move in opposite directions, so that white or black can be displayed. A display element using this principle is an electrophoretic display element and is called an electronic paper in general. The electrophoretic display element has higher reflectance than a liquid crystal display element; thus, an auxiliary light is unnecessary, power consumption is low, and a display portion can be recognized also in a dim place. In addition, even when power is not supplied to the display portion, an image which has been displayed once can be maintained. Consequently, a displayed image can be stored even when a semiconductor device having a display function (which may be referred to simply as a display device or a semiconductor device provided with a display device) is kept away from an electric wave source.

Through the above steps, a highly reliable electronic paper can be manufactured as a semiconductor device.

(Embodiment 12)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. Carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 12:
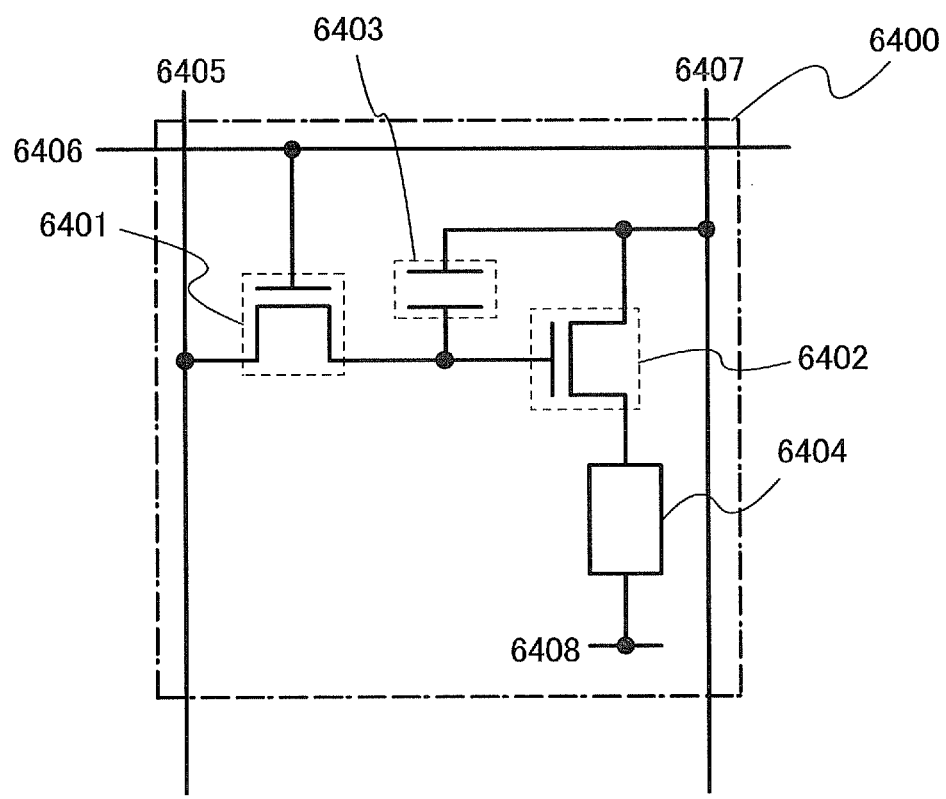
FIG. 12 illustrates a pixel equivalent circuit of a semiconductor device.

FIG. 12 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate electrode of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate electrode of the driving transistor 6402. The gate electrode of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set for the power supply line 6407. For example, GND or 0 V may be given as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is greater than or equal to the forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between a channel region and the gate electrode.

In the case of employing a voltage-input voltage-driving method, a video signal is input to the gate electrode of the driving transistor 6402 so that the driving transistor 6402 is in either of two states; being sufficiently turned on or turned off. That is, the driving transistor 6402 is operated in a linear region. Since the driving transistor 6402 operates in the linear region, a voltage higher than the voltage of the power supply line 6407 is applied to the gate electrode of the driving transistor 6402. Note that a voltage greater than or equal to the sum of the power supply line+Vth of the driving transistor 6402 is applied to the signal line 6405.

In the case of employing analog grayscale driving instead of the digital time grayscale driving, the same pixel structure as in FIG. 12 can be employed by changing signal input.

In the case of performing analog grayscale driving, a voltage greater than or equal to the sum of the forward voltage of the light-emitting element 6404 and Vth of the driving transistor 6402 is applied to the gate electrode of the driving transistor 6402. The forward voltage of the light-emitting element 6404 indicates a voltage at which a desired luminance is obtained, and includes at least a forward threshold voltage. The video signal by which the driving transistor 6402 operates in a saturation region is input, so that current can be supplied to the light-emitting element 6404. In order to operate the driving transistor 6402 in the saturation region, the potential of the power supply line 6407 is set higher than the gate potential of the driving transistor 6402. When an analog video signal is used, a current corresponding to the video signal can be supplied to the light-emitting element 6404, so that analog grayscale driving can be performed.

Note that the pixel structure illustrated in FIG. 12 is not limited to the above. For example, a switch, a resistor, a capacitor, a transistor, a logic circuit, or the like may be added to the pixel illustrated in FIG. 12.

Next, a structure of a light-emitting element will be described with reference to FIGS. 13A to 13C. Here, a cross-sectional structure of a pixel will be described using an n-channel driving TFT as an example. TFTs 7001, 7011, and 7021 serving as driving TFTs used in semiconductor devices illustrated in FIGS. 13A, 13B, and 13C can be formed in a manner similar to that of the thin film transistor arranged in the pixel which is described in Embodiment 1 and are highly reliable thin film transistors each including an oxide semiconductor layer. Alternatively, the thin film transistor arranged in the pixel described in any of Embodiments 2 to 5 can be employed as the TFTs 7001, 7011, and 7021.

A thin film transistor and a light-emitting element are formed over a substrate. In order to extract light emitted from the light-emitting element, at least one of an anode and a cathode needs to be transparent. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure illustrated in FIG. 12 can be applied to a light-emitting element having any of these emission structures.

A light-emitting element having the top emission structure is described with reference to FIG. 13A.

Figure 13A:
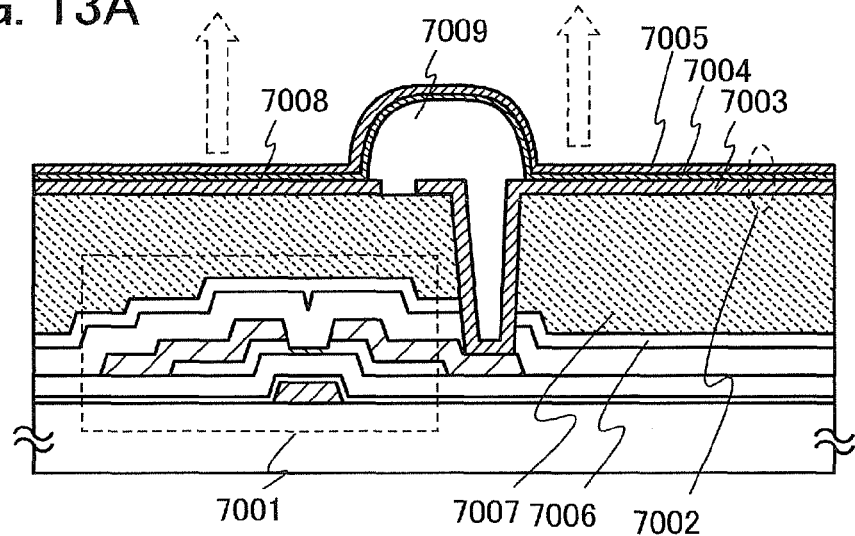
FIGS. 13A to 13C each illustrate a semiconductor device.

FIG. 13A is a cross-sectional view of a pixel in the case where the TFT 7001 serving as the driving TFT is an n-channel TFT and light emitted from a light-emitting element 7002 passes through an anode 7005. In FIG. 13A, a cathode 7003 of the light-emitting element 7002 is electrically connected to the TFT 7001 serving as the driving TFT, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. Note that it is not necessary to form all of these layers. The anode 7005 is formed using a light-transmitting conductive film, for example, a film of indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Moreover, a bank 7009 is provided between the cathode 7003 and a cathode 7008 in an adjacent pixel so as to cover edges of the cathodes 7003 and 7008. The bank 7009 is formed using an organic resin film of polyimide, acrylic, polyamide, epoxy, or the like; an inorganic insulating film; or organic polysiloxane. It is particularly preferable that the bank 7009 be formed using a photosensitive resin material so that its side surface is an inclined surface with continuous curvature. When a photosensitive resin material is used for the bank 7009, a step of forming a resist mask can be omitted.

The light-emitting element 7002 corresponds to a region where the light-emitting layer 7004 is sandwiched between the cathode 7003 and the anode 7005. In the pixel illustrated in FIG. 13A, light is emitted from the light-emitting element 7002 to the anode 7005 side as indicated by arrows.

Next, a light-emitting element having the bottom emission structure is described with reference to FIG. 13B. FIG. 13B is a cross-sectional view of a pixel in the case where the driving TFT 7011 is an n-channel TFT and light is emitted from a light-emitting element 7012 to a cathode 7013 side. In FIG. 13B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. The cathode 7013 can be formed using a variety of conductive materials as in the case of FIG. 13A as long as they have a low work function. Note that the cathode 7013 is formed to a thickness that can transmit light (preferably approximately 5 nm to 30 nm). For example, a 20-nm-thick aluminum film can be used as the cathode 7013. As in the case of FIG. 13A, the light-emitting layer 7014 may be formed using a single layer or a plurality of layers stacked. The anode 7015 is not necessary to transmit light, but can be formed using a light-transmitting conductive material as in the case of FIG. 13A. For the light-blocking film 7016, a metal or the like that reflects light can be used, for example; however, the light-blocking film 7016 is not limited to a metal film. For example, a resin or the like to which a black pigment is added can be used.

Moreover, a bank 7019 is provided between the conductive film 7017 and a conductive film 7018 in an adjacent pixel so as to cover edges of the conductive films 7017 and 7018. The bank 7019 can be formed using an organic resin film of polyimide, acrylic, polyamide, epoxy, or the like; an inorganic insulating film; or organic polysiloxane. It is particularly preferable that the bank 7019 be formed using a photosensitive resin material so that its side surface is an inclined surface with continuous curvature. When a photosensitive resin material is used for the bank 7019, a step of forming a resist mask can be omitted.

The light-emitting element 7012 corresponds to a region where the light-emitting layer 7014 is sandwiched between the cathode 7013 and the anode 7015. In the pixel illustrated in FIG. 13B, light is emitted from the light-emitting element 7012 to the cathode 7013 side as indicated by arrows.

Next, a light-emitting element having the dual emission structure is described with reference to FIG. 13C. In FIG. 13C, a cathode 7023 of a light-emitting element 7022 is formed over a light-transmitting conductive film 7027 that is electrically connected to the driving TFT 7021, and a light-emitting layer 7024 and an anode 7025 are sequentially stacked over the cathode 7023. As in the case of FIG. 13A, the cathode 7023 can be formed using any of a variety of materials as long as it is a conductive material having a low work function. Note that the cathode 7023 is formed to a thickness that can transmit light. For example, a 20-nm-thick film of Al can be used as the cathode 7023. As in the case of FIG. 13A, the light-emitting layer 7024 may be formed using a single layer or a plurality of layers stacked. The anode 7025 can be formed using a light-transmitting conductive material as in the case of FIG. 13A.

Moreover, a bank 7029 is provided between the conductive film 7027 and a conductive film 7028 in an adjacent pixel so as to cover edges of the conductive films 7027 and 7028. The bank 7029 can be formed using an organic resin film of polyimide, acrylic, polyamide, epoxy, or the like; an inorganic insulating film; or organic polysiloxane. It is particularly preferable that the bank 7029 be formed using a photosensitive resin material so that its side surface is an inclined surface with continuous curvature. When a photosensitive resin material is used for the bank 7029, a step of forming a resist mask can be omitted.

The light-emitting element 7022 corresponds to a portion where the cathode 7023, the light-emitting layer 7024, and the anode 7025 overlap with each other. In the pixel illustrated in FIG. 13C, light is emitted from the light-emitting element 7022 to both the anode 7025 side and the cathode 7023 side as indicated by arrows.

Note that although the organic EL elements are described here as the light-emitting elements, an inorganic EL element can also be provided as a light-emitting element.

Note that the example is described in which the thin film transistor (the driving TFT) which controls the driving of thr light-emitting element is electrically connected to the light-emitting element; alternatively, a structure may be employed in which a TFT for current control is connected between the driving TFT and the light-emitting element.

Figure 13B:
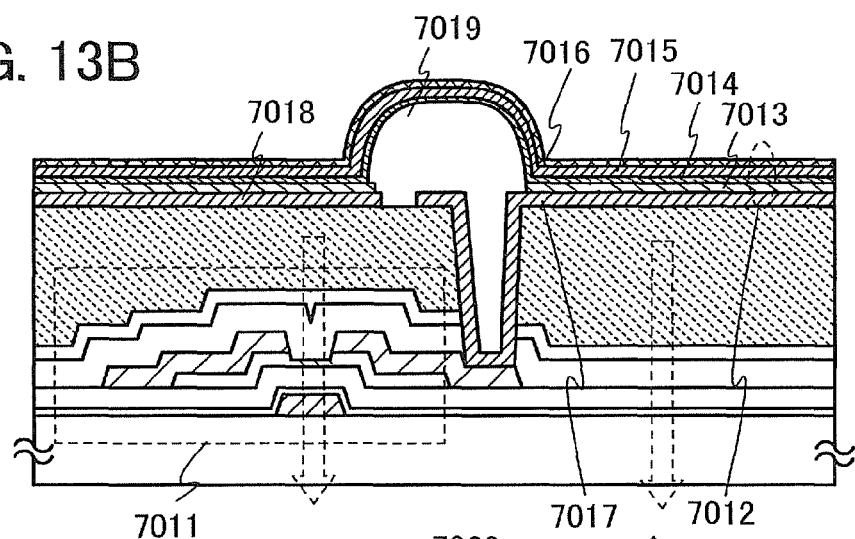
Figure 13C:
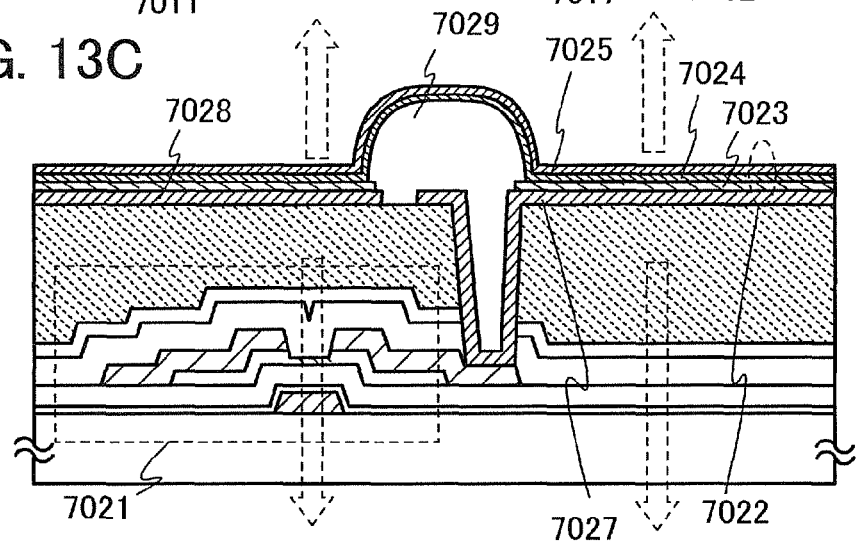

Note that the structure of the semiconductor device is not limited to those illustrated in FIGS. 13A to 13C and can be modified in various ways based on techniques disclosed in this specification.

Figure 11A:
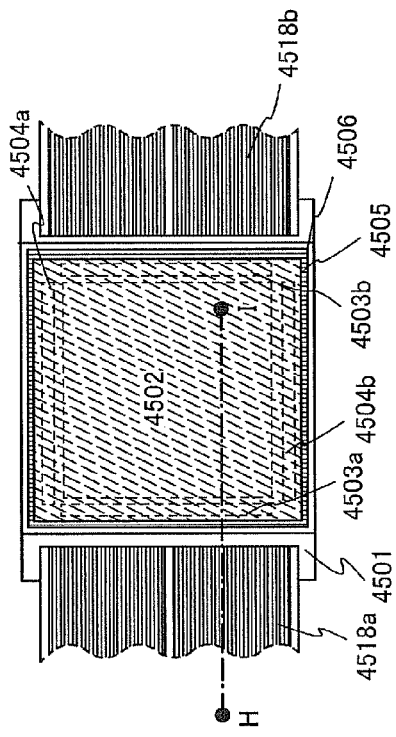
FIGS. 11A and 11B illustrate a semiconductor device.
Figure 11B:
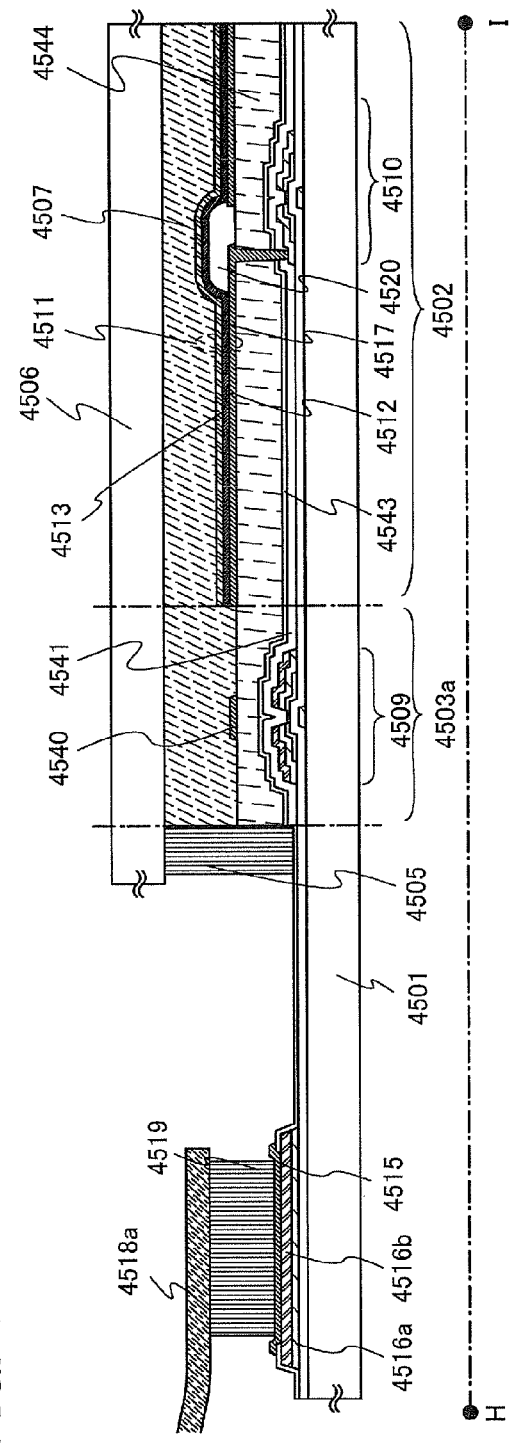

Next, the appearance and a cross section of a light-emitting display panel (also referred to as a light-emitting panel) which is one embodiment of a semiconductor device will be described with reference to FIGS. 11A and 11B. FIG. 11A is a plan view of a panel in which a thin film transistor and a light-emitting element that are formed over a first substrate are sealed between the first substrate and a second substrate with a sealant. FIG. 11B is a cross-sectional view along H-I in FIG. 11A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 11B.

Any of the highly reliable thin film transistors including the oxide semiconductor layers described in Embodiments 1 to 5 can be used as the thin film transistors 4509 and 4510. Any of the thin film transistors 410, 460, 449, and 492 described in Embodiments 1 to 5 can be used as the thin film transistor 4509 for the driver circuit. Any of the thin film transistors 420, 451, 470, and 493 can be used as the thin film transistor 4510 for the pixel. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same as or different from that of a gate electrode layer in the thin film transistor 4509. The conductive layer 4540 can also function as a second gate electrode layer. Alternatively, the potential of the conductive layer 4540 may be GND or 0 V, or the conductive layer 4540 may be placed in a floating state.

In the thin film transistor 4509, an oxide insulating layer 4541 is formed in contact with a semiconductor layer including a channel formation region. The oxide insulating layer 4541 can be formed using a material and a method similar to those of the oxide insulating layer 416 described in Embodiment 1. Moreover, the insulating layer 4544 functioning as a planarization insulating film covers the thin film transistors in order to reduce surface unevenness of the thin film transistors. Here, as the oxide insulating layer 4541, a silicon oxide film is formed by a sputtering method according to Embodiment 1.

Furthermore, a protective insulating layer 4543 is formed over the thin film transistors 4509 and 4510. The protective insulating layer 4543 can be formed using a material and a method similar to those of the protective insulating layer 403 described in Embodiment 1. Here, a silicon nitride film is formed by a PCVD method as the protective insulating layer 4543.

The insulating layer 4544 is formed as the planarization insulating film. The insulating layer 4544 can be formed using a material and a method similar to those of the planarization insulating layer 404 described in Embodiment 1. Here, acrylic is used for the insulating layer 4544.

Moreover, a first electrode layer 4517 that is a pixel electrode included in a light-emitting element 4511 is electrically connected to a source electrode layer or a drain electrode layer of the thin film transistor 4510. Note that the structure of the light-emitting element 4511 is not limited to the layered structure shown in this embodiment, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. It is particularly preferable that the bank 4520 be formed using a photosensitive material and an opening be formed over the first electrode layer 4517 so that a sidewall of the opening is an inclined surface with continuous curvature.

The electroluminescent layer 4512 may be formed with a single layer or a plurality of layers stacked.

A protective film may be formed over the second electrode layer 4513 and the bank 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as that for the first electrode layer 4517 included in the light-emitting element 4511. A terminal electrode 4516a is formed using the same conductive film as that for a low-resistance drain region of the thin film transistor 4509, while a terminal electrode 4516b is formed using the same conductive film as that for a source electrode layer and a drain electrode layer of the thin film transistor 4509.

The connection terminal electrode 4515 is electrically connected to a terminal included in the FPC 4518a through an anisotropic conductive film 4519.

The substrate positioned in the direction in which light is extracted from the light-emitting element 4511 needs to have a light-transmitting property. In that case, a light-transmitting material such as a glass plate, a plastic plate, a polyester film, or an acrylic film is used for the substrate.

As the filler 4507, an ultraviolet curable resin or a thermosetting resin can be used in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element 4511. Further, a polarizing plate or a circularly polarizing plate may be provided with an anti-reflection film. For example, antiglare treatment can be performed by which reflected light can be diffused by projections and depressions on the surface so as to reduce glare.

Driver circuits formed using a single crystal semiconductor film or a polycrystalline semiconductor film over a substrate separately prepared may be mounted as the signal line driver circuits 4503a and 4503b and the scan line driver circuits 4504a and 4504b. Alternatively, only the signal line driver circuits or part thereof, or only the scan line driver circuits or part thereof may be separately formed and mounted. This embodiment is not limited to the structure illustrated in FIGS. 11A and 11B.

Through the above steps, a highly reliable light-emitting display device (display panel) can be manufactured as a semiconductor device.

(Embodiment 13)

Figure 20:
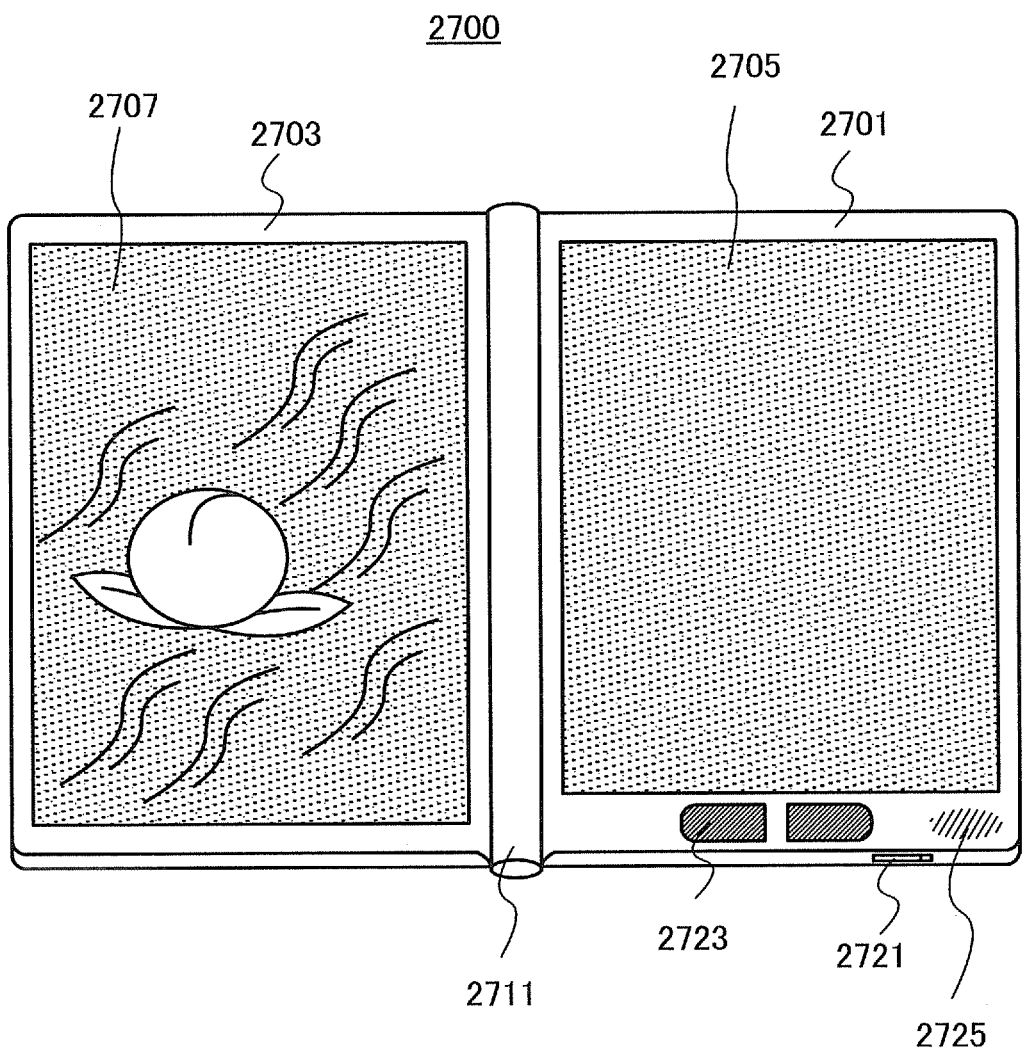
FIG. 20 is an external view illustrating an example of an e-book reader.

A semiconductor device disclosed in this specification can be applied to an electronic paper. An electronic paper can be used for electronic devices in all fields as long as they display data. For example, an electronic paper can be applied to an e-book reader (an electronic book), a poster, an advertisement in a vehicle such as a train, or displays of a variety of cards such as a credit card. FIG. 20 illustrates an example of the electronic device.

FIG. 20 illustrates an example of an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display a text image and a display portion on the left side (the display portion 2707 in FIG. 20) can display a different type of image.

FIG. 20 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. In addition, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

(Embodiment 14)

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 21A:
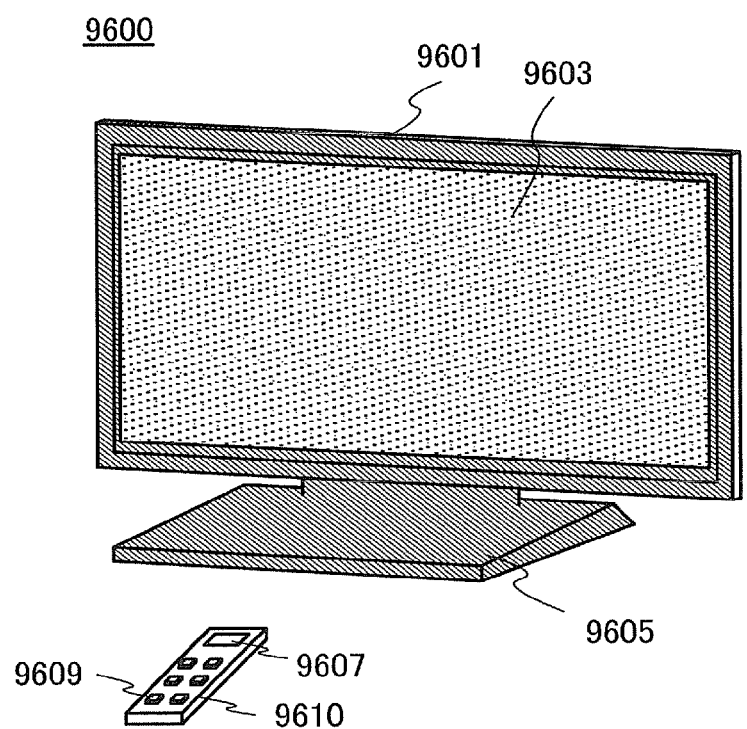
FIG. 21A is an external view of an example of a television device and FIG. 21B is an external view of an example of a digital photo frame.

FIG. 21A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data output from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 21B:
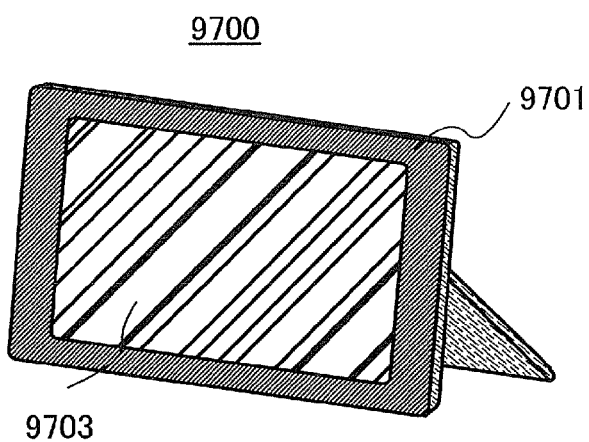

FIG. 21B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame and the data is loaded, whereby the image of the loaded data can be displayed on the display portion 9703.

The digital photo frame 9700 may be configured to transmit and receive data wirelessly. Through wireless communication, desired image data can be loaded to be displayed.

Figure 22A:
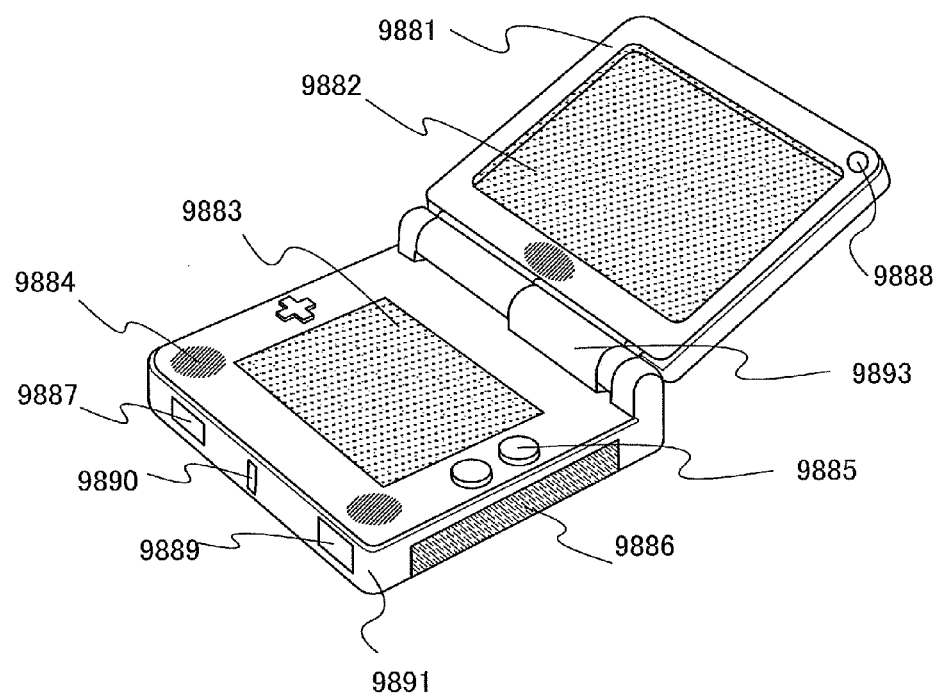
FIGS. 22A and 22B are external views each illustrating an example of a game machine.

FIG. 22A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least the semiconductor device disclosed in this specification can be employed. The portable game machine may include other accessory equipment as appropriate. The portable game machine illustrated in FIG. 22A has a function of reading a program or data stored in the recording medium to display it on the display portion, and a function of sharing information with another portable game machine by wireless communication. Note that a function of the portable game machine illustrated in FIG. 22A is not limited to those described above, and the portable game machine can have a variety of functions.

Figure 22B:
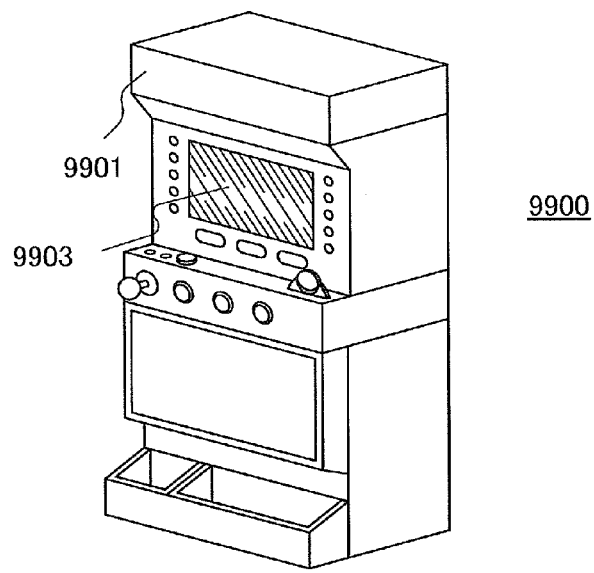

FIG. 22B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least the semiconductor device disclosed in this specification may be employed. The slot machine 9900 may include other accessory equipment as appropriate.

Figure 23A:
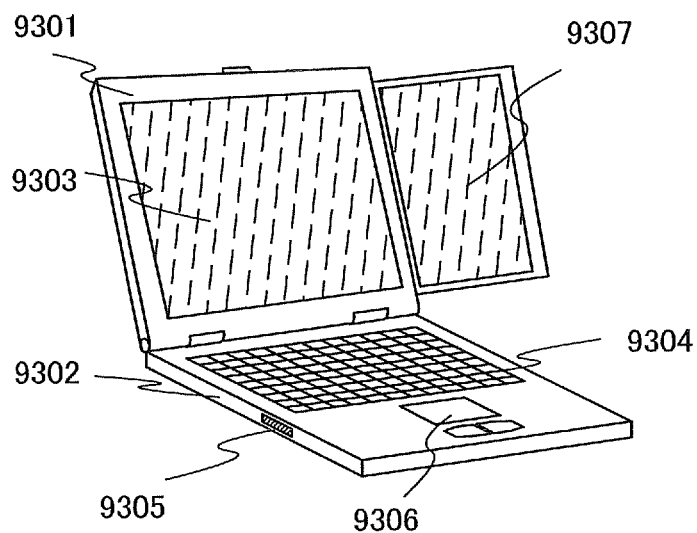
FIG. 23A is an external view illustrating an example of a portable computer and
FIG. 23B is an external view illustrating an example of a mobile phone.

FIG. 23A is a perspective view illustrating an example of a portable computer.

In the portable computer illustrated in FIG. 23A, a top housing 9301 having a display portion 9303 and a bottom housing 9302 having a keyboard 9304 can overlap with each other by closing hinge unit which connects the top housing 9301 and the bottom housing 9302. The portable computer illustrated in FIG. 23A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. With the display portion 9370, a large display screen can be realized. In addition, a user can adjust the angle of a screen of the display portion 9307 which can be stored. If the display portion 9307 which can be stored is a touch panel, the user can input data by touching part of the display portion 9307 which can be stored.

The display portion 9303 or the display portion 9307 which can be stored in the top housing 9301 is formed using an image display device such as a liquid crystal display panel or a light-emitting display panel using an organic light-emitting element, an inorganic light-emitting element, or the like.

In addition, the portable computer illustrated in FIG. 23A can be provided with a receiver and the like and can receive a TV broadcast to display an image on the display portion. The user can watch a TV broadcast with the whole screen of the display portion 9307 by sliding and exposing the display portion 9370 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 23B:
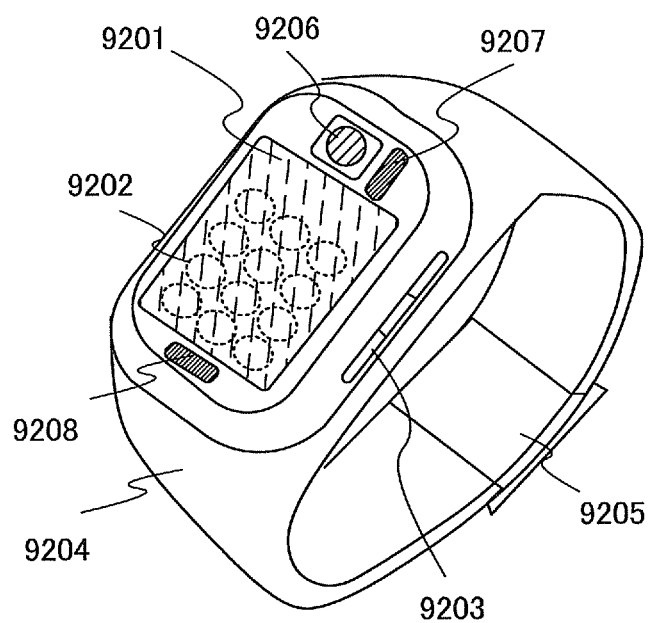

FIG. 23B is a perspective view of an example of a mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to be fitted to the wrist; a display portion 9201; a speaker 9207; and a microphone 9208.

In addition, the main body includes operation switches 9203. The operation switches 9203 can have respective functions, for example, can serve as a switch for starting a program for the Internet when a button is pushed, in addition to serving as a power switch, a switch for switching displays, a switch for instruction to start taking images, or the like.

A user can input data into this mobile phone by touching the display portion 9201 with a finger or an input pen, operating the operation switches 9203, or inputting voice into the microphone 9208. In FIG. 23B, display buttons 9202 are displayed on the display portion 9201. A user can input data by touching the display buttons 9202 with a finger or the like.

Further, the main body includes a camera portion 9206 including an image pick-up means which converts an image of an object, which is formed through a camera lens, to an electronic image signal. Note that the camera portion is not necessarily provided.

The mobile phone illustrated in FIG. 23B is provided with a receiver of a TV broadcast and the like, and can display an image on the display portion 9201 by receiving the TV broadcast. In addition, the mobile phone can be provided with a memory device such as a memory, and the like, and can record the TV broadcast in the memory. The mobile phone illustrated in FIG. 23B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 23B is compact and lightweight and the battery capacity is limited. For the above reason, a panel which can be driven with low power consumption is preferably used as a display device for the display portion 9201.

Note that although FIG. 23B illustrates the electronic device which is worn on the wrist, this embodiment is not limited thereto as long as an electronic device is portable.

(Embodiment 15)

In this embodiment, as one mode of a semiconductor device, examples of a display device including the thin film transistor described in any of Embodiments 1 to 5 will be described with reference to FIG. 24 to FIG. 37. In this embodiment, examples of a liquid crystal display device in which a liquid crystal element is used as a display element will be described with reference to FIG. 24 to FIG. 37. The thin film transistor described in any of Embodiments 1 to 5 can be used as TFTs 628 and 629 used in each of the liquid crystal display devices in FIG. 24 to FIG. 37. The TFTs 628 and 629 can be manufactured through a process similar to that described in any of Embodiments 1 to 5 and have excellent electrical characteristics and high reliability. The TFT 628 and the TFT 629 are channel-etched thin film transistors in each of which a channel formation region is formed using an oxide semiconductor layer.

First, a vertical alignment (VA) liquid crystal display device is described. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (sub-pixels), and molecules are aligned in different directions in their respective regions. This is referred to as multi-domain or multi-domain design. Liquid crystal display devices of the multi-domain design are described below.

Figure 24:
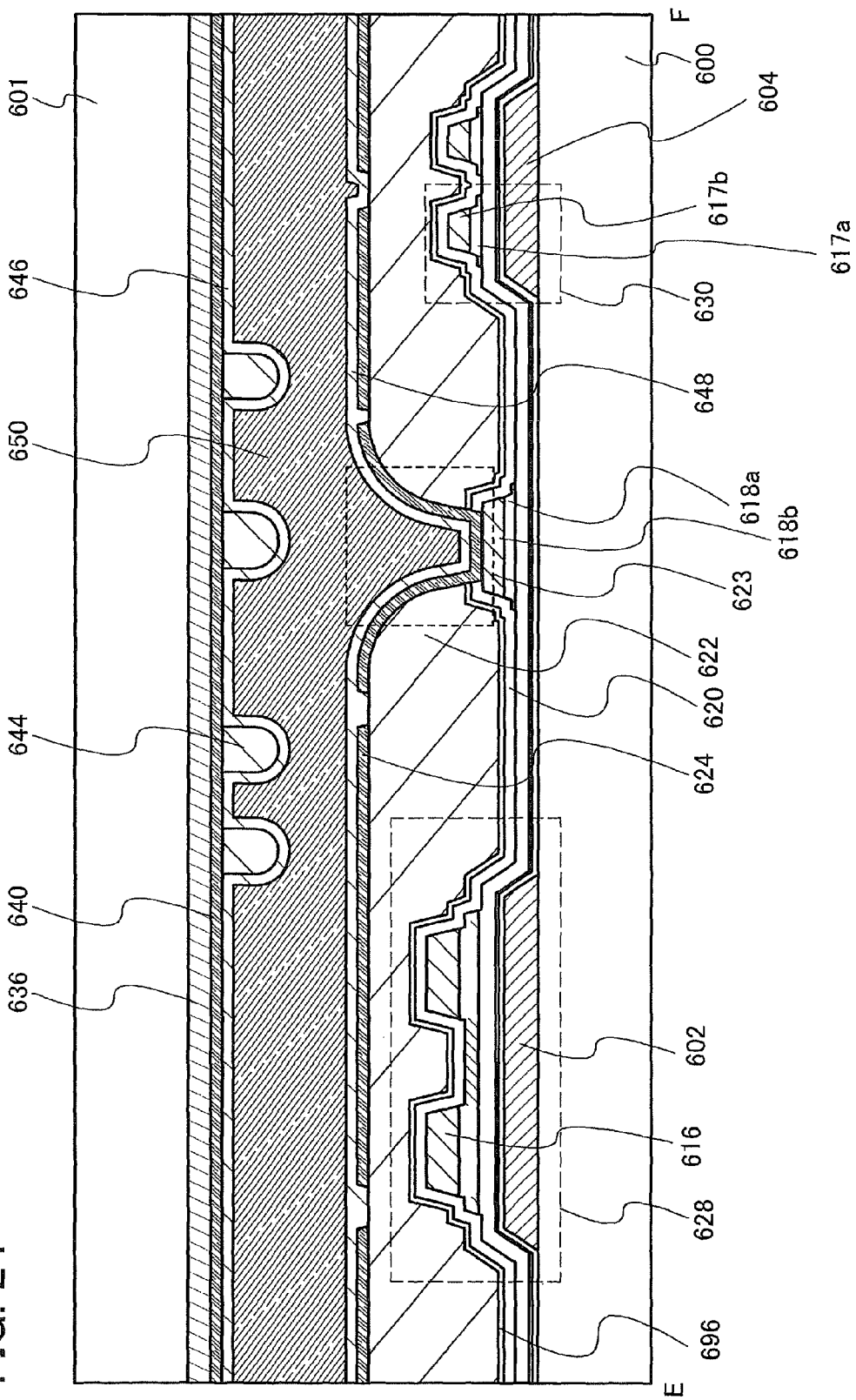
FIG. 24 illustrates a semiconductor device.
Figure 25:
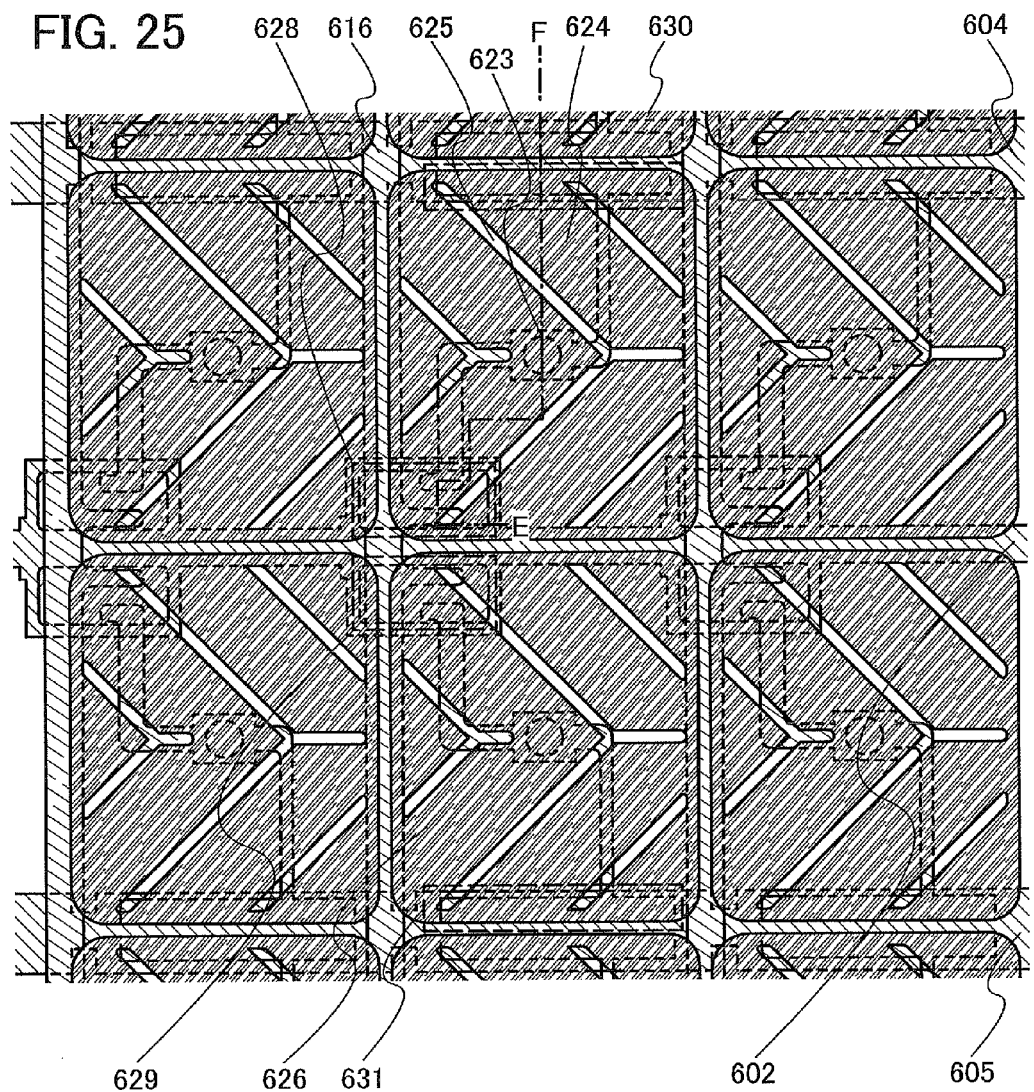
FIG. 25 illustrates a semiconductor device.
Figure 26:
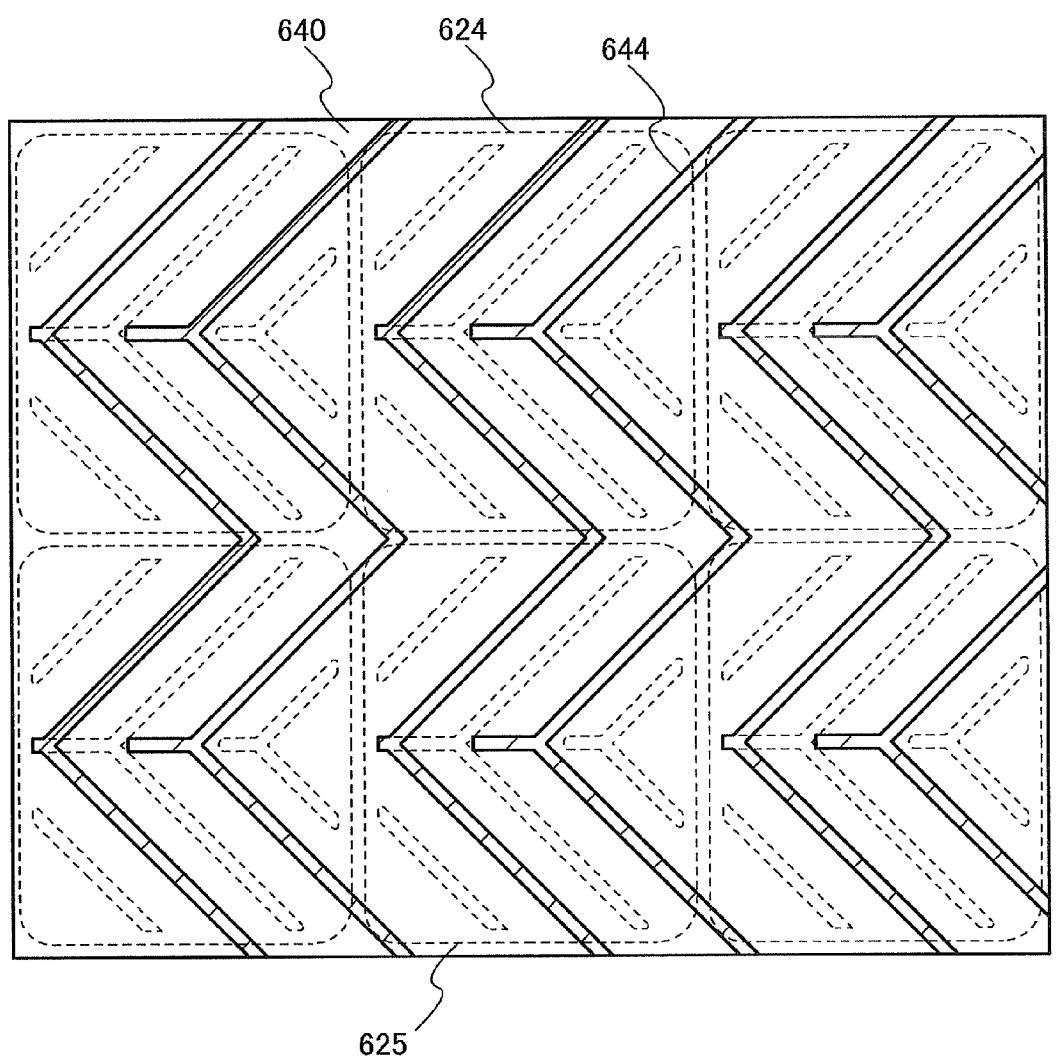
FIG. 26 illustrates a semiconductor device.

FIG. 25 and FIG. 26 illustrate a pixel electrode and a counter electrode, respectively. FIG. 25 is a plan view showing the substrate side where the pixel electrode is formed. FIG. 24 illustrates a cross-sectional structure taken along section line E-F in FIG. 25. FIG. 26 is a plan view showing the substrate side where the counter electrode is formed. Description below is made with reference to those drawings.

In FIG. 24, a substrate 600 provided with a TFT 628, a pixel electrode layer 624 connected to the TFT 628, and a storage capacitor portion 630 overlaps with a counter substrate 601 provided with a counter electrode layer 640 and the like, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to the TFT 628, that is, connected to a wiring 618a and a wiring 618b through a contact hole 623 which penetrates an insulating film 620 which covers the storage capacitor portion 630, an insulating film 696 which covers the insulating film 620, and an insulating film 622 which covers the insulating film 696. The thin film transistor described in any of Embodiments 1 to 5 can be used as the TFT 628 as appropriate. Further, the storage capacitor portion 630 includes a first capacitor wiring 604 which is formed at the same time as a gate wiring 602 of the TFT 628, a gate insulating film, and a second capacitor wiring 617a and a second capacitor wiring 617b formed at the same time as a wiring 616.

The pixel electrode layer 624, the liquid crystal layer 650, and the counter electrode layer 640 overlap with each other, whereby a liquid crystal element is formed.

For example, the pixel electrode layer 624 is formed using the material described in Embodiment 1. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 25 can be formed in a manner similar to that of the TFT 628, the pixel electrode layer 624, and the storage capacitor portion 630. Both the TFTs 628 and 629 are connected to the wiring 616. One pixel of this liquid crystal display panel includes the pixel electrode layers 624 and 626.

FIG. 26 illustrates a planar structure of the counter substrate side. The counter electrode layer 640 is preferably formed using a material similar to that of the pixel electrode layer 624. The protrusions 644 which control the alignment of the liquid crystals are formed on the counter electrode layer 640. Note that in FIG. 26, the pixel electrode layers 624 and 626 are represented by dashed lines, and the counter electrode layer 640 and the pixel electrode layers 624 and 626 overlap with each other.

Figure 27:
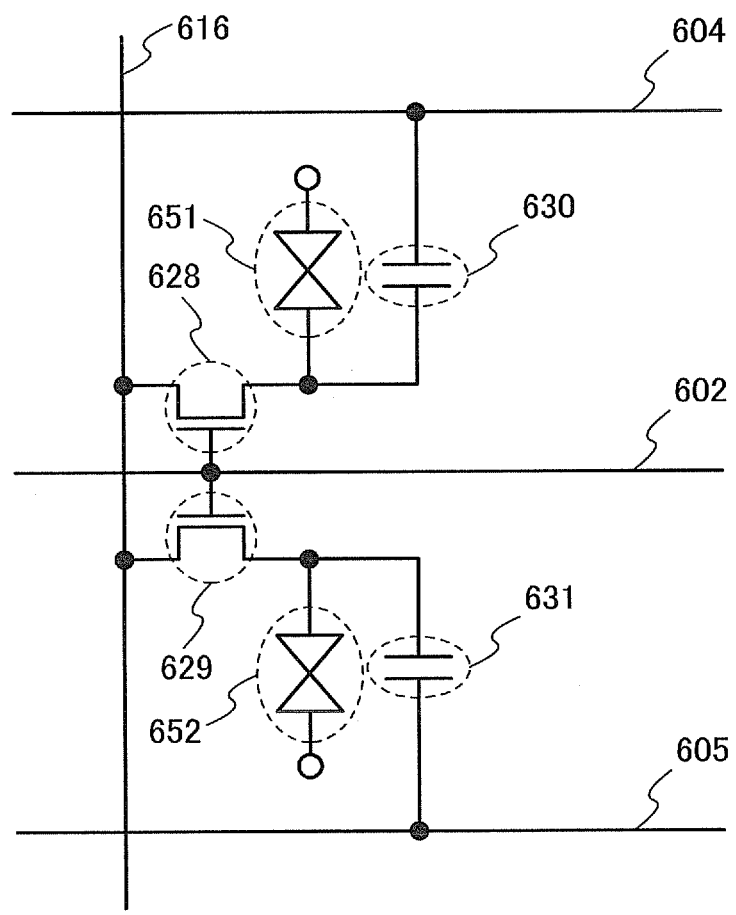
FIG. 27 is a circuit diagram of a semiconductor device.

FIG. 27 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, by separate control of potentials of the capacitor wirings 604 and 605, the alignment of the liquid crystals is precisely controlled and a viewing angle is increased.

When a voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIG. 28, FIG. 29, FIG. 30, and FIG. 31.

Figure 28:
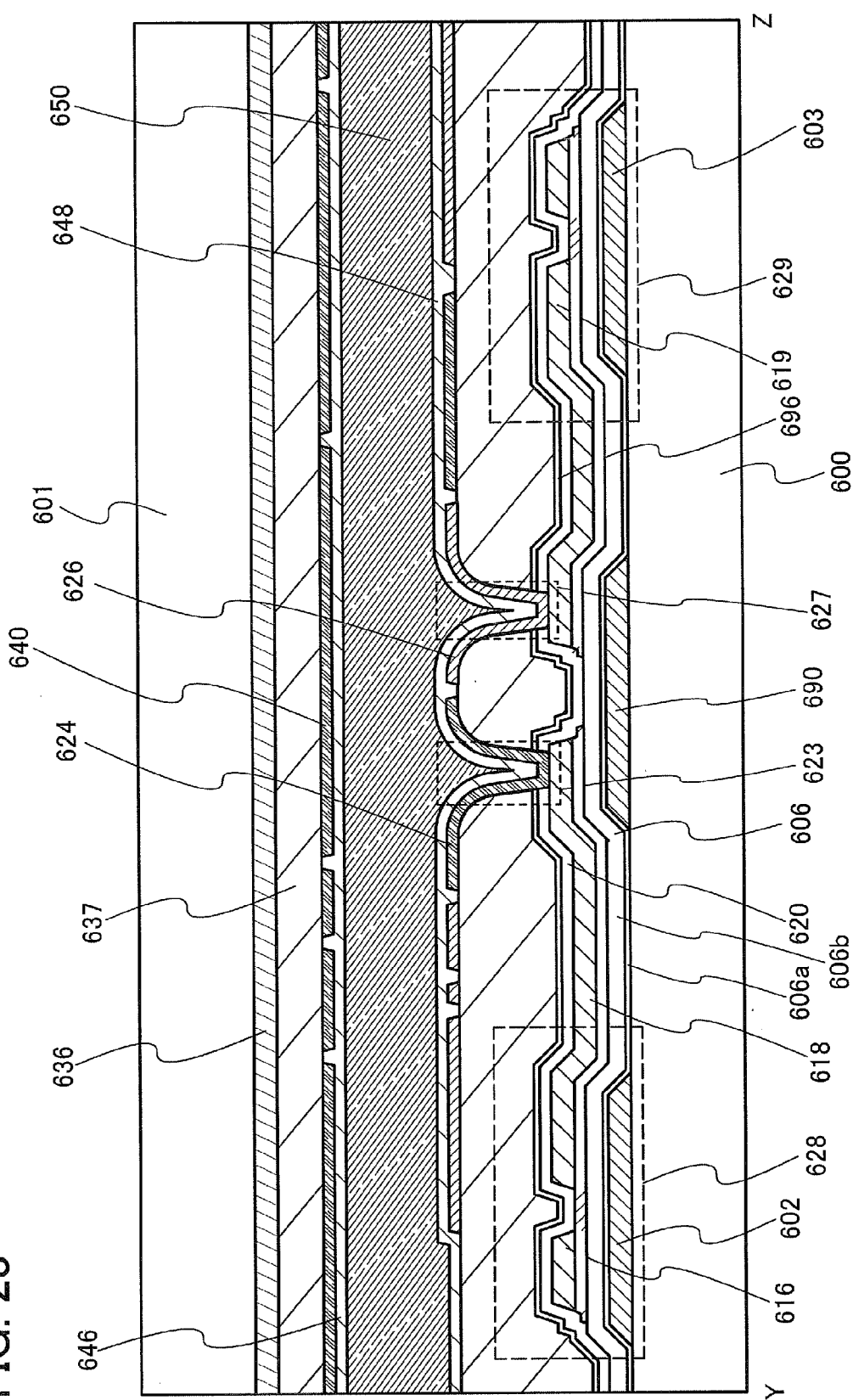
FIG. 28 illustrates a semiconductor device.
Figure 29:
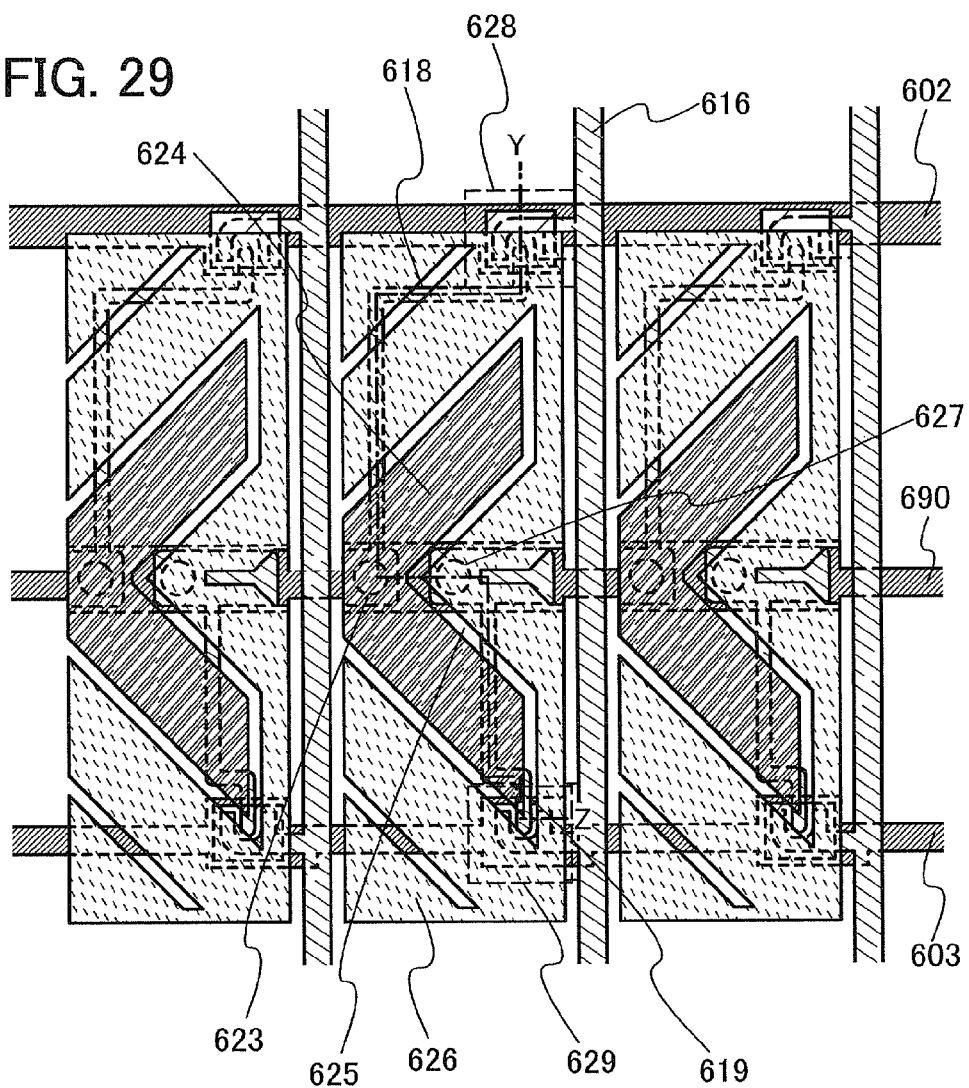
FIG. 29 illustrates a semiconductor device.

FIG. 28 and FIG. 29 illustrate a pixel structure of a VA liquid crystal display panel. FIG. 29 is a plan view of a substrate 600. FIG. 28 illustrates a cross-sectional structure along section line Y-Z in FIG. 29. Description below will be given with reference to both the drawings.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

A pixel electrode layer 624 is connected to a TFT 628 via a wiring 618 through a contact hole 623 penetrating insulating films 620, 696, and 622. A pixel electrode layer 626 is connected to a TFT 629 via a wiring 619 through a contact hole 627 penetrating the insulating films 620, 696, and 622. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in any of Embodiments 1 to 5 can be used as appropriate as each of the TFTs 628 and 629. Note that a first gate insulating film 606a and a second gate insulating film 606b are formed over the gate wiring 602, the gate wiring 603, and a capacitor wiring 690.

Figure 31:
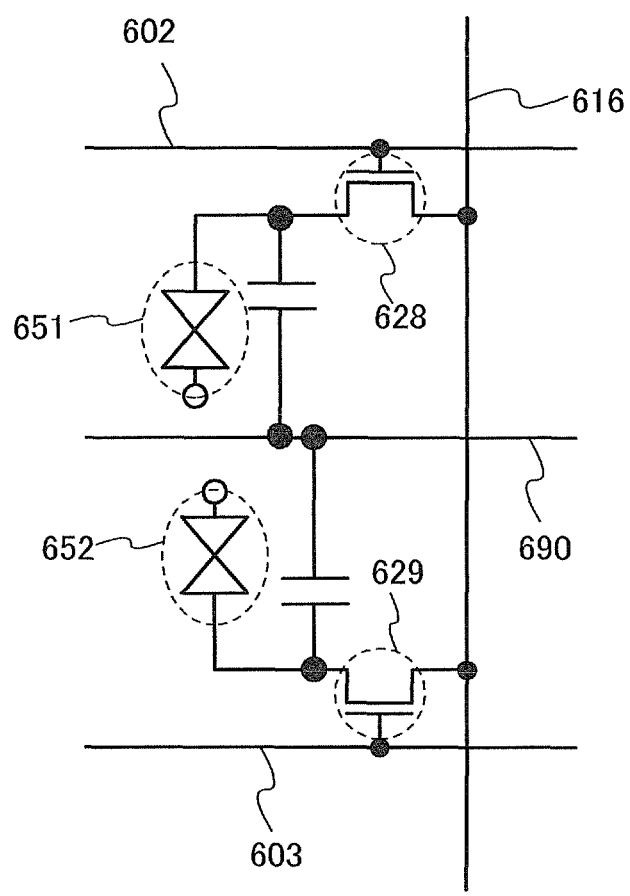
FIG. 31 is a circuit diagram of a semiconductor device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which spreads into a V shape. A voltage applied to the pixel electrode layer 624 by a TFT 628 is made different from a voltage applied to the pixel electrode layer 626 by a TFT 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 30:
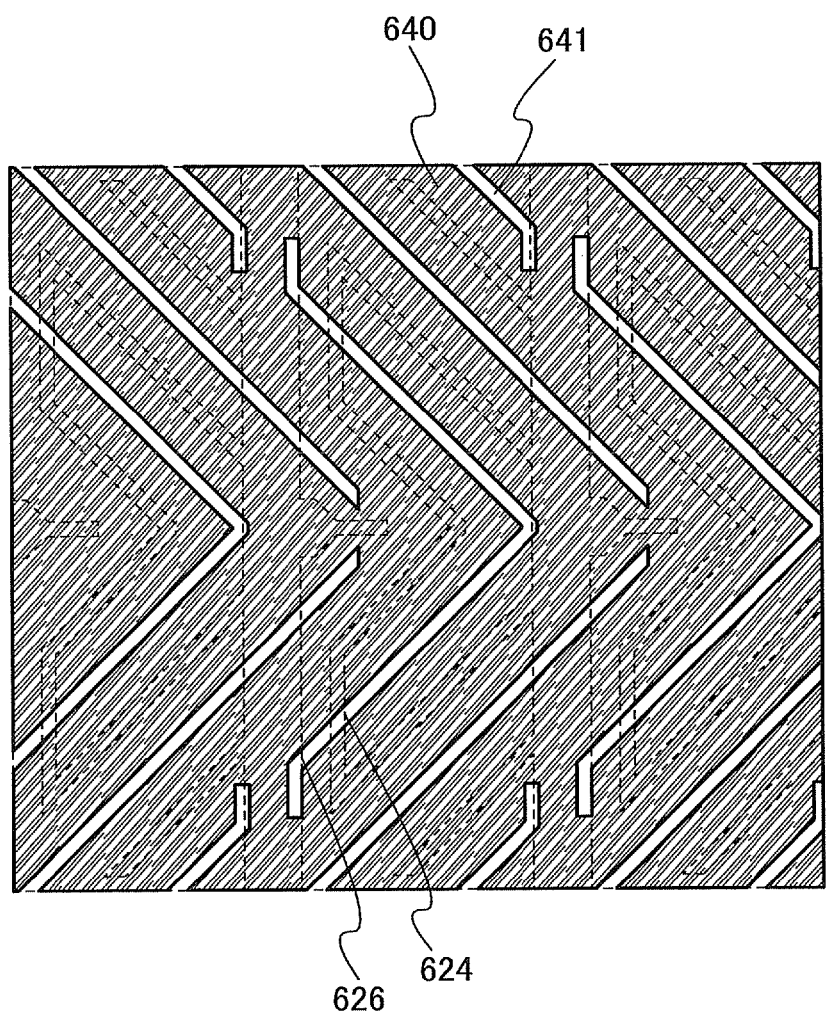
FIG. 30 illustrates a semiconductor device.

A counter substrate 601 is provided with a coloring film 636 and a counter electrode layer 640. A planarization film 637 is formed between the coloring film 636 and the counter electrode layer 640 to prevent alignment disorder of the liquid crystals. FIG. 30 illustrates a planar structure of the counter substrate side. The counter electrode layer 640 is an electrode shared by different pixels and slits 641 are formed. The slits 641 and the slits 625 in the pixel electrode layers 624 and 626 are alternately arranged so that an oblique electric field is effectively generated, whereby the alignment of the liquid crystals can be controlled. Accordingly, the direction of the alignment of the liquid crystals can vary depending on the location, which leads to a wider viewing angle. Note that in FIG. 30, the pixel electrode layers 624 and 626 formed over the substrate 600 are represented by dashed lines and the counter electrode layer 640 and the pixel electrode layers 624 and 626 overlap with each other.

An alignment film 648 is formed over the pixel electrode layer 624 and the pixel electrode layer 626, and the counter electrode layer 640 is similarly provided with an alignment film 646. A liquid crystal layer 650 is formed between the substrate 600 and the counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 28, FIG. 29, FIG. 30, FIG. 31, and FIG. 32 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. With this method, a viewing angle can be increased to about 180°. Hereinafter, a liquid crystal display device in the horizontal electric field mode is described.

Figure 32:
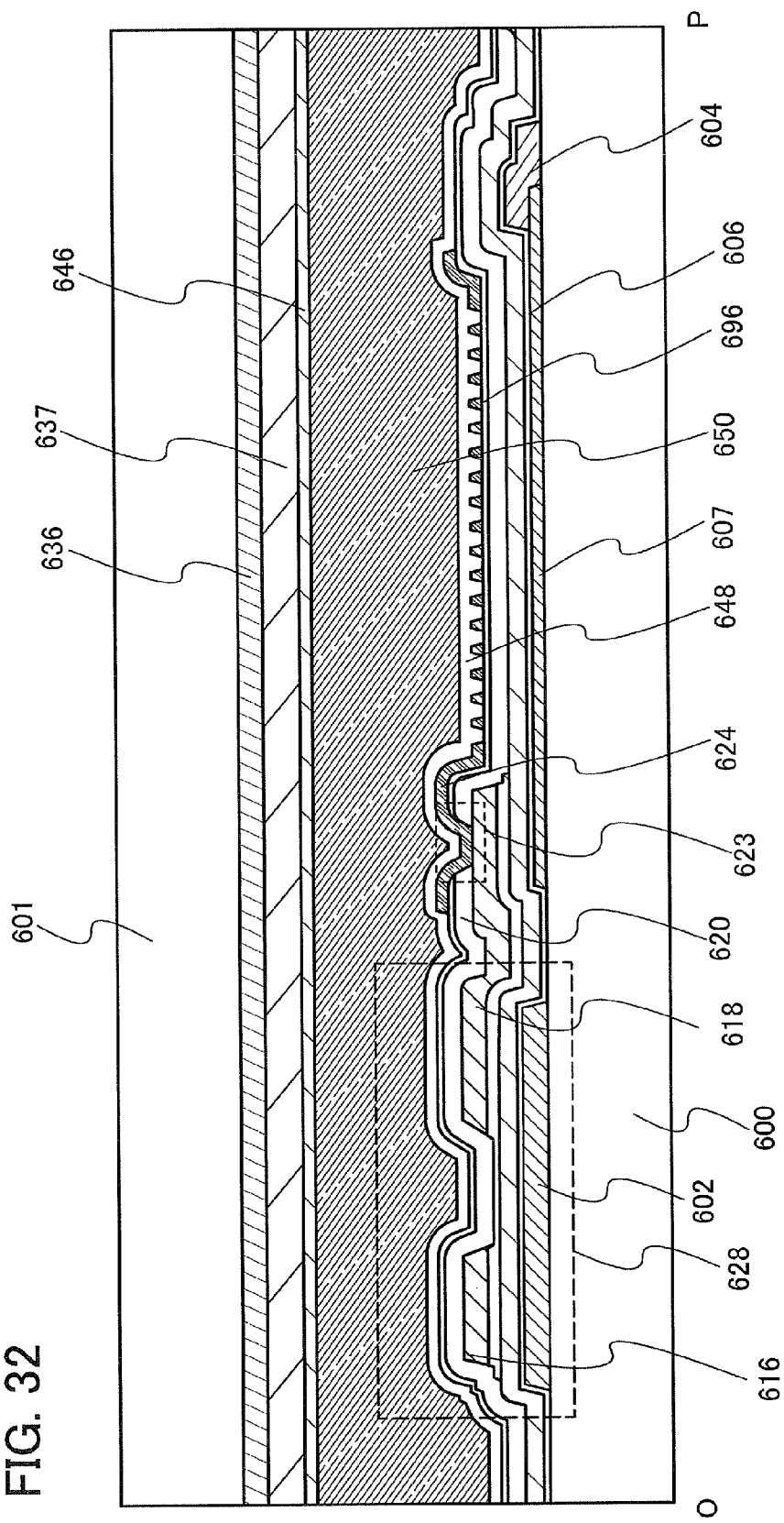
FIG. 32 illustrates a semiconductor device.

In FIG. 32, a substrate 600 over which an electrode layer 607, a TFT 628, and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. In addition, a liquid crystal layer 650 is formed between the substrate 600 and the counter substrate 601, and the alignment films 646 and 648 are provided between the liquid crystal layer 650 and the substrate 600 and the counter substrate 601.

The electrode layer 607, a capacitor wiring 604 connected to the electrode layer 607, and the TFT 628 which is a thin film transistor described in any of Embodiments 1 to 5 are formed over the substrate 600. The capacitor wiring 604 can be formed at the same time as a gate wiring 602 of the TFT 628. The thin film transistor described in any of Embodiments 1 to 5 can be used as the TFT 628. The electrode layer 607 can be formed using a material similar to that of the pixel electrode layer described in any of Embodiments 1 to 5. The electrode layer 607 is divided almost in a pixel form. Note that a gate insulating film 606 is formed over the electrode layer 607 and the capacitor wiring 604.

Wirings 616 and 618 of the TFT 628 are formed over the gate insulating film 606. The wiring 616 is a data line through which a video signal travels, extends in one direction in a liquid crystal display panel, and functions as one of source and drain electrodes of the TFT 628. The wiring 618 functions as the other of the source and drain electrodes and is connected to the pixel electrode layer 624.

An insulating film 620 is formed over the wirings 616 and 618, and an insulating film 696 is formed over the insulating film 620. Over the insulating film 696, the pixel electrode layer 624 which is to be connected to the wiring 618 through a contact hole 623 formed in the insulating films 620 and 696 is formed. The pixel electrode layer 624 is formed using a material similar to that of the pixel electrode described in any of Embodiments 1 to 5.

In such a manner, the TFT 628 and the pixel electrode layer 624 connected to the TFT 628 are formed over the substrate 600. Note that a storage capacitor is formed with the electrode layer 607 and the pixel electrode layer 624.

Figure 33:
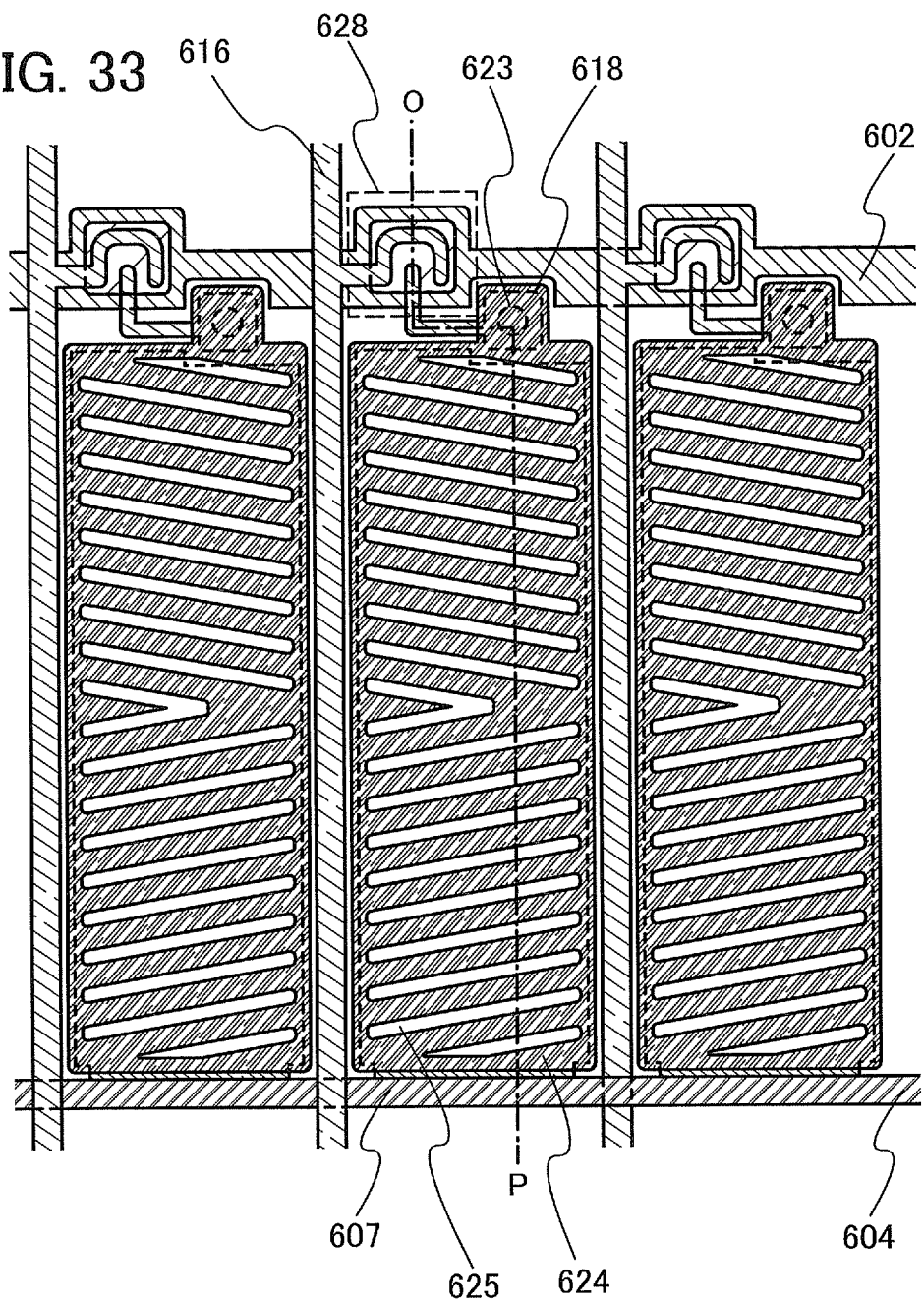
FIG. 33 illustrates a semiconductor device.

FIG. 33 is a plan view illustrating the structure of the pixel electrode. FIG. 32 illustrates a cross-sectional structure along line O-P in FIG. 33. The pixel electrode layer 624 is provided with slits 625. The slits 625 are provided for controlling alignment of liquid crystals. In that case, an electric field is generated between the electrode layer 607 and the pixel electrode layer 624. The thickness of the gate insulating film 606 formed between the electrode layer 607 and the pixel electrode layer 624 is 50 nm to 200 nm, which is much smaller than the thickness of the liquid crystal layer of 2 µm to 10 µm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, the aperture ratio can be improved.

Next, a different example of the liquid crystal display device in the horizontal electric field mode is described.

Figure 34:
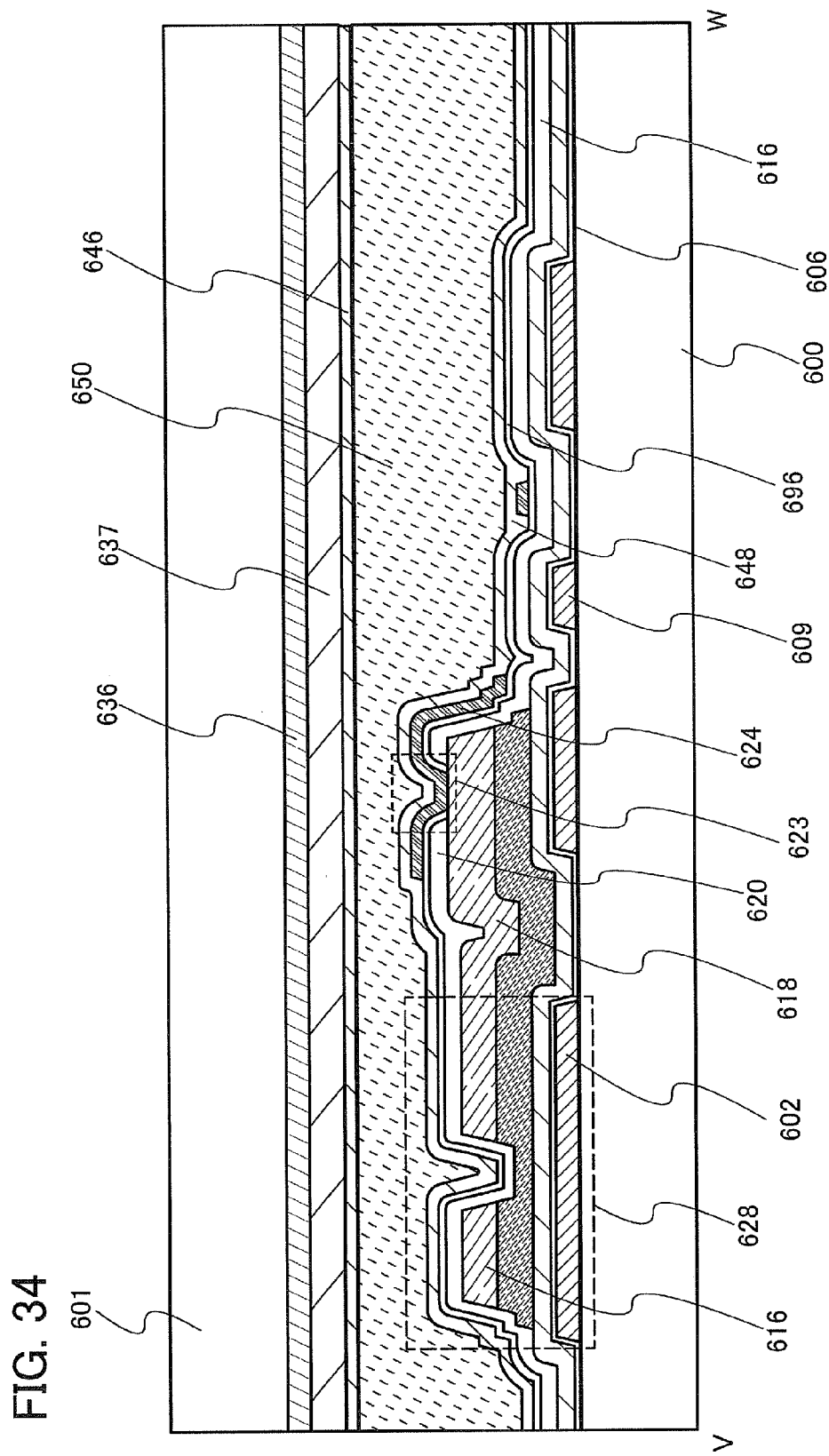
FIG. 34 illustrates a semiconductor device.
Figure 35:
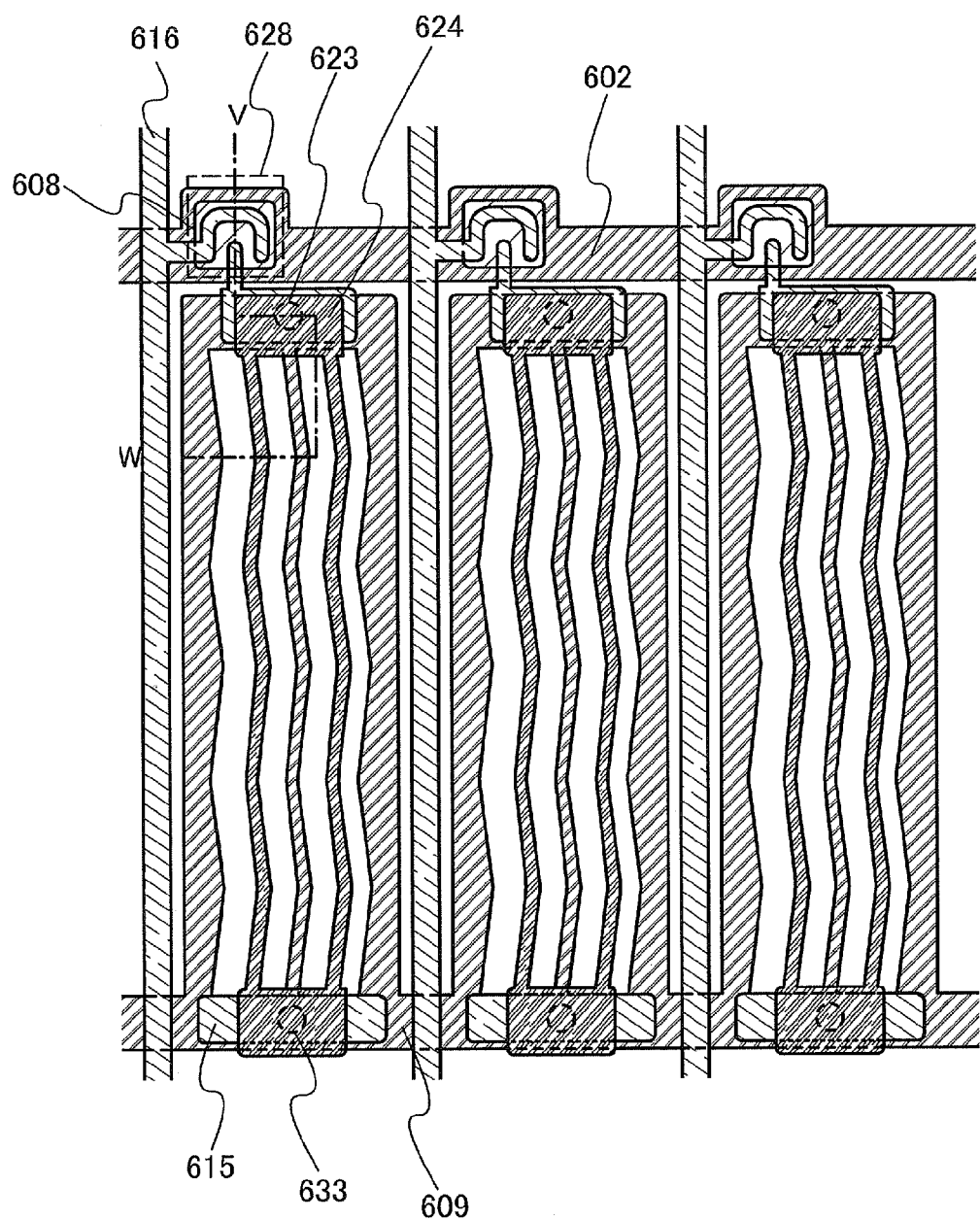
FIG. 35 illustrates a semiconductor device.

FIG. 34 and FIG. 35 illustrate a pixel structure of a liquid crystal display device in an IPS mode. FIG. 35 is a plan view. FIG. 34 illustrates a cross-sectional structure along line V-W in FIG. 35. Description below is given with reference to both the drawings.

In FIG. 34, a substrate 600 over which a TFT 628 and a pixel electrode layer 624 connected to the TFT 628 are formed overlaps with a counter substrate 601, and liquid crystals are injected between the substrate 600 and the counter substrate 601. The counter substrate 601 is provided with a coloring film 636, a planarization film 637, and the like. Note that a counter electrode is not provided on the counter substrate 601 side. A liquid crystal layer 650 is formed between the substrate 600 and the counter substrate 601, and the alignment films 646 and 648 are provided between the liquid crystal layer 650 and the substrate 600 and the counter substrate 601.

A common potential line 609 and the TFT 628 described in any of Embodiments 1 to 5 are formed over the substrate 600. The common potential line 609 can be formed at the same time as a gate wiring 602 of the TFT 628. The thin film transistor described in any of Embodiments 1 to 5 can be used as the TFT 628.

Wirings 616 and 618 of the TFT 628 are formed over a gate insulating film 606. The wiring 616 is a data line through which a video signal travels, extends in one direction in a liquid crystal display panel, and functions as one of source and drain electrodes of the TFT 628. The wiring 618 functions as the other of the source and drain electrodes and is connected to a pixel electrode layer 624.

An insulating film 620 is formed over the wirings 616 and 618, and an insulating film 696 is formed over the insulating film 620. Over the insulating film 696, the pixel electrode layer 624 which is to be connected to the wiring 618 through a contact hole 623 formed in the insulating films 620 and 696 is formed. The pixel electrode layer 624 is formed using a material similar to that of the pixel electrode described in any of Embodiments 1 to 5. Note that, as illustrated in FIG. 35, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed with a gate insulating film 606, the common potential line 609, and a capacitor electrode 615. The capacitor electrode 615 and the pixel electrode layer 624 are connected to each other through a contact hole 633.

Next, a mode of a liquid crystal display device in a TN mode is described.

Figure 36:
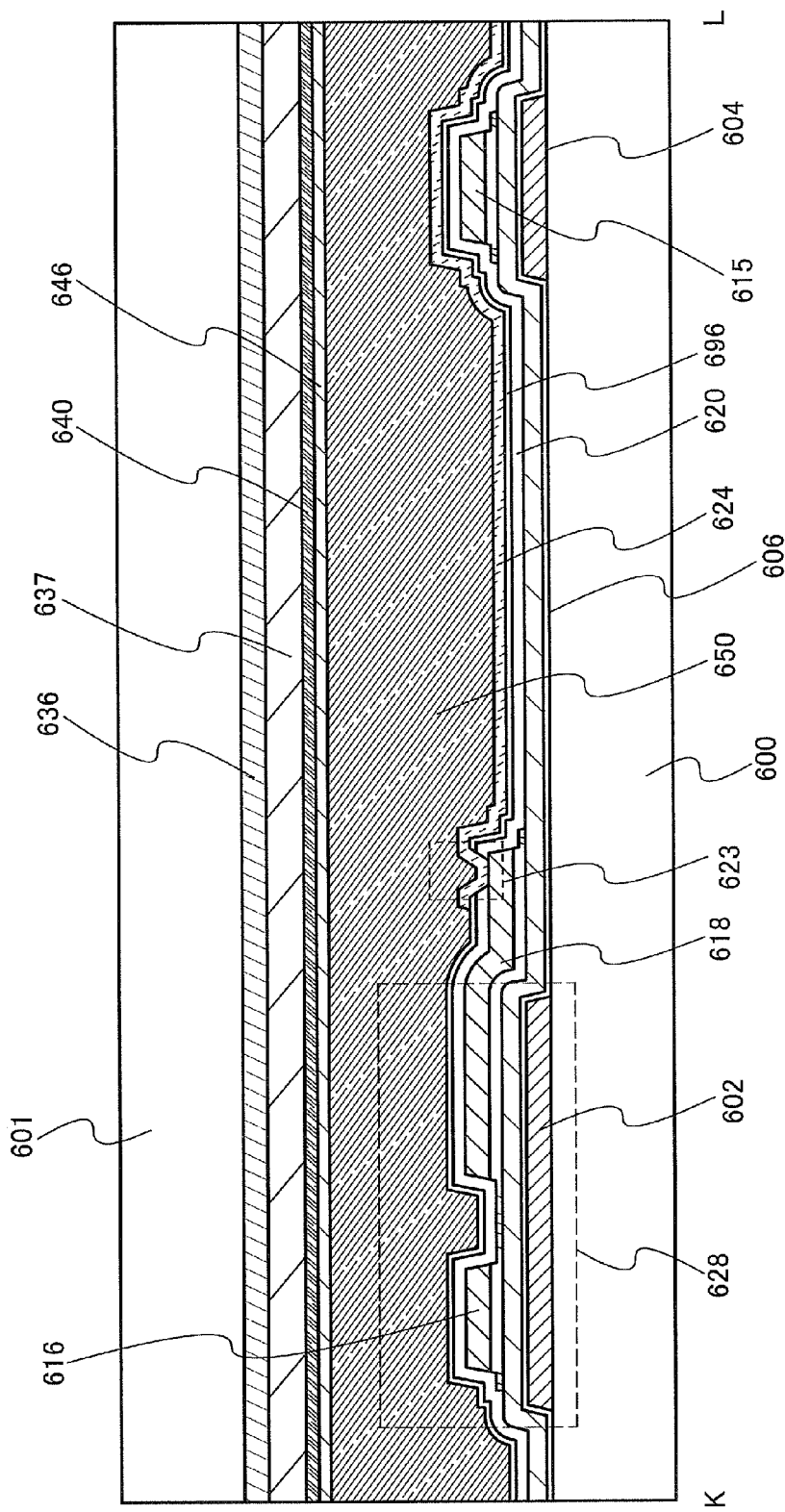
FIG. 36 illustrates a semiconductor device.
Figure 37:
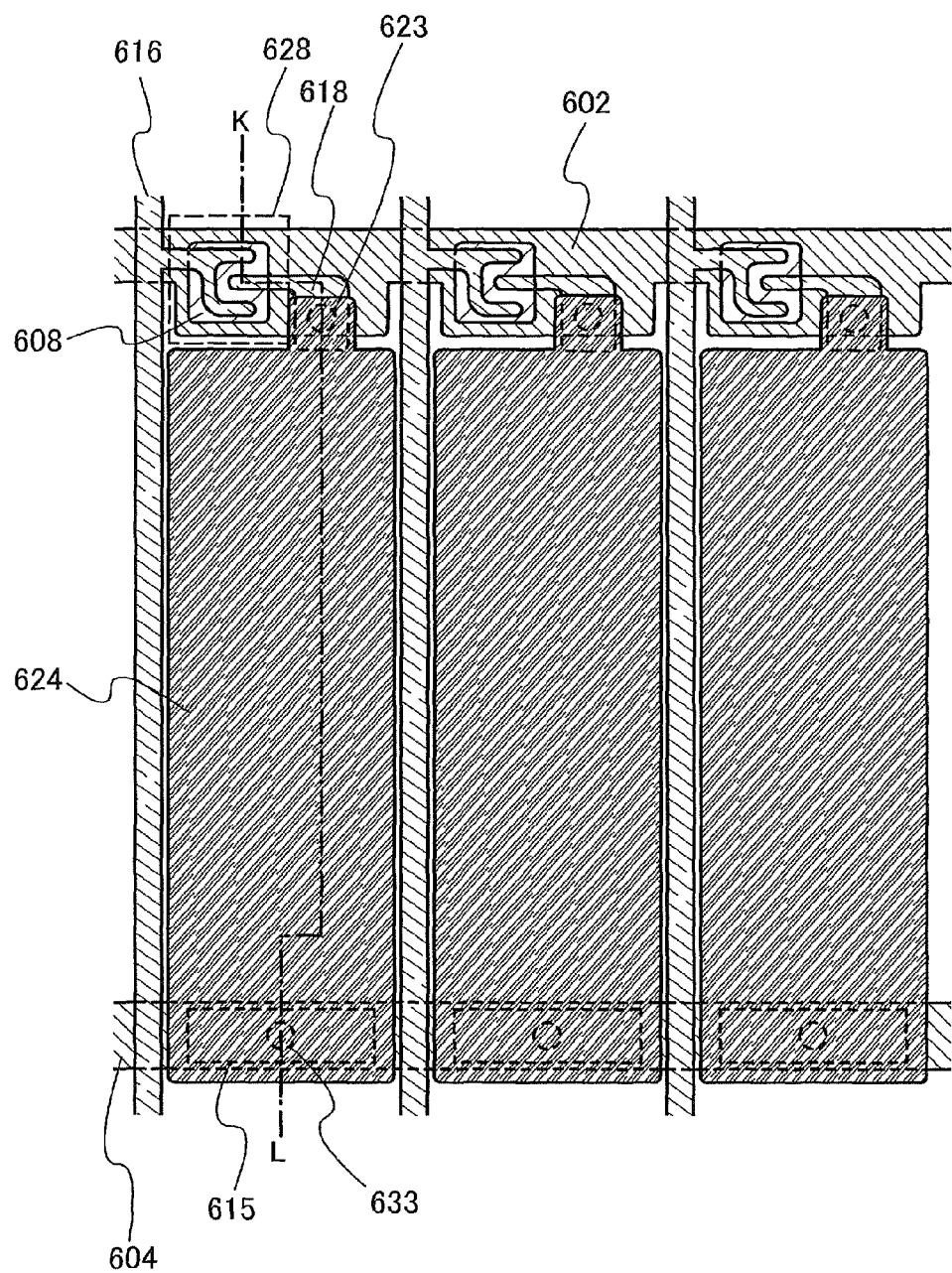
FIG. 37 illustrates a semiconductor device.

FIG. 36 and FIG. 37 illustrate a pixel structure of a liquid crystal display device in a TN mode. FIG. 37 is a plan view.

FIG. 36 illustrates a cross-sectional structure along line K-L in FIG. 37. Description below is given with reference to both the drawings.

A pixel electrode layer 624 is connected to a TFT 628 via a wiring 618 through a contact hole 623 formed in insulating films 620 and 696. A wiring 616 functioning as a data line is connected to the TFT 628. The TFT described in any of Embodiments 1 to 5 can be used as the TFT 628.

The pixel electrode layer 624 is formed using the pixel electrode described in any of Embodiments 1 to 5. A capacitor wiring 604 can be formed at the same time as a gate wiring 602 of the TFT 628. A gate insulating film 606 is formed over the gate wiring 602 and the capacitor wiring 604. A storage capacitor is formed using the capacitor wiring 604, a capacitor electrode 615, and the gate insulating film 606 between the capacitor wiring 604 and the capacitor electrode 615. The capacitor electrode 615 and the pixel electrode layer 624 are connected to each other through a contact hole 633.

A counter substrate 601 is provided with a coloring film 636 and a counter electrode layer 640. A planarization film 637 is formed between the coloring film 636 and the counter electrode layer 640 to prevent alignment disorder of liquid crystals. A liquid crystal layer 650 is formed between the pixel electrode layer 624 and the counter electrode layer 640 with alignment films 646 and 648 therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is the reverse of the surface provided with the thin film transistor, and another polarizing plate is attached to a surface of the counter substrate 601, which is the reverse of the surface provided with the counter electrode layer 640.

Through the above-described process, liquid crystal display devices can be manufactured as display devices. The liquid crystal display devices of this embodiment each have a high aperture ratio.

This application is based on Japanese Patent Application serial no. 2009-169599 filed with Japan Patent Office on Jul. 18, 2009, the entire contents of which are hereby incorporated by reference.

EXPLANATION OF REFERENCE

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 200: substrate, 202a: gate insulating layer, 202b: gate insulating layer, 203: protective insulating layer, 204: planarization insulating layer, 210: thin film transistor, 216: oxide insulating layer, 217: conductive layer, 220: thin film transistor, 227: pixel electrode layer, 230: capacitor wiring layer, 231: capacitor electrode layer, 232: gate wiring layer, 234a: source wiring, 234b: source wiring, 234c: source wiring, 235: terminal electrode, 236: metal wiring layer, 237: metal wiring layer, 238: gate wiring layer, 240: thin film transistor, 241: metal wiring layer, 242: metal wiring layer, 250: capacitor wiring layer, 251: oxide semiconductor layer, 400: substrate, 402a: gate insulating layer, 402b: gate insulating layer, 403: protective insulating layer, 404: planarization insulating layer, 406: oxide conductive layer, 407: oxide insulating layer, 408a: low-resistance drain region, 408b: low-resistance drain region, 409a: source electrode layer, 409b: drain electrode layer, 410: thin film transistor, 411: gate electrode layer, 412: oxide semiconductor layer, 413: channel formation region, 414a: high-resistance drain region, 414b: high-resistance drain region, 415a: source electrode layer, 415b: drain electrode layer, 416: oxide insulating layer, 417: conductive layer, 420: thin film transistor, 421: gate electrode layer, 422: oxide semiconductor layer, 423: channel formation region, 424a: high-resistance drain region, 424b: high-resistance drain region, 425a: conductive layer, 425b: conductive layer, 427: pixel electrode layer, 430: oxide semiconductor film, 431: oxide semiconductor layer, 432: oxide semiconductor layer, 433a: resist mask, 433b: resist mask, 434: conductive layer, 435: conductive layer, 436a: resist mask, 436b: resist mask, 438: resist mask, 441: contact hole, 442: oxide conductive layer, 443: oxide semiconductor layer, 444: oxide semiconductor film, 445: oxide semiconductor layer, 445a: resist mask, 445b: resist mask, 446a: low-resistance drain region, 446b: low-resistance drain region, 447a: source electrode layer, 447b: drain electrode layer, 449: thin film transistor, 450: substrate, 451: thin film transistor, 452a: gate insulating layer, 452b: gate insulating layer, 453: protective insulating layer, 454: planarization insulating layer, 460: thin film transistor, 461: gate electrode layer, 462: oxide semiconductor layer, 463: channel formation region, 464a: high-resistance drain region, 464b: high-resistance drain region, 465a: source electrode layer, 465b: drain electrode layer, 466: oxide insulating layer, 467: conductive layer, 470: thin film transistor, 471: gate electrode layer, 472: oxide semiconductor layer, 473: channel formation region, 474a: high-resistance drain region, 474b: high-resistance drain region, 477: pixel electrode layer, 480: oxide semiconductor film, 481: oxide semiconductor film, 482a: resist mask, 482b: resist mask, 483: oxide semiconductor layer, 484: conductive layer, 485: oxide semiconductor layer, 486: conductive layer, 487a: resist mask, 487b: resist mask, 490a: conductive layer, 490b: conductive layer, 491: resist mask, 492: thin film transistor, 493: thin film transistor, 494: contact hole, 496: oxide semiconductor film, 497: oxide semiconductor layer, 498: oxide semiconductor layer, 580: substrate, 581: thin film transistor, 583: insulating film, 584: insulating film, 585: insulating layer, 587: electrode layer, 588: electrode layer, 589: spherical particle, 590a: black region, 590b: white region, 594: cavity, 595: filler, 596: substrate, 600: substrate, 601: counter substrate, 602: gate wiring, 603: gate wiring, 604: capacitor wiring, 605: capacitor wiring, 606: gate insulating film, 606a: gate insulating film, 606b: gate insulating film, 607: electrode layer, 609: common potential line, 615: capacitor electrode, 616: wiring, 617a: second capacitor wiring, 617b: second capacitor wiring, 618: wiring, 618a: wiring, 618b: wiring, 619: wiring, 620: insulating film, 622: insulating film, 623: contact hole, 624: pixel electrode layer, 625: slit, 626: pixel electrode layer, 627: contact hole, 628: TFT, 629: TFT, 630: storage capacitor portion, 631: storage capacitor portion, 633: contact hole, 636: coloring film, 637: planarization film, 640: counter electrode layer, 641: slit, 644: protrusion, 646: alignment film, 648: alignment film, 650: liquid crystal layer, 651: liquid crystal element, 652: liquid crystal element, 690: capacitor wiring, 696: insulating film, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016a: terminal electrode, 4016b: terminal electrode, 4018: FPC, 4019: anisotropic conductive film, 4020: protective insulating layer, 4021: insulating layer, 4030: pixel electrode layer, 4031: counter electrode layer, 4032: insulating layer, 4035: spacer, 4040: conductive layer, 4041: oxide insulating layer, 4501: substrate, 4502: pixel portion, 4503a: signal line driver circuit, 4504a: scan line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516a: terminal electrode, 4516b: terminal electrode, 4517: electrode layer, 4518a: FPC, 4519: anisotropic conductive film, 4520: bank, 4540: conductive layer, 4541: oxide insulating layer, 4543: protective insulating layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driving transistor, 6403: capacitor, 6404: light-emitting element, 6405: signal line, 6406: scan line, 6407: power supply line, 6408: common electrode, 7001: TFT, 7002: light-emitting element, 7003: cathode, 7004: light-emitting layer, 7005: anode, 7008: cathode, 7009: bank, 7011: driving TFT, 7012: light-emitting element, 7013: cathode, 7014: light-emitting layer, 7015: anode, 7016: light-blocking film, 7017: conductive film, 7018: conductive film, 7019: bank, 7021: driving TFT, 7022: light-emitting element, 7023: cathode, 7024: Light-emitting layer, 7025: anode, 7027: conductive film, 7028: conductive film, 7029: bank, 9201: display portion, 9202: display button, 9203: operation switch, 9205: adjusting portion, 9206: camera portion, 9207: speaker, 9208: microphone, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: joint portion, 9900: slot machine, 9901: housing, 9903: display portion

What is claimed is:

1. A display device comprising:
    a pixel portion over a substrate; and
    a driver circuit over the substrate, the driver circuit comprising:
        a gate electrode layer;
        a gate insulating layer over the gate electrode layer;
        an oxide semiconductor layer over the gate insulating layer, the oxide semiconductor layer overlapping the gate electrode layer;
        an inorganic insulating layer over the oxide semiconductor layer;
        an organic insulating layer over the inorganic insulating layer; and a light-transmitting conductive layer over and in direct contact with the organic insulating layer, the light-transmitting conductive layer overlapping the oxide semiconductor layer.

2. The display device according to claim 1, wherein a fixed potential is applied to the light-transmitting conductive layer.

3. The display device according to claim 1, wherein a ground potential is applied to the light-transmitting conductive layer.

4. The display device according to claim 1, wherein the oxide semiconductor layer comprises In, Ga, Zn and O.

5. The display device according to claim 1, wherein the inorganic insulating layer is a silicon nitride oxide film.

6. The display device according to claim 5, wherein the driver circuit further comprises a silicon nitride film between the inorganic insulating layer and the organic insulating layer.

7. The display device according to claim 1, wherein the organic insulating layer comprises acrylic.

8. The display device according to claim 1, wherein the pixel portion comprises an electroluminescence element.

9. The display device according to claim 1, wherein the pixel portion comprises a liquid crystal element.

10. A display device comprising:
a gate electrode layer of a transistor of a pixel portion over a substrate;
a gate electrode layer of a transistor of a driver circuit over the substrate;
a gate insulating layer over the gate electrode layer of the transistor of the pixel portion and the gate electrode layer of the transistor of the driver circuit;
a first oxide semiconductor layer over the gate insulating layer, the first oxide semiconductor layer overlapping the gate electrode layer of the transistor of the pixel portion;
a second oxide semiconductor layer over the gate insulating layer, the second oxide semiconductor layer overlapping the gate electrode layer of the transistor of the driver circuit;
an inorganic insulating layer over the first oxide semiconductor layer and the second oxide semiconductor layer;
an organic insulating layer over the inorganic insulating layer;
a light-transmitting conductive layer over the organic insulating layer, the light-transmitting conductive layer overlapping the second oxide semiconductor layer; and
a pixel electrode layer over the organic insulating layer, the pixel electrode layer being electrically connected to the first oxide semiconductor layer,
wherein the light-transmitting conductive layer and the pixel electrode layer do not overlap with each other, and
wherein the pixel electrode layer is configured to transmit light.

11. The display device according to claim 10, wherein a fixed potential is applied to the light-transmitting conductive layer.

12. The display device according to claim 10, wherein a ground potential is applied to the light-transmitting conductive layer.

13. The display device according to claim 10, wherein each of the first oxide semiconductor layer and the second oxide semiconductor layer comprises In, Ga, Zn and O.

14. The display device according to claim 10, wherein the inorganic insulating layer is a silicon nitride oxide film.

15. The display device according to claim 14, further comprising a silicon nitride film between the inorganic insulating layer and the organic insulating layer.

16. The display device according to claim 10, wherein the organic insulating layer comprises acrylic.

17. The display device according to claim 10, further comprising an electroluminescence element.

18. The display device according to claim 10, further comprising a liquid crystal element.

19. A display device comprising:
a pixel portion over a substrate; and
a driver circuit over the substrate, the driver circuit comprising:
a gate electrode layer;
a gate insulating layer over the gate electrode layer;
an oxide semiconductor layer over the gate insulating layer, the oxide semiconductor layer overlapping the gate electrode layer;
a source electrode layer over the oxide semiconductor layer;
a drain electrode layer over the oxide semiconductor layer;
an inorganic insulating layer over the source electrode layer and the drain electrode layer, the inorganic insulating layer being in contact with the oxide semiconductor layer between the source electrode layer and the drain electrode layer;
an organic insulating layer over the inorganic insulating layer;
a light-transmitting conductive layer over and in direct contact with the organic insulating layer, the light-transmitting conductive layer overlapping the oxide semiconductor layer.

20. The display device according to claim 19, wherein a fixed potential is applied to the light-transmitting conductive layer.

21. The display device according to claim 19, wherein a ground potential is applied to the light-transmitting conductive layer.

22. The display device according to claim 19, wherein the oxide semiconductor layer comprises In, Ga, Zn and O.

23. The display device according to claim 19, wherein the inorganic insulating layer is a silicon nitride oxide film.

24. The display device according to claim 23, wherein the driver circuit further comprises a silicon nitride film between the inorganic insulating layer and the organic insulating layer.

25. The display device according to claim 19, wherein the organic insulating layer comprises acrylic.

26. The display device according to claim 19, wherein the pixel portion comprises an electroluminescence element.

27. The display device according to claim 19, wherein the pixel portion comprises a liquid crystal element.

28. A display device comprising:
a gate electrode layer of a transistor of a pixel portion over a substrate;
a gate electrode layer of a transistor of a driver circuit over the substrate;
a gate insulating layer over the gate electrode layer of the transistor of the pixel portion and the gate electrode layer of the transistor of the driver circuit;
a first oxide semiconductor layer over the gate insulating layer, the first oxide semiconductor layer overlapping the gate electrode layer of the transistor of the pixel portion;
a second oxide semiconductor layer over the gate insulating layer, the second oxide semiconductor layer overlapping the gate electrode layer of the transistor of the driver circuit;
a first source electrode layer over the first oxide semiconductor layer;

a first drain electrode layer over the first oxide semiconductor layer;
a second source electrode layer over the second oxide semiconductor layer;
a second drain electrode layer over the second oxide semiconductor layer;
an inorganic insulating layer over the first source electrode layer, the second source electrode layer, the first drain electrode layer and the second drain electrode layer, the inorganic insulating layer being in contact with the first oxide semiconductor layer between the first source electrode layer and the first drain electrode layer, the inorganic insulating layer being in contact with the second oxide semiconductor layer between the second source electrode layer and the second drain electrode layer;
an organic insulating layer over the inorganic insulating layer;
a light-transmitting conductive layer over the organic insulating layer, the light-transmitting conductive layer overlapping the second oxide semiconductor layer; and
a pixel electrode layer over the organic insulating layer, the pixel electrode layer being electrically connected to the first drain electrode layer,
wherein the light-transmitting conductive layer and the pixel electrode layer do not overlap with each other, and
wherein the pixel electrode layer is configured to transmit light.

29. The display device according to claim 28, wherein a fixed potential is applied to the light-transmitting conductive layer.

30. The display device according to claim 28, wherein a ground potential is applied to the light-transmitting conductive layer.

31. The display device according to claim 28, wherein each of the first oxide semiconductor layer and the second oxide semiconductor layer comprises In, Ga, Zn and O.

32. The display device according to claim 28, further comprising:
a first oxide conductive layer between the second oxide semiconductor layer and the second source electrode layer; and
a second oxide conductive layer between the second oxide semiconductor layer and the second drain electrode layer,
wherein the first oxide conductive layer, the second oxide conductive layer, the first source electrode layer and the first drain electrode layer comprise a same material.

33. The display device according to claim 28, wherein each of the second source electrode layer and the second drain electrode layer is a metal conductive layer.

34. The display device according to claim 28, wherein the inorganic insulating layer is a silicon nitride oxide film.

35. The display device according to claim 34, further comprising a silicon nitride film between the inorganic insulating layer and the organic insulating layer.

36. The display device according to claim 28, wherein the organic insulating layer comprises acrylic.

37. The display device according to claim 28, further comprising an electroluminescence element.

38. The display device according to claim 28, further comprising a liquid crystal element.

* * * * *